(12) United States Patent
Iizuka et al.

(10) Patent No.: US 10,630,255 B2
(45) Date of Patent: Apr. 21, 2020

(54) PIEZOELECTRIC RESONATOR DEVICE

(71) Applicant: DAISHINKU CORPORATION, Hyogo (JP)

(72) Inventors: Minoru Iizuka, Kakogawa (JP); Takuya Kojo, Kakogawa (JP)

(73) Assignee: DAISHINKU CORPORATION, Kakogawa (JP)

( * ) Notice: Subject to any disclaimer, the term of this patent is extended or adjusted under 35 U.S.C. 154(b) by 313 days.

(21) Appl. No.: 15/104,994

(22) PCT Filed: Dec. 4, 2014

(86) PCT No.: PCT/JP2014/082105
§ 371 (c)(1),
(2) Date: Jun. 16, 2016

(87) PCT Pub. No.: WO2015/093300
PCT Pub. Date: Jun. 25, 2015

(65) Prior Publication Data
US 2016/0322952 A1 Nov. 3, 2016

(30) Foreign Application Priority Data

Dec. 20, 2013 (JP) ................................ 2013-264219
Dec. 24, 2013 (JP) ................................ 2013-265924
Jan. 21, 2014 (JP) ................................ 2014-008801

(51) Int. Cl.
*H03H 9/10* (2006.01)
*H03H 3/02* (2006.01)
(Continued)

(52) U.S. Cl.
CPC ............ *H03H 3/02* (2013.01); *H03H 9/0561* (2013.01); *H03H 9/1035* (2013.01);
(Continued)

(58) Field of Classification Search
CPC .. H03H 9/1035; H03H 9/1021; H03H 9/0561; H03H 9/17; H01L 41/053
(Continued)

(56) References Cited

U.S. PATENT DOCUMENTS 6,606,772 B1 * 8/2003 Nohara ............... H03H 3/02
29/25.35
2006/0255691 A1 11/2006 Kuroda et al.
(Continued)

FOREIGN PATENT DOCUMENTS

| EP | 1104099 A9 | 8/2001 |
|----|------------|--------|
| JP | 2007-043338 A | 2/2007 |

(Continued)

*Primary Examiner* — Derek J Rosenau

(57) ABSTRACT

A piezoelectric resonator device having a sandwich structure is provided, which can avoid gas generation with reduced size or height. A crystal resonator includes a crystal resonator plate, a first sealing member and a second sealing member. A sealing-member-side first bonding pattern and a sealing-member-side second bonding pattern, both to be bonded to the crystal resonator plate, are formed respectively on the first and second sealing members. On the crystal resonator plate, a resonator-plate-side first bonding pattern to be bonded to the first sealing member is formed on a first main surface and a resonator-plate-side second bonding pattern to be bonded to the second sealing member is formed on a second main surface. The sealing-member-side first bonding pattern is bonded to the resonator-plate-side first bonding pattern, and the sealing-member-side second bonding pattern is bonded to the resonator-plate-side second bonding pattern, both by diffusion bonding.

18 Claims, 22 Drawing Sheets

(51) Int. Cl.
*H03H 9/05* (2006.01)
*H03H 9/13* (2006.01)
*H03H 9/17* (2006.01)

(52) U.S. Cl.
CPC .............. *H03H 9/131* (2013.01); *H03H 9/17* (2013.01); *H01L 2224/16225* (2013.01); *H03H 9/1021* (2013.01)

(58) Field of Classification Search
USPC .......................................................... 310/348
See application file for complete search history.

(56) References Cited

U.S. PATENT DOCUMENTS

| | | | | |
|---|---|---|---|---|
| 2010/0201221 A1* | 8/2010 | Inoue | ........................ | H03H 3/04 310/312 |
| 2010/0290201 A1 | 11/2010 | Takeuchi et al. | | |
| 2011/0163637 A1 | 7/2011 | Hashi | | |
| 2012/0074816 A1* | 3/2012 | Mizusawa | ............... | H01L 41/23 310/344 |
| 2013/0049541 A1* | 2/2013 | Amano | ................ | H03H 9/1014 310/340 |
| 2014/0361666 A1 | 12/2014 | Kubota et al. | | |

FOREIGN PATENT DOCUMENTS

| | | |
|---|---|---|
| JP | 2008-219206 A | 9/2008 |
| JP | 2010-200118 A | 9/2010 |
| JP | 2010-200230 A | 9/2010 |
| JP | 2010-252051 A | 11/2010 |
| JP | 2010-267739 A | 11/2010 |
| JP | 2012-015779 A | 1/2012 |
| JP | 2012-191560 A | 10/2012 |
| JP | 2012-235511 A | 11/2012 |
| WO | WO 2006/104265 A1 | 10/2006 |
| WO | WO2013/128496 A1 | 9/2013 |

* cited by examiner

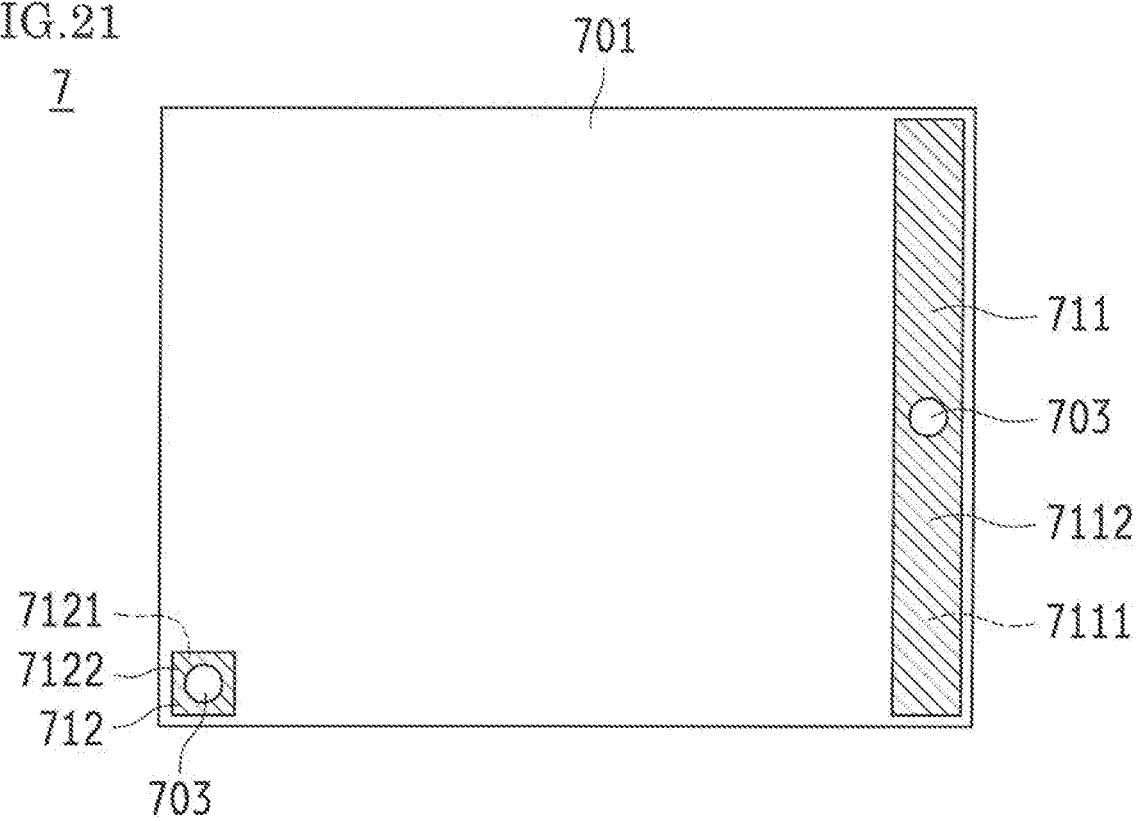
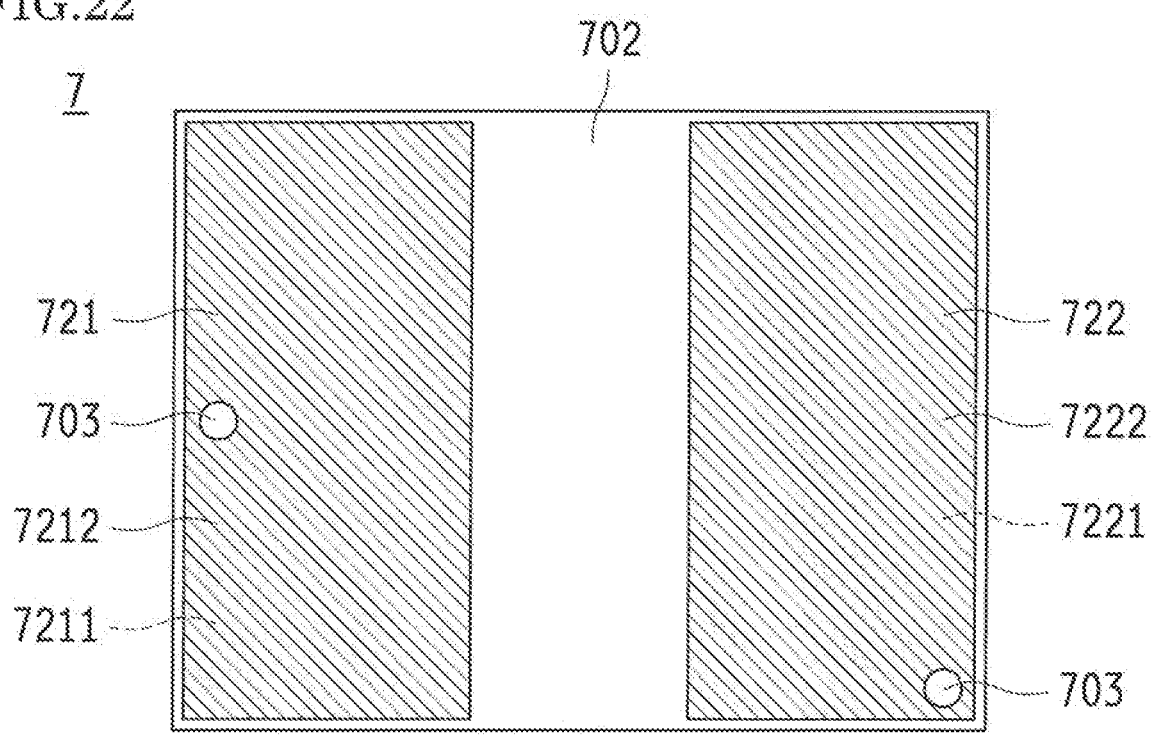

PIEZOELECTRIC RESONATOR DEVICE

TECHNICAL FIELD

The present invention relates to piezoelectric resonator devices.

BACKGROUND ART

Recent years, in various electronic devices, their operating frequencies have increased and their packages (especially, their height) have been downsized. According to such an increase in operating frequency and a reduction in package size, there is also a need for piezoelectric resonator devices (crystal resonators, for example) to be adaptable to the increase in operating frequency and the reduction in package size.

In this kind of piezoelectric resonator devices, a housing is constituted by a rectangular-shaped package. The package is constituted by: a first sealing member and a second sealing member both made of glass; and a crystal resonator plate made of crystal. On both main surfaces of the crystal resonator plate, excitation electrodes are formed. The first sealing member and the second sealing member are laminated and bonded via the crystal resonator plate. Thus, the excitation electrodes of the crystal resonator plate that is disposed in the package are hermetically sealed (e.g. Patent Document 1). Hereinafter, such a laminated structure of the piezoelectric resonator device is referred to as a sandwich structure.

PRIOR ART REFERENCE

Patent Document

[Patent Document 1] JP 2012-235511 A

SUMMARY OF INVENTION

Problems to be Solved by Invention

In the crystal resonator as shown in Patent Document 1, a metal paste sealing material is used for bonding the first sealing member, the second sealing member and the crystal resonator plate to each other. The metal paste sealing material here is thicker than an electrode film and the like, thus, it is not suitable for the reduction in height. Also, when using the metal paste sealing material for bonding, it is necessary to heat and melt the metal paste sealing material at a high temperature, which results in generation of gas. Due to the generated gas in the package, oscillation characteristics are deteriorated. Furthermore, the metal paste sealing material has a large shape when it is formed on the crystal resonator plate and the like, thus it is necessary to ensure a certain region to dispose the metal paste sealing material, which prevents the reduction in package size.

In order to resolve the above-described problems, an object of the present invention is to provide a piezoelectric resonator device having a sandwich structure, which avoids the gas generation and further is capable of reduction in height or size.

Means for Solving Problems

In order to achieve the above object, a piezoelectric resonator device according to the present invention includes: a piezoelectric resonator plate including a first excitation electrode formed on a first main surface of a substrate, and a second excitation electrode formed on a second main surface of the substrate, the second excitation electrode making a pair with the first excitation electrode; a first sealing member covering the first excitation electrode of the piezoelectric resonator plate; a second sealing member covering the second excitation electrode of the piezoelectric resonator plate, the second sealing member including external terminals to be electrically connected to an outside; an internal space formed by bonding the first sealing member to the piezoelectric resonator plate and by bonding the second sealing member to the piezoelectric resonator plate, the internal space hermetically sealing an vibrating part including the first excitation electrode and the second excitation electrode of the piezoelectric resonator plate; a resonator-plate-side first bonding pattern formed on the first main surface of the piezoelectric resonator plate so as to be bonded to the first sealing member, the resonator-plate-side first bonding pattern being constituted by a base PVD film deposited on the first main surface by physical vapor deposition and an electrode PVD film deposited on the base PVD film by the physical vapor deposition; a resonator-plate-side second bonding pattern formed on the second main surface of the piezoelectric resonator plate so as to be bonded to the second sealing member, the resonator-plate-side second bonding pattern being constituted by a base PVD film deposited on the second main surface by the physical vapor deposition and an electrode PVD film deposited on the base PVD film by the physical vapor deposition; a sealing-member-side first bonding pattern formed on the first sealing member so as to be bonded to the piezoelectric resonator plate, the sealing-member-side first bonding pattern being constituted by a base PVD film deposited on the first sealing member by the physical vapor deposition and an electrode PVD film deposited on the base PVD film by the physical vapor deposition; and a sealing-member-side second bonding pattern formed on the second sealing member so as to be bonded to the piezoelectric resonator plate, the sealing-member-side second bonding pattern being constituted by a base PVD film deposited on the second sealing member by the physical vapor deposition and an electrode PVD film deposited on the base PVD film by the physical vapor deposition. The sealing-member-side first bonding pattern is bonded to the resonator-plate-side first bonding pattern by diffusion bonding, and the sealing-member-side second bonding pattern is bonded to the resonator-plate-side second bonding pattern by the diffusion bonding.

With the piezoelectric resonator device according to the present invention, it is possible to avoid gas generation and to further reduce the size or height in the piezoelectric resonator device having the sandwich structure.

In the conventional art, it is necessary to form the metal paste sealing material such as Au—Sn separately, by printing, plating or the like. In the present invention, the sealing-member-side first bonding pattern is bonded to the resonator-plate-side first bonding pattern by the diffusion bonding, and the sealing-member-side second bonding pattern is bonded to the resonator-plate-side second bonding pattern by the diffusion bonding. There is no need for using separately the metal paste sealing material, thereby, it is possible to contribute to cost reduction. Furthermore, in the present invention, the base PVD films and the electrode PVD films are formed using a PVD method (e.g., a film forming method for patterning in processing such as photolithography) such as vacuum deposition, sputtering, ion plating, molecular beam epitaxy (MBE) and laser ablation. Thus, in contrast to multiple formations of films by the conventional plating, it is possible to form films collectively, which leads to reduction in producing processes and in cost.

Currently, the package of the piezoelectric resonator device is being downsized. For this reason, it is difficult to print the metal paste sealing material such as Au—Sn while preventing a trouble such as short-circuiting caused by interference of the patterns (electrode patterns) and terminals (electrode terminals) that serve as hetero electrodes. On the other hand, in the present invention, the sealing-member-side first and second bonding patterns and the resonator-plate-side first and second bonding patterns are used, which have layered structures of the respective base PVD films and the respective electrode PVD films. No metal paste sealing material is used. Thus, it is possible to form patterns while preventing the trouble such as short-circuiting easily caused by the interference of the patterns and terminals that serve as hetero electrodes.

As described above, in the conventional art, the metal paste sealing material such as Au—Sn is separately used. When the bonding is performed using the metal paste sealing material, high-temperature heating is needed to carry out the bonding by heat-melting, which results in generation of gas at the time of heat-melting. Currently, there has been developed no technique to avoid the generation of gas. Thus, gas penetration into the internal space is unavoidable when the bonding is carried out by the heat-melting. In contrast, in the present invention, the sealing-member-side first bonding pattern is bonded to the resonator-plate-side first bonding pattern by the diffusion bonding, and the sealing-member-side second bonding pattern is bonded to the resonator-plate-side second bonding pattern by the diffusion bonding, which suppressing the generation of gas. Thus, it is possible to prevent deterioration of oscillation characteristics due to presence of gas in the internal space. Note that, in some cases, the diffusion bonding is performed at a temperature higher than the room temperature (e.g. at 220° C.), however, it is not performed at the high temperature (e.g. not less than 280° C.) that is needed for the bonding by the metal paste sealing material.

In the present invention, the sealing-member-side first and second bonding patterns and the resonator-plate-side first and second bonding patterns have the layered structures of the respective base PVD films and the respective electrode PVD films. Thus, it is possible to reduce the width of the patterns and terminals. As a result, it is possible to avoid the obstacle, which is caused by the routing of the patterns, to the reduction in package size. That is, in the present invention, it is possible to reduce the width of the patterns and terminals, which cannot be realized in the piezoelectric resonator device bonded by the metal paste sealing material such as Au—Sn.

In the present invention, the sealing-member-side first bonding pattern is bonded to the resonator-plate-side first bonding pattern by the diffusion bonding, and the sealing-member-side second bonding pattern is bonded to the resonator-plate-side second bonding pattern by the diffusion bonding, which does not requires the bonding by the heart-melting at the high temperature. Accordingly, when the piezoelectric resonator device is bonded to an external member such as an external circuit by a solder and the like, it is possible to avoid remelting at the bonding part. Also, the bonded state does not change by reflow or under use environment.

In the above-described configuration, the sealing-member-side first bonding pattern may be bonded to the resonator-plate-side first bonding pattern by the diffusion bonding at an room temperature, and the sealing-member-side second bonding pattern may be bonded to the resonator-plate-side second bonding pattern by the diffusion bonding at the room temperature.

In this case, the sealing-member-side first bonding pattern is bonded to the resonator-plate-side first bonding pattern by the diffusion bonding at the room temperature, and the sealing-member-side second bonding pattern is bonded to the resonator-plate-side second bonding pattern by the diffusion bonding at the room temperature, which suppressing the generation of gas. Thus, it is suitable for preventing the deterioration of the oscillation characteristics due to the presence of gas in the internal space. Also, it is possible to avoid remelting at the bonding part, and to prevent the bonded state from changing.

In the above-described configuration, the sealing-member-side first bonding pattern may be bonded to the resonator-plate-side first bonding pattern by the diffusion bonding at a temperature in a range from the room temperature to the temperature less than 230° C., and the sealing-member-side second bonding pattern may be bonded to the resonator-plate-side second bonding pattern by the diffusion bonding at a temperature in the range from the room temperature to the temperature less than 230° C.

In this case, the sealing-member-side first bonding pattern is bonded to the resonator-plate-side first bonding pattern by the diffusion bonding at the temperature in the range from the room temperature to the temperature less than 230° C., and the sealing-member-side second bonding pattern is bonded to the resonator-plate-side second bonding pattern by the diffusion bonding at the temperature in the range from the room temperature to the temperature less than 230° C., which suppressing the generation of gas while improving the bonding.

In the above-described configuration, the first excitation electrode and the resonator-plate-side first bonding pattern, both formed on the first main surface of the piezoelectric resonator plate, may have a same thickness, and both surfaces of the first excitation electrode and the resonator-plate-side first bonding pattern may be made of a same metal. The second excitation electrode and the resonator-plate-side second bonding pattern, both formed on the second main surface of the piezoelectric resonator plate, may have a same thickness, and both surfaces of the second excitation electrode and the resonator-plate-side second bonding pattern may be made of a same metal.

The first excitation electrode and the resonator-plate-side first bonding pattern both formed on the first main surface of the piezoelectric resonator plate have the same thickness, and the surfaces of the first excitation electrode and the resonator-plate-side first bonding pattern are made of the same metal. The second excitation electrode and the resonator-plate-side second bonding pattern both formed on the second main surface of the piezoelectric resonator plate have the same thickness, and the surfaces of the second excitation electrode and the resonator-plate-side second bonding pattern are made of the same metal. Thus, the metal films of the first excitation electrode and the resonator-plate-side first bonding pattern can be formed at a time, and the metal films of the second excitation electrode and the resonator-plate-side second bonding pattern can be formed at a time. As a result, it is possible to use the same metal film to the first excitation electrode and the resonator-plate-side first bonding pattern, and to use the same metal film to the second excitation electrode and the resonator-plate-side second bonding pattern.

In the resonator-plate-side first bonding pattern and the resonator-plate-side second bonding pattern of the above-described configuration, the respective base PVD films may be made of a single material, and the respective electrode PVD films may be made of a single material. The thickness of the electrode PVD films may be greater than the thickness of the base PVD films.

In this case, it is possible to prevent the single material of the base PVD films from diffusing into the electrode PVD films.

On the second sealing member of the above-described configuration, the external terminals to be electrically connected to the outside may be formed on an outer main surface not facing the piezoelectric resonator plate. The external terminals may each be constituted by a base PVD film deposited on the outer main surface by the physical vapor deposition and an electrode PVD film deposited on the base PVD film by the physical vapor deposition. The base PVD film of each of the external terminals may have a great thickness compared with the respective base PVD films of the resonator-plate-side first bonding pattern, the resonator-plate-side second bonding pattern, the sealing-member-side first bonding pattern and the sealing-member-side second bonding pattern.

Compared with the base PVD films of the resonator-plate-side first bonding pattern, the resonator-plate-side second bonding pattern, the sealing-member-side first bonding pattern and the sealing-member-side second bonding pattern, the base PVD films of the external terminals have a great thickness. Thus, in order to electrically connect the external terminals to the outside (e.g., solder-mounting) while stabilizing the bonding of the first sealing member, the second sealing member and the piezoelectric resonator plate, it is possible to effectively use the base PVD films for electrically connecting to the outside. Note that when the base PVD films of the resonator-plate-side first bonding pattern, the resonator-plate-side second bonding pattern, the sealing-member-side first bonding pattern, the sealing-member-side second bonding pattern and the external terminals have the same thickness, it is impossible to electrically connect the external terminals to the outside (e.g., solder-mounting).

In the above-described configuration, Au may be contained in the electrode PVD film.

Since Au is contained in the electrode PVD films, the surfaces of the resonator-plate-side first bonding pattern, the resonator-plate-side second bonding pattern, the sealing-member-side first bonding pattern and the sealing-member-side second bonding pattern are difficult to oxidize. Thus, an advanced and special preprocessing is not needed before bonding the resonator-plate-side first bonding pattern, the resonator-plate-side second bonding pattern, the sealing-member-side first bonding pattern and the sealing-member-side second bonding pattern. As a result, it is possible to reduce production cost. Regarding the preprocessing here, the present configuration does not require, for example, an ultra-high vacuum state as the atmosphere environment.

In the above-described configuration, the resonator-plate-side first bonding pattern, the resonator-plate-side second bonding pattern, the sealing-member-side first bonding pattern and the sealing-member-side second bonding pattern may be a pattern not containing Sn.

Since the resonator-plate-side first bonding pattern, the resonator-plate-side second bonding pattern, the sealing-member-side first bonding pattern and the sealing-member-side second bonding pattern do not contain Sn, high-temperature heating is not needed at the time of bonding, thus there is no trouble (i.e., remelting) caused by the bonding at the high temperature.

Thus, in the present configuration, there is no need for using separately the metal paste sealing material, which contributes to the cost reduction. Furthermore, in the present invention, the base PVD films and the electrode PVD films are formed using the PVD method (e.g., a film forming method for patterning in processing such as photolithography) such as vacuum deposition, sputtering, ion plating, molecular beam epitaxy (MBE) and laser ablation, thus it is also possible to reduce the cost.

Because the patterns do not contain Sn (not use Sn), it is possible to reduce the width of the patterns. Thus, it is possible to prevent a trouble such as short-circuiting caused by interference of the patterns and terminals that serve as hetero electrodes.

In the above-described configuration, Cu may be contained in the resonator-plate-side first bonding pattern, the resonator-plate-side second bonding pattern, the sealing-member-side first bonding pattern and the sealing-member-side second bonding pattern.

Since Cu is contained in the resonator-plate-side first bonding pattern, the resonator-plate-side second bonding pattern, the sealing-member-side first bonding pattern and the sealing-member-side second bonding pattern, it is possible to contribute to stress relaxation at the time of producing (e.g. when bonding or when the device is shocked due to an external force by, for example, pressurizing) or at the time of using (e.g. when solder-mounting is performed or when the device is shocked by an external force such as falling shock). Thus, with the present configuration, the mechanical strength is improved.

If Cr is contained in the base PVD films (e.g. Cr+Ag–Cu+Au), it is possible to prevent Cr from diffusing into the electrode PVD films because of Cu contained in the base PVD films. As a result, even when the layer containing Cr is made thick, it is possible to prevent Cr from diffusing into the electrode PVD films, thus thickening the Cr layer results in suppression of the production variation. Specifically, even when the Cr layer has a thickness of 0.2 μm, it is possible to prevent Cr from diffusing into the electrode PVD films.

When Cr is contained in the base PVD films (e.g. Cr+Ag–Cu+Au), it is suitable for resistance heating vapor deposition.

In the above-described configuration, the sealing-member-side first bonding pattern may be bonded to the resonator-plate-side first bonding pattern by pressurized diffusion bonding, and the sealing-member-side second bonding pattern may be bonded to the resonator-plate-side second bonding pattern by the pressurized diffusion bonding.

In the present configuration, since the sealing-member-side first bonding pattern is bonded to the resonator-plate-side first bonding pattern by the pressurized diffusion bonding, and the sealing-member-side second bonding pattern is bonded to the resonator-plate-side second bonding pattern by the pressurized diffusion bonding, it is possible to easily ensure the bonding part due to pressurizing. Thus, the bonding by only the diffusion bonding may be performed more suitably without high-temperature heating.

In the above-described configuration, the first sealing member and the second sealing member may each be made of a material having the flexural rigidity (moment of inertia of area×Young's modulus) of not more than 1000 [N·mm$^2$].

The first sealing member and the second sealing member are each made of an insulating (brittle) material having the flexural rigidity (moment of inertia of area×Young's modulus) of not more than 1000 [N·mm$^2$] so as to satisfy a deformation required for bonding. For this reason, it is possible to perform the diffusion bonding conditional on the flexural rigidity in the above-described range. It is not necessary, for example, to form the surfaces of the electrodes such as the first excitation electrode and the second excitation electrode so as to have the surface roughness (Ra) of not more than 1 nm necessary for the normal bonding.

In the above-described configuration, the sealing-member-side first bonding pattern may be bonded to the resonator-plate-side first bonding pattern by the pressurized diffusion bonding without using any special bonding material (e.g. an adhesive) separately, and the sealing-member-side second bonding pattern may be bonded to the resonator-plate-side second bonding pattern by the pressurized diffusion bonding without using any special bonding material (e.g. an adhesive) separately.

In this way, the sealing-member-side first bonding pattern is bonded to the resonator-plate-side first bonding pattern by the pressurized diffusion bonding, and the sealing-member-side second bonding pattern is bonded to the resonator-plate-side second bonding pattern by the pressurized diffusion bonding, not using separately the special bonding material. Thus, it is possible to contribute to the reduction in size, especially in height. When using the special bonding material, the reduction in height is limited. In the present configuration, it is possible to reduce the height beyond the above limit.

On the second sealing member of the above-described configuration, the external terminals to be electrically connected to the outside may be formed on the outer main surface not facing the piezoelectric resonator plate, and the external terminals may each be constituted by a base PVD film deposited on the outer main surface by the physical vapor deposition and an electrode PVD film deposited on the base PVD film by the physical vapor deposition. Also, the thickness of a bonding pattern made by the diffusion bonding of the sealing-member-side first bonding pattern and the resonator-plate-side first bonding pattern may be the same as the thickness of a bonding pattern made by the diffusion bonding of the sealing-member-side second bonding pattern and the resonator-plate-side second bonding pattern, and may be different from the thickness of the external terminals electrically connected to the outside.

In the present configuration, it is possible to reliably prevent the base PVD films from diffusing at the time of the diffusion bonding, and furthermore, it is possible to improve the bonding strength of the base PVD films to the first sealing member, the second sealing member and the piezoelectric resonator plate. In addition, in order to electrically connect the external terminals to the outside (e.g., solder-mounting), it is possible to effectively use the base PVD films for electrically connecting to the outside.

In the second sealing member of the above-described configuration, through holes may be formed so as to be disposed in an outward position of the internal space, and no through hole may be formed in an inward position of the internal space.

In the second sealing member, the through hole is formed so as to be disposed in the outward position of the internal space. Thus, the through hole does not affect the internal space, accordingly, it is possible to avoid poor hermeticity caused by the through hole, compared with the configuration in which the through hole is disposed in the inward position of the internal space.

Unlike the present configuration, when the through hole is disposed in the internal space, it is necessary to ensure the hermeticity of the internal space, thus, it is necessary to add a process to fill the through hole in the internal space with a metal and the like. In contrast, in the present configuration, since the through hole is formed in the outward position of the internal space, routing of the wiring pattern can be made in the same process as the pattern formation of the resonator-plate-side first bonding pattern, the resonator-plate-side second bonding pattern, the sealing-member-side first bonding pattern and the sealing-member-side second bonding pattern. Thus, it is possible to reduce the production cost.

In the above-described configuration, the sealing-member-side first bonding pattern formed on the first sealing member and the sealing-member-side second bonding pattern formed on the second sealing member are not needed to be superimposed to each other in plan view.

Since the sealing-member-side first bonding pattern and the sealing-member-side second bonding pattern are not superimposed to each other in plan view, it is possible to prevent generation of stray capacitance by the sealing-member-side first bonding pattern and the sealing-member-side second bonding pattern.

In the above-described configuration in which the resonator-plate-side first bonding pattern and the resonator-plate-side second bonding pattern are respectively formed on the first main surface and the second main surface of the piezoelectric resonator plate so as to be sealed and bonded to the first sealing member and the second sealing member, compared with the resonator-plate-side first bonding pattern and the resonator-plate-side second bonding pattern formed on the piezoelectric resonator plate, the sealing-member-side first bonding pattern formed on the first sealing member and the sealing-member-side second bonding pattern formed on the second sealing member may each have a large width.

According to the reduction in package size, the width of the bonding pattern of the resonator-plate-side first bonding pattern and the resonator-plate-side second bonding pattern becomes smaller. In particular, since it is possible to prevent coupling with an unnecessary oscillation mode by ensuring an oscillation region as large as possible, reducing the width of the bonding pattern is needed. On the other hand, since size restriction to the first sealing member and the second sealing member is loose compared with the vibrating part, the width of the bonding pattern of the sealing-member-side first bonding pattern and the sealing-member-side second bonding pattern can be large, which results in a high degree of freedom in accurate positioning at the time of bonding.

In the above-described configuration, an oscillation circuit element may be provided on a first main surface of the first sealing member, and a second main surface of the first sealing member may be bonded to the first main surface of the piezoelectric resonator plate.

In the present configuration, it is not necessary to ensure the space for mounting the oscillation circuit element on the piezoelectric resonator plate, thus, the height of the package can be reduced.

Also, changing the pattern for the oscillation circuit element, the pattern provided on the first main surface of the first sealing member, is sufficient to be adapted to the desirable oscillation condition.

Furthermore, a marking can be performed on the rear surface of the oscillation circuit element, thus the special marking is not needed even when the first sealing member is made of a transparent material.

In the conventional art, a recess is provided in the first sealing member, the piezoelectric resonator plate and the like, so that the oscillation circuit element is mounted on the recess without exception. Thus, the outline of the piezoelectric resonator device is necessarily larger than that of the oscillation circuit element. However, in the first sealing member of the present configuration, the oscillation circuit element is provided on the first main surface, and the second main surface is bonded to the first main surface of the piezoelectric resonator plate. Thus, the size of the oscillation circuit element and the size of the piezoelectric resonator device can be the same, which is advantageous for reduction in size and in height.

In the above-described configuration, the first sealing member and the piezoelectric resonator plate may have a gap of not more than 1.00 μm, and the second sealing member and the piezoelectric resonator plate may have a gap of not more than 1.00 μm.

In the present configuration, there is no variation in the height of the package of the piezoelectric resonator device. For example, unlike the present configuration, when using the metal paste sealing material such as an Sn-containing bonding material that makes a gap of more than 1 μm, the variation in the height occurs when the metal paste sealing material is formed on the patterns (the resonator-plate-side first bonding pattern, the resonator-plate-side second bonding pattern, the sealing-member-side first bonding pattern and the sealing-member-side second bonding pattern). Also, after bonding, due to heat capacity distribution in the formed patterns (the resonator-plate-side first bonding pattern, the resonator-plate-side second bonding pattern, the sealing-member-side first bonding pattern and the sealing-member-side second bonding pattern), the even gaps are not formed. Therefore, in the conventional art, when three members (i.e., the first sealing member, the second sealing member and the piezoelectric resonator plate) are laminated, the respective gaps between the members are different. As a result, the laminated three members are bonded in a state in which they are not parallel to each other. This problem becomes remarkable according to the reduction in package height. On the other hand, in the present configuration, since the upper limit of the gap is set to 1.00 μm, the three members (i.e., the first sealing member, the second sealing member and the piezoelectric resonator plate) can be laminated and bonded in a state in which they are parallel to each other, thus, the present configuration can be adaptable to the height reduction.

In the above-described configuration, the resonator-plate-side first bonding pattern may be connected to the first excitation electrode, and the resonator-plate-side second bonding pattern may be connected to the second excitation electrode. Out of the external terminals, the second excitation electrode may be superimposed to a second external terminal connected to the second excitation electrode, without being superimposed to a first external terminal connected to the first excitation electrode. The first sealing member and the piezoelectric resonator plate may have a gap of not more than 1.00 μm, and the second sealing member and the piezoelectric resonator plate may have a gap of not more than 1.00 μm.

In the piezoelectric resonator device having the sandwich structure of the present configuration, it is possible to prevent generation of the stray capacitance, although the excitation electrode is superimposed to the external terminal.

Specifically, the resonator-plate-side first bonding pattern is connected to the first excitation electrode and the resonator-plate-side second bonding pattern is connected to the second excitation electrode. Out of the external terminals, the second excitation electrode is not superimposed to the first external terminal connected to the first excitation electrode, and is superimposed to the second external terminal connected to the second excitation electrode. Thus, even when the second excitation electrode is superimposed to the homopolar second external terminal, the stray capacitance is not generated. Furthermore, it is possible to reduce the size of the piezoelectric resonator device having the sandwich structure while suppressing the stray capacitance generated by the superimposition of the second excitation electrode to the heteropolar first external terminal.

On the second sealing member of the above-described configuration, connection terminals may be formed on the main surface not facing the piezoelectric resonator plate so that the connection terminals are bonded to a function unit by the diffusion bonding, the function unit on which are formed the external terminals to be directly bonded to a circuit board. The connection terminals may each be constituted by a base PVD film deposited on the main surface not facing the piezoelectric resonator plate by the physical vapor deposition and an electrode PVD film deposited on the base PVD film by the physical vapor deposition.

In the present configuration, the piezoelectric resonator device can have a desirable function such as a voltage controlled crystal oscillator (VCXO), a simple package crystal oscillator (SPXO), a temperature compensated crystal oscillator (TCXO), an oven controlled crystal oscillator (OCXO) and an X-tal to be mounted on a vehicle, which results in a high degree of freedom in function of the piezoelectric resonator device.

In the present configuration, the sealing-member-side first bonding pattern is bonded to the resonator-plate-side first bonding pattern by the diffusion bonding, and the sealing-member-side second bonding pattern is bonded to the resonator-plate-side second bonding pattern by the diffusion bonding. Also, in the first sealing member or the second sealing member, the connection terminals for the diffusion bonding to the function unit are formed on the main surface not facing the piezoelectric resonator plate. Thus, the piezoelectric resonator plate, the first sealing member and the second sealing member are not bonded to each other by the high-temperature heating, accordingly, it is possible to prevent the degradation of the connection terminals due to the high-temperature heating for bonding.

Effect of Invention

With the piezoelectric resonator device having the sandwich structure according to the present invention, no gas is generated and it is possible to reduce the height or size.

BRIEF DESCRIPTION OF DRAWINGS

FIG. 21 is a schematic plan view illustrating the variation of the function unit of the crystal resonator of the present invention.

FIG. 22 is a schematic rear view illustrating the variation of the function unit of the crystal resonator of the present invention.

MODES FOR CARRYING OUT INVENTION

Hereinafter, three embodiments will be described with reference to the drawings. In the following embodiments, a crystal resonator is applied to a piezoelectric resonator device that causes piezoelectric resonance.

—First Embodiment of Crystal Resonator—

Figure 1:
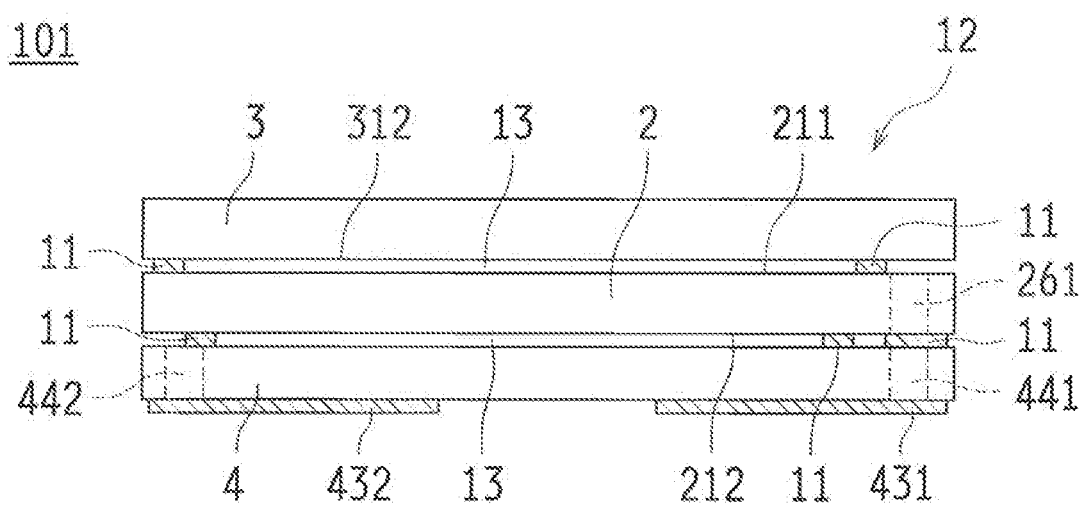
FIG. 1 is a schematic configuration diagram illustrating a configuration of a crystal resonator according to a first embodiment of the present invention.

As shown in FIG. 1, a crystal resonator 101 according to this embodiment includes: a crystal resonator plate 2 (a piezoelectric resonator plate in the present invention); a first sealing member 3 that covers a first excitation electrode 221 (see FIG. 4) of the crystal resonator plate 2 so as to hermetically seal the first excitation electrode 221 that is formed on a first main surface 211 of the crystal resonator plate 2; and a second sealing member 4 disposed on a second main surface 212 of the crystal resonator plate 2 so as to cover a second excitation electrode 222 (see FIG. 5) of the crystal resonator plate 2, the second sealing member 4 for hermetically sealing the second excitation electrode 222 that makes a pair with the first excitation electrode 221.

In the crystal resonator 101, the crystal resonator plate 2 is bonded to the first sealing member 3, and also the crystal resonator plate 2 is bonded to the second sealing member 4. Thus, a package 12 having a sandwich structure is constituted.

An internal space 13 of the package 12 is formed by bonding the first sealing member 3 to the second sealing member 4 via the crystal resonator plate 2. In this internal space 13 of the package 12, an vibrating part 23 is hermetically sealed. The vibrating part 23 includes the first excitation electrode 221 and the second excitation electrode 222 respectively formed on both main surfaces 211 and 212 of the crystal resonator plate 2. As shown in FIG. 1, the internal space 13 is located so as to be deflected to one end side (left side) in plan view of the package 12.

The crystal resonator 101 according to this embodiment has a package size of 1.0×0.8 mm, which is reduced in size and height. According to the size reduction, no castellation is formed in the package 12. Through holes (see a first through hole 261, a second through hole 441 and a third through hole 442) are used for conduction between electrodes.

Next, the configuration of the above-described crystal resonator 101 will be described referring to FIGS. 1 to 7. Here, each of the crystal resonator plate 2, the first sealing member 3 and the second sealing member 4 will be described as a single body without bonded.

Figure 4:
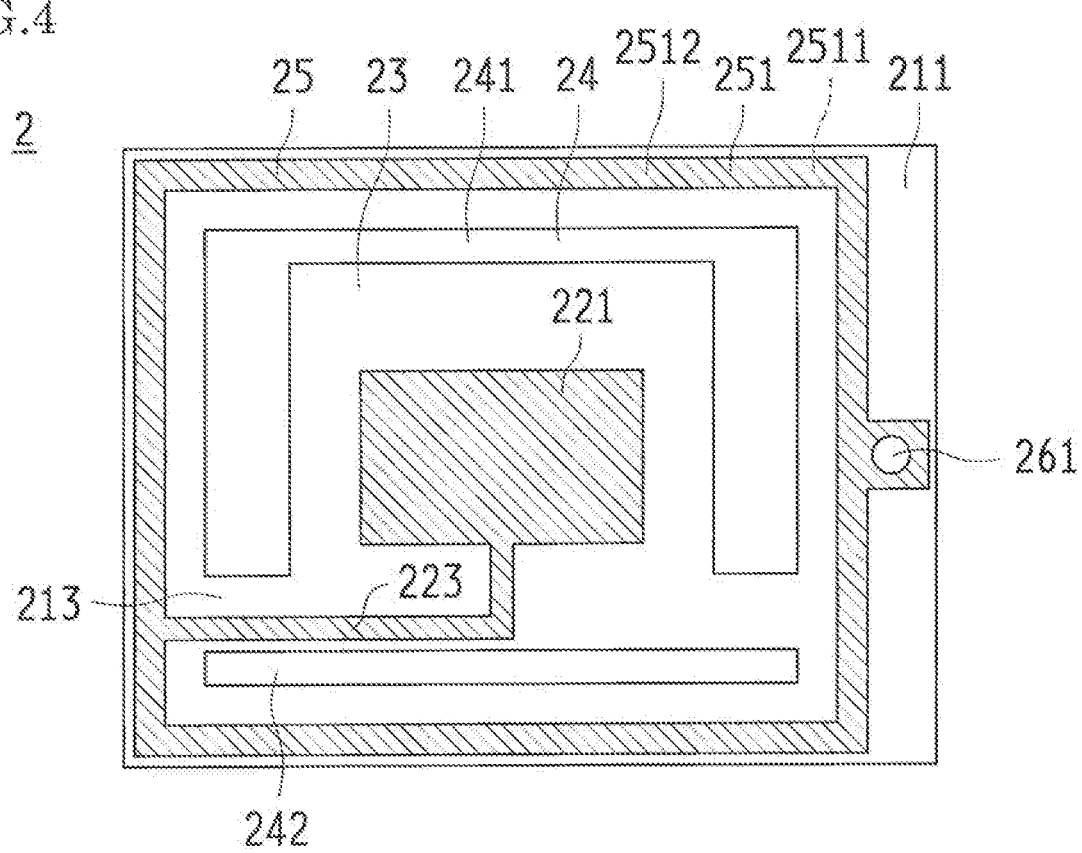
FIG. 4 is a schematic plan view illustrating a crystal resonator plate of the crystal resonator of the present invention.
Figure 5:
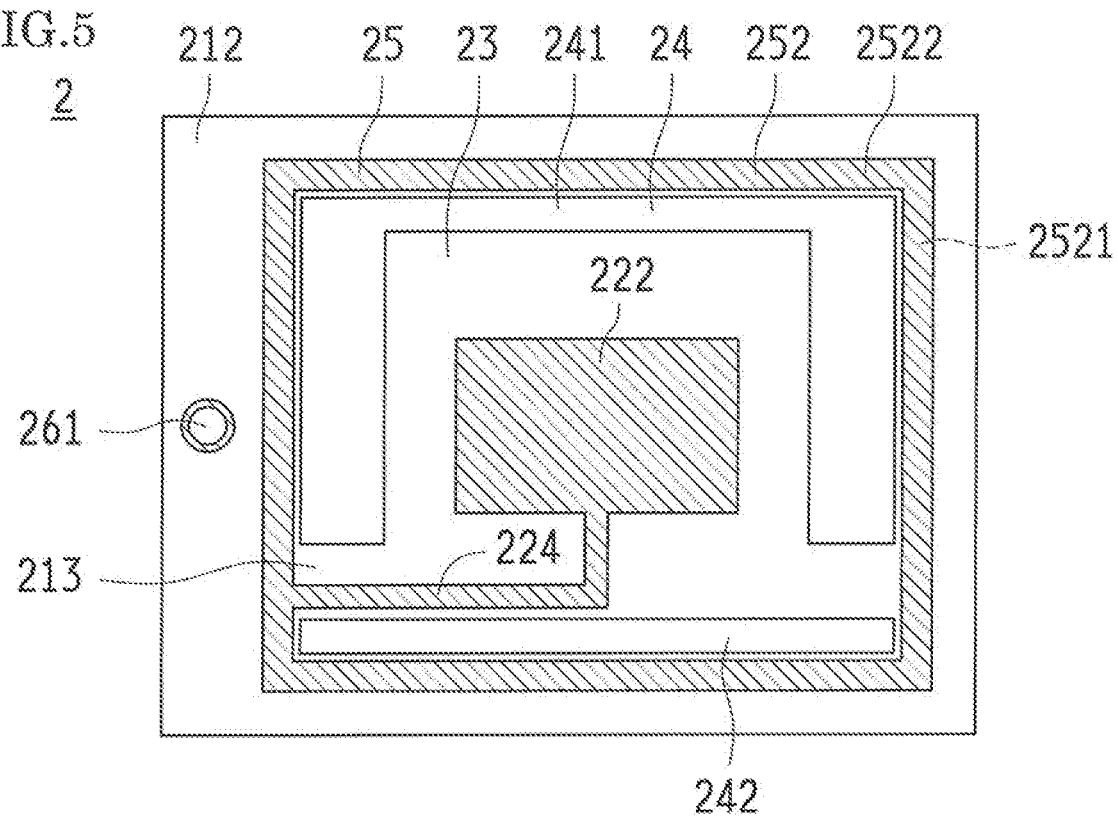
FIG. 5 is a schematic rear view illustrating the crystal resonator plate of the crystal resonator of the present invention.

As shown in FIGS. 4 and 5, the crystal resonator plate 2 is made of a crystal as a piezoelectric material. Both main surfaces (the first main surface 211 and the second main surface 212) are formed as smooth flat surfaces (mirror-finished).

A pair of excitation electrodes (i.e., excitation electrodes making a pair with each other, that is, the first excitation electrode 221 and the second excitation electrode 222) is formed, respectively, on both main surfaces 211 and 212 (the first main surface 211 and the second main surface 212) of the crystal resonator plate 2. Also, in both main surfaces 211 and 212, two cut-out parts 24 (each having a penetration shape) are formed so as to surround, in plan view, the pair of first excitation electrode 221 and second excitation electrode 222 (see FIGS. 4 and 5), thus, the vibrating part 23 is formed. The cut-out parts 24 are constituted by a squared U-shaped part 241 in plan view (i.e., a part in plan view made up of three rectangles in plan view: one rectangle; and two rectangles extending from both ends of the one rectangle in the direction perpendicular thereto), and an oblong rectangular shaped part 242 in plan view. A part between the squared U-shaped part 241 in plan view and the oblong rectangular shaped part 242 in plan view serves as a conduction path 213 on which are disposed extraction electrodes (a first extraction electrode 223 and a second extraction electrode 224) for extracting the first excitation electrode 221 and the second excitation electrode 222 to external terminals (a first connection terminal 431 and a second connection terminal 432, as described later). Regarding electrode patterns, the first extraction electrode 223 and the second extraction electrode 224 extracted respectively from the pair of first excitation electrode 221 and second excitation electrode 222 are electrically connected to the external electrodes (the first connection terminal 431 and the second connection terminal 432) formed on the second sealing member 4, via a resonator-plate-side first bonding pattern 251 and a resonator-plate-side second bonding pattern 252.

In the crystal resonator plate 2, respective resonator-plate-side sealing parts 25 to be bonded to the first sealing member 3 and to the second sealing member 4 are provided on outward positions along the vibrating part 23 of both main surfaces 211 and 212, so that the vibrating part 23 is surrounded. As shown in FIGS. 4 and 5, the resonator-plate-side sealing parts 25 are located so as to be deflected to the left side in plan view of both main surfaces 211 and 212.

On the resonator-plate-side sealing part 25 on the first main surface 211 of the crystal resonator plate 2, the resonator-plate-side first bonding pattern 251 is formed to be bonded to the first sealing member 3. The first excitation electrode 221 is connected to the resonator-plate-side first bonding pattern 251. Also, on the resonator-plate-side sealing part 25 on the second main surface 212 of the crystal resonator plate 2, the resonator-plate-side second bonding pattern 252 is formed to be bonded to the second sealing member 4. The second excitation electrode 222 is connected to the resonator-plate-side second bonding pattern 252. The internal space 13 is formed in an inward position (inside) of the resonator-plate-side first bonding pattern 251 and the resonator-plate-side second bonding pattern 252.

The resonator-plate-side first bonding pattern 251, which is formed on the first main surface 211 of the crystal resonator plate 2 so as to be bonded to the first sealing member 3, is constituted by a base PVD film 2511 deposited on the first main surface 211 by physical vapor deposition, and an electrode PVD film 2512 deposited on the base PVD film 2511 by the physical vapor deposition. Also, the resonator-plate-side second bonding pattern 252, which is formed on the second main surface 212 of the crystal resonator plate 2 so as to be bonded to the second sealing member 4, is constituted by a base PVD film 2521 deposited on the second main surface 212 by the physical vapor deposition, and an electrode PVD film 2522 deposited on the base PVD film 2521 by the physical vapor deposition. That is, the resonator-plate-side first bonding pattern 251 and the resonator-plate-side second bonding pattern 252 have the same configuration in which a plurality of layers is laminated on the resonator-plate-side sealing part 25 of both main surfaces 211 and 212, specifically, a Ti layer (or a Cr layer) and an Au layer are deposited by vapor deposition in this order from the lowermost layer side. Like this, in the resonator-plate-side first bonding pattern 251 and the resonator-plate-side second bonding pattern 252, the base PVD films 2511 and 2521 are made of a single material (Ti or Cr), the electrode PVD films 2512 and 2522 are made of a single material (Au), and the electrode PVD films 2512 and 2522 have a thickness greater than the thickness of the base PVD films 2511 and 2521. The first excitation electrode 221 and the resonator-plate-side first bonding pattern 251 both formed on the first main surface 211 of the crystal resonator plate 2 have the same thickness, and the surfaces (main surfaces) of the first excitation electrode 221 and the resonator-plate-side first bonding pattern 251 are made of the same metal. The second excitation electrode 222 and the resonator-plate-side second bonding pattern 252 both formed on the second main surface 212 of the crystal resonator plate 2 have the same thickness, and the surfaces (main surfaces) of the second excitation electrode 222 and the resonator-plate-side second bonding pattern 252 are made of the same metal. The resonator-plate-side first bonding pattern 251 and the resonator-plate-side second bonding pattern 252 do not contain Sn. Note that when the resonator-plate-side first and second bonding patterns 251 and 252 are compared with the resonator plate side (first excitation electrode 221 and the second excitation electrode 222) in the configuration in which they have the same thickness and their surfaces are made of the same metal on the same main surface, it is possible to perform bonding even when the kind or thickness of the base metals (the base PVD films 2511 and 2521) differs, under the condition in which the uppermost layers (at least exposed surfaces, i.e., the electrode PVD films 2512 and 2522 and the like) are made of the same metal. The electrode PVD films 2512 and 2522 of the resonator-plate-side first bonding pattern 251 and the resonator-plate-side second bonding pattern 252 have respective scaly surfaces in plan view. Here, being scaly means a dense (or almost dense) state in plan view in which miscroscopically individual pieces of metal due to activation overlap with each other like a straw-mat.

As shown in FIGS. 4 and 5, the crystal resonator plate 2 includes the first through hole 261. The resonator-plate-side first bonding pattern 251 connected to the first excitation electrode 221 is extracted to the side of the second main surface 212 through the first through hole 261. The first through hole 261 is disposed in the outward position of the internal space 13, and located so as to be defected to the other end side (right side) in plan view of both main surfaces 211 and 212, as shown in FIG. 4. Thus, the first through hole 261 is not formed in the inward position of the internal space 13. Here, the inward position of the internal space 13 means strictly the inner side of the inner peripheral surface of the bonding material 11, not including the position on the bonding material 11.

Figure 2:
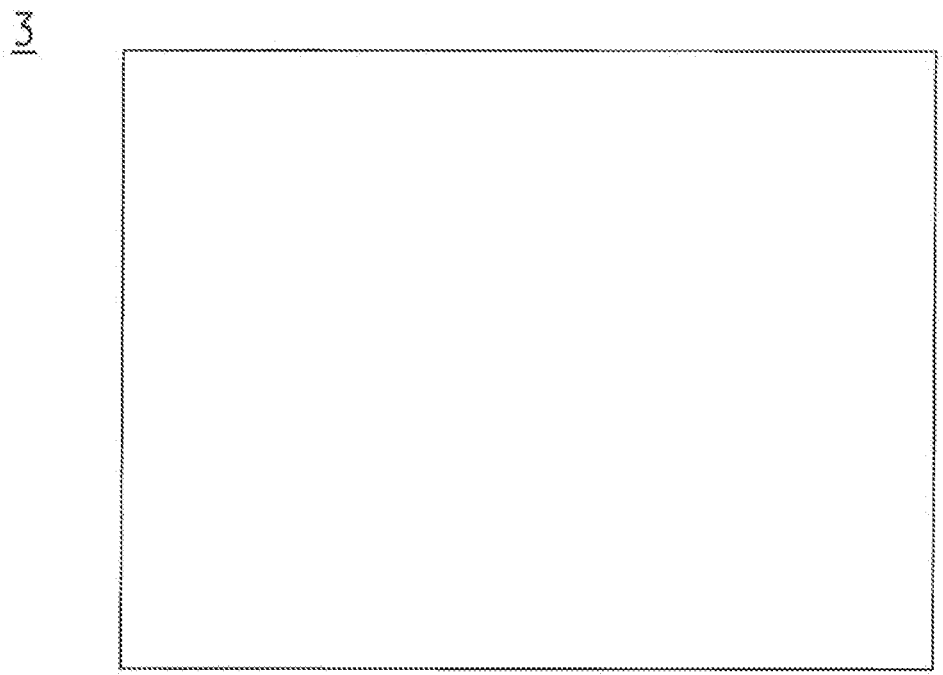
FIG. 2 is a schematic plan view illustrating a first sealing member of the crystal resonator of the present invention.
Figure 3:
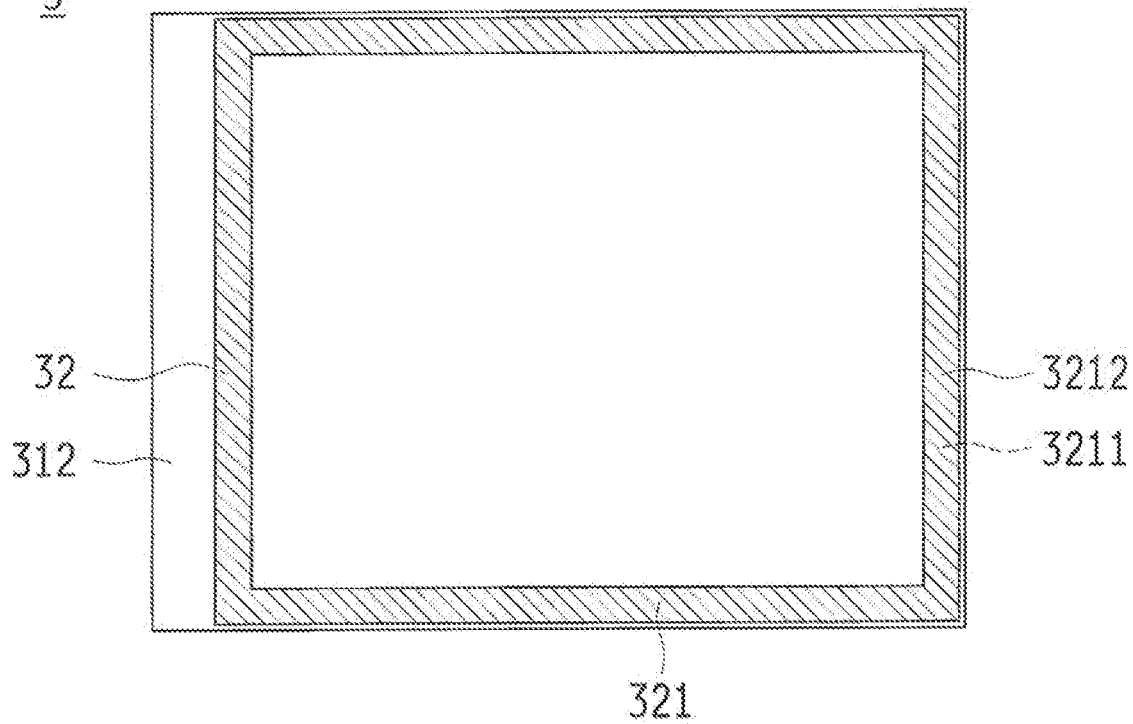
FIG. 3 is a schematic rear view illustrating the first sealing member of the crystal resonator of the present invention.

The first sealing member 3 is made of a material having the flexural rigidity (moment of inertia of area×Young's modulus) of not more than 1000 [N·mm$^2$]. Specifically, as shown in FIGS. 2 and 3, the first sealing member 3 is a substrate having a rectangular parallelepiped shape that is made of a single glass wafer. A second main surface 312 (a surface to be bonded to the crystal resonator plate 2) of the first sealing member 3 is formed as a smooth flat surface (mirror finished).

On the second main surface 312 of the first sealing member 3, a sealing-member-side first sealing part 32 is disposed so as to be bonded to the crystal resonator plate 2. As shown in FIG. 3, the sealing-member-side first sealing part 32 is located so as to be deflected to the left side in plan view of the second main surface 312 of the first sealing member 3.

On the sealing-member-side first sealing part 32 of the first sealing member 3, a sealing-member-side first bonding pattern 321 is formed so as to be bonded to the crystal resonator plate 2. The sealing-member-side first bonding pattern 321 has the same width at all positions on the sealing-member-side first sealing part 32 of the first sealing member 3.

The sealing-member-side first bonding pattern 321 is constituted by a base PVD film 3211 deposited on the first sealing member 3 by the physical vapor deposition, and an electrode PVD film 3212 deposited on the base PVD film 3211 by the physical vapor deposition. In this embodiment, the base PVD film 3211 is made of Ti (or Cr), and the electrode PVD film 3212 is made of Au. Also, the sealing-member-side first bonding pattern 321 does not contain Sn. Specifically, the sealing-member-side first bonding pattern 321 is made of a plurality of layers laminated on the sealing-member-side first sealing part 32 of the second main surface 312, that is, a Ti layer (or a Cr layer) and an Au layer are deposited by the vapor deposition in this order from the lowermost layer side. Furthermore, in the sealing-member-side first bonding pattern 321, the electrode PVD film 3212 has a scaly surface in plan view.

Figure 6:
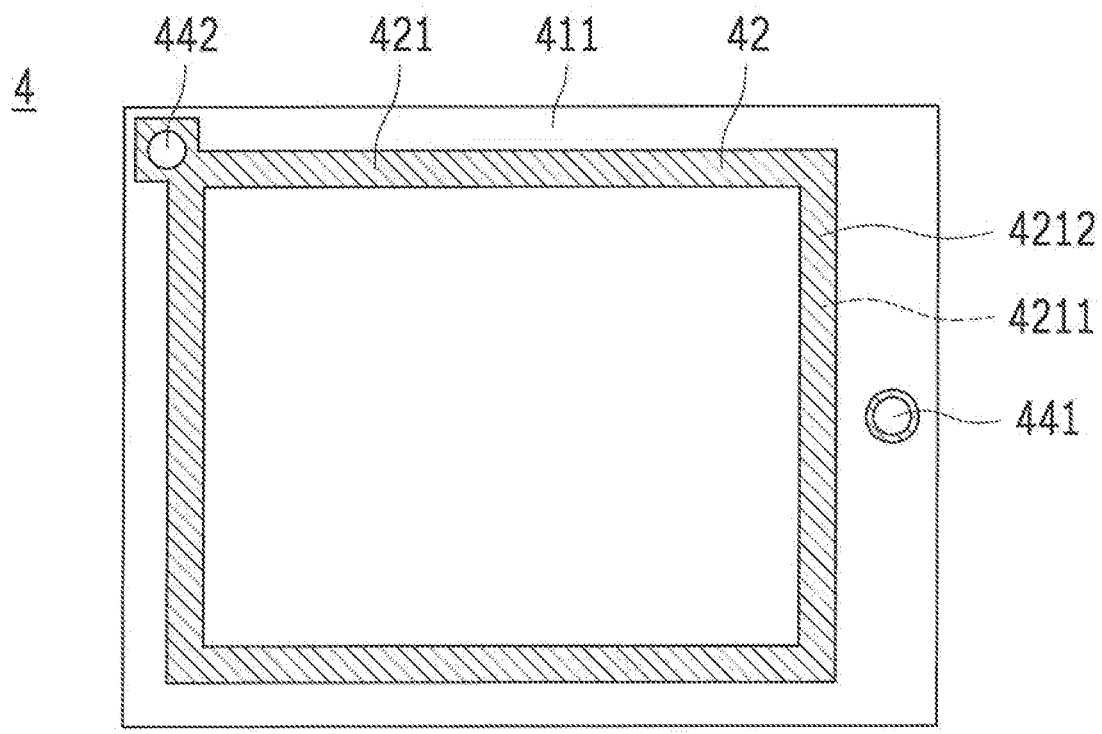
FIG. 6 is a schematic plan view illustrating a second sealing member of the crystal resonator of the present invention.

The second sealing member 4 is made of a material having the flexural rigidity (moment of inertia of area× Young's modulus) of not more than 1000 [N·mm$^2$]. Specifically, as shown in FIG. 6, the second sealing member 4 is a substrate having a rectangular parallelepiped shape that is made of a single glass wafer. A first main surface 411 (a surface to be bonded to the crystal resonator plate 2) of the second sealing member 4 is formed as a smooth flat surface (mirror finished).

On the first main surface 411 of the second sealing member 4, a sealing-member-side second sealing part 42 is disposed so as to be bonded to the crystal resonator plate 2. As shown in FIG. 6, the sealing-member-side second sealing part 42 is located so as to be deflected to the left side in plan view of the first main surface 411 of the second sealing member 4.

Figure 7:
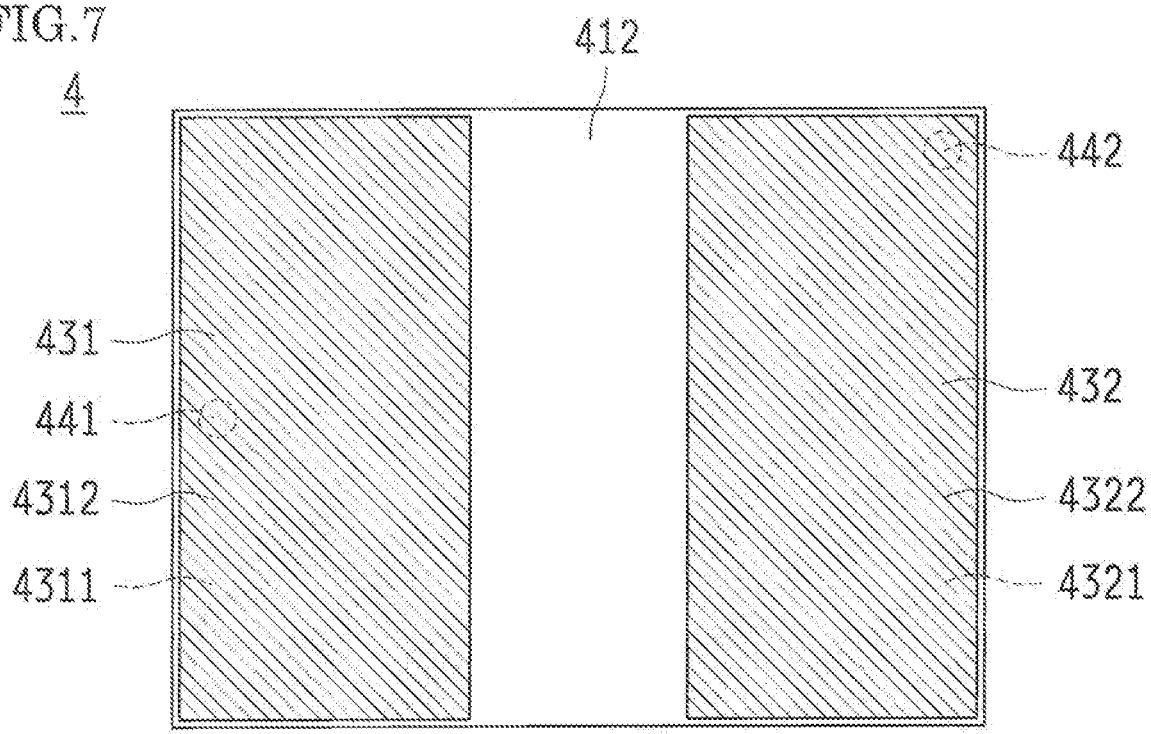
FIG. 7 is a schematic rear view illustrating the second sealing member of the crystal resonator of the present invention.

Also, a pair of external terminals (the first connection terminal 431 and the second connection terminal 432), which is electrically connected to the outside, is formed on a second main surface 412 (an outer main surface not facing the crystal resonator plate 2) of the second sealing member 4. The first connection terminal 431 is electrically connected, directly, to the first excitation electrode 221 via the resonator-plate-side first bonding pattern 251. The second connection terminal 432 is electrically connected, directly, to the second excitation electrode 222 via the resonator-plate-side second bonding pattern 252. As shown in FIG. 7, the first connection terminal 431 and the second connection terminal 432 are respectively located on both ends in the longitudinal direction in plan view of the second main surface 412 of the second sealing member 4. The pair of external terminals (the first connection terminal 431 and the second connection terminal 432) is constituted by base PVD films 4311 and 4321 deposited on the second main surface 412 by the physical vapor deposition, and electrode PVD films 4312 and 4322 deposited on the base PVD films 4311 and 4321 by the physical vapor deposition. Compared with the base PVD films 2511, 2521, 3211 and 4211 of the above-described resonator-plate-side first bonding pattern 251, the resonator-plate-side second bonding pattern 252, the sealing-member-side first bonding pattern 321 and a sealing-member-side second bonding pattern 421, the base PVD films 4311 and 4321 of the external terminals (the first connection terminal 431 and the second connection terminal 432) have a great thickness. Also, the first connection terminal 431 and the second connection terminal 432 each cover a region of not less than ⅓ of the area of the second main surface 412 of the second sealing member 4.

On the sealing-member-side second sealing part 42 of the second sealing member 4, the sealing-member-side second bonding pattern 421 is formed so as to be bonded to the crystal resonator plate 2. The sealing-member-side second bonding pattern 421 has the same width at all positions on the sealing-member-side second sealing part 42 of the second sealing member 4.

The sealing-member-side second bonding pattern 421 is constituted by the base PVD film 4211 deposited on the second sealing member 4 by the physical vapor deposition, and an electrode PVD film 4212 deposited on the base PVD film 4211 by the physical vapor deposition. In this embodiment, the base PVD film 4211 is made of Ti (or Cr), and the electrode PVD film 4212 is made of Au. Also, the sealing-member-side second bonding pattern 421 does not contain Sn. Specifically, the sealing-member-side second bonding pattern 421 is made of a plurality of layers laminated on the sealing-member-side second sealing part 42 of the second main surface 412, that is, a Ti layer (or a Cr layer) and an Au layer are deposited by the vapor deposition in this order from the lowermost layer side. Furthermore, in the sealing-member-side second bonding pattern 421, the electrode PVD film 4212 has a scaly surface in plan view.

In the second sealing member 4, as shown in FIGS. 1, 6 and 7, two through holes (the second through hole 441 and the third through hole 442) are formed. The second through hole 441 and the third through hole 442 are disposed in the outward position of the internal space 13. As shown in FIGS. 6 and 7, the second through hole 441 is located so as to be defected to the right side in plan view of both main surfaces (the first main surface 411 and the second main surface 412) and the third through hole 442 is located on the upper left side in plan view. The second through hole 441 and the third through hole 442 are not formed in the inward position of the internal space 13. Here, the inward position of the internal space 13 means strictly the inner side of the inner peripheral surface of the bonding material 11, not including the position on the bonding material 11. Thus, the first connection terminal 431 is conducted to the resonator-plate-side first bonding pattern 251 that is connected to the first excitation electrode 221 of the crystal resonator plate 2, via the first through hole 261 of the crystal resonator plate 2 and the second through hole 441. Also, the second connection terminal 432 is conducted to the resonator-plate-side second bonding pattern 252 that is connected to the second excitation electrode 222 of the crystal resonator plate 2, via the third through hole 442 and the sealing-member-side second bonding pattern 421.

In the crystal resonator 101 having the above configuration, the crystal resonator plate 2 and the first sealing member 3 are subjected to diffusion bonding in a state in which the resonator-plate-side first bonding pattern 251 and the sealing-member-side first bonding pattern 321 are overlapped with each other, and the crystal resonator plate 2 and the second sealing member 4 are subjected to the diffusion bonding in a state in which the resonator-plate-side second bonding pattern 252 and the sealing-member-side second bonding pattern 421 are overlapped with each other, thus, the package 12 having the sandwich structure as shown in FIG. 1 is produced. In contrast to the conventional art, no special bonding material, such as an adhesive, is needed separately. The resonator-plate-side first bonding pattern 251 and the sealing-member-side first bonding pattern 321 themselves become the bonding material 11 formed upon the diffusion bonding. The resonator-plate-side second bonding pattern 252 and the sealing-member-side second bonding pattern 421 themselves become the bonding material 11 formed upon the diffusion bonding. In this embodiment, the diffusion bonding is performed at an room temperature. Here, the room temperature means the temperature in the range from 5 to 35° C. Advantageous effects as described later (suppression of generation of gas and improvement of bonding) are obtained by the diffusion bonding at the room temperature, which is lower than the melting point of 183° C. of the eutectic solder. Thus, this is a preferable embodiment. However, the advantageous effects described later can be obtained by the diffusion bonding performed at temperatures other than the room temperature. That is, the diffusion bonding may be performed at the temperature in the range from the room temperature to the temperature less than 230° C. In particular, when the diffusion bonding is performed at the temperature in the range from 200° C. to less than 230° C., which is less than the melting point of 230° C. of the Pb-free solder and furthermore not less than the recrystallization temperature (200° C.) of Au, it is possible to stabilize an unstable region of the bonding part. Also, in this embodiment, since the special bonding material such as Au—Sn is not used, the gas such as plating gas, binder gas and metal gas is not generated. Thus, the temperature can be equal to or more than the recrystallization temperature of Au.

As described above, in the package 12 produced here, the sealing-member-side first bonding pattern 321 is bonded to the resonator-plate-side first bonding pattern 251, and the sealing-member-side second bonding pattern 421 is bonded to the resonator-plate-side second bonding pattern 252, both by the diffusion bonding. Other than the above bonding, the sealing-member-side first bonding pattern 321 may be bonded to the resonator-plate-side first bonding pattern 251 by pressurized diffusion bonding, and the sealing-member-side second bonding pattern 421 may be bonded to the resonator-plate-side second bonding pattern 252 by the pressurized diffusion bonding. In this case, it is possible to easily ensure the bonding part (to increase substantially the bonding area) due to pressurizing, accordingly, the bonding by only the diffusion bonding can be performed more suitably without high-temperature heating.

Also, in the package 12 produced here, the first sealing member 3 and the crystal resonator plate 2 have a gap of not more than 1.00 μm. The second sealing member 4 and the crystal resonator plate 2 have a gap of not more than 1.00 μm. That is, the thickness of the bonding material 11 between the first sealing member 3 and the crystal resonator plate 2 is not more than 1.00 μm, and the thickness of the bonding material 11 between the second sealing member 4 and the crystal resonator plate 2 is not more than 1.00 μm (specifically, the thickness in the Au—Au bonding of this embodiment is 0.15 to 1.00 μm). As a comparative example, the conventional metal paste sealing material containing Sn has a thickness of 5 to 20 μm.

The thickness of the bonding pattern made by the diffusion bonding of the sealing-member-side first bonding pattern 321 and the resonator-plate-side first bonding pattern 251 is the same as the thickness of the bonding pattern made by the diffusion bonding of the sealing-member-side second bonding pattern 421 and the resonator-plate-side second bonding pattern 252, and is different from the thickness of the external terminals (the first connection terminal 431 and the second connection terminal 432) that are electrically connected to the outside.

As shown in FIGS. 1 to 7, in the package 12 produced here, the internal space 13 is located so as to be deflected to the left side in plan view. Also, the sealing-member-side first bonding pattern 321 formed on the first sealing member 3 and the sealing-member-side second bonding pattern 421 formed on the second sealing member 4 are not superimposed to each other in plan view. Specifically, the region in the sealing-member-side first bonding pattern 321 in plan view is larger than the region in the sealing-member-side second bonding pattern 421 in plan view. In this embodiment, although the region in the sealing-member-side first bonding pattern 321 in plan view is larger than the region in the sealing-member-side second bonding pattern 421 in plan view, the present invention is not limited thereto. The region in the sealing-member-side second bonding pattern 421 in plan view may be larger than the region in the sealing-member-side first bonding pattern 321 in plan view. Since the first connection terminal 431 and the second connection terminal 432 are formed on the second sealing member 4, the region in the sealing-member-side first bonding pattern 321 in plan view is larger than the region in the sealing-member-side second bonding pattern 421 in plan view, accordingly, routing of the wiring pattern (ensuring the conduction path) becomes easy. Thus, the routing region of the wiring pattern (conduction-ensured region) can be increased.

Compared with the resonator-plate-side first bonding pattern 251 and the resonator-plate-side second bonding pattern 252 formed on the crystal resonator plate 2, the sealing-member-side first bonding pattern 321 formed on the first sealing member 3 and the sealing-member-side second bonding pattern 421 formed on the second sealing member 4 each have a large width.

As described above, with the crystal resonator 101 according to this embodiment, it is possible to avoid the generation of gas, and further to reduce in height or in size, in the crystal resonator 101 having the sandwich structure.

In the conventional art, it is necessary to form the metal paste sealing material such as Au—Sn separately, by printing, plating or the like. In this embodiment, the sealing-member-side first bonding pattern 321 is bonded to the resonator-plate-side first bonding pattern 251 by the diffusion bonding, and the sealing-member-side second bonding pattern 421 is bonded to the resonator-plate-side second bonding pattern 252 by the diffusion bonding. There is no need for using separately the metal paste sealing material, thereby, it is possible to contribute to the cost reduction. Furthermore, in this embodiment, the base PVD films 2511, 2521, 3211, 4211, 4311 and 4321 and the electrode PVD films 2512, 2522, 3212 4212, 4312 and 4322 are formed using the PVD method (e.g., a film forming method for patterning in processing such as photolithography) such as vacuum deposition, sputtering, ion plating, molecular beam epitaxy (MBE) and laser ablation. Thus, in contrast to multiple formations of films by the conventional plating, it is possible to form films collectively, which leads to the reduction in producing processes and in cost.

Currently, the package of a piezoelectric resonator device is being downsized. For this reason, it is difficult to print the metal paste sealing material such as Au—Sn while preventing a trouble such as short-circuiting caused by interference of the patterns (electrode patterns) and terminals (electrode terminals) that serve as hetero electrodes. On the other hand, in this embodiment, the resonator-plate-side first and second bonding patterns 251 and 252 and the sealing-member-side first and second bonding patterns 321 and 421 are used, which have the layered structures of the respective base PVD films 2511, 2521, 3211 and 4211, and the respective electrode PVD films 2512, 2522, 3212 and 4212. No metal paste sealing material is used. Thus, it is possible to form patterns while preventing the trouble such as short-circuiting easily caused by the interference of the patterns and terminals that serve as hetero electrodes.

As described above, in the conventional art, the metal paste sealing material such as Au—Sn is separately used. When the bonding is performed using the metal paste sealing material, high-temperature heating is needed to carry out the bonding by heat-melting, which results in the generation of gas at the time of heat-melting. Currently, there has been developed no technique to avoid the generation of gas. Thus, the gas penetration into the internal space is unavoidable when the bonding is carried out by the heat-melting. In contrast, in this embodiment, the sealing-member-side first bonding pattern 321 is bonded to the resonator-plate-side first bonding pattern 251 by the diffusion bonding, and the sealing-member-side second bonding pattern 421 is bonded to the resonator-plate-side second bonding pattern 252 by the diffusion bonding, which suppressing the generation of gas. Thus, it is possible to prevent deterioration of oscillation characteristics due to presence of gas in the internal space 13. Note that, in some cases, the diffusion bonding is performed at a temperature higher than the room temperature (e.g. at 220° C.), however, it is not performed at the high temperature (e.g. not less than 280° C.) that is needed for the bonding by the metal paste sealing material.

In this embodiment, the resonator-plate-side first and second bonding patterns 251 and 252 and the sealing-member-side first and second bonding patterns 321 and 421 have the layered structures of the respective base PVD films 2511, 2521, 3211 and 4211, and the respective electrode PVD films 2512, 2522, 3212 and 4212. Thus, it is possible to reduce the width of the patterns and terminals. As a result, it is possible to avoid the obstacle, which is caused by the routing of the patterns, to the reduction in size of the package. That is, in this embodiment, it is possible to reduce the width of the patterns and terminals, which cannot be realized in the piezoelectric resonator device bonded by the metal paste sealing material such as Au—Sn.

In this embodiment, the sealing-member-side first bonding pattern 321 is bonded to the resonator-plate-side first bonding pattern 251 by the diffusion bonding, and the sealing-member-side second bonding pattern 421 is bonded to the resonator-plate-side second bonding pattern 252 by the diffusion bonding, which does not requires the bonding by the heart-melting at the high temperature. Accordingly, when the crystal resonator 101 is bonded to an external member such as an external circuit by a solder and the like, it is possible to avoid remelting at the bonding part. Also, the bonded state does not change by reflow or under use environment.

The sealing-member-side first bonding pattern 321 is bonded to the resonator-plate-side first bonding pattern 251 by the diffusion bonding at the room temperature, and the sealing-member-side second bonding pattern 421 is bonded to the resonator-plate-side second bonding pattern 252 by the diffusion bonding at the room temperature, which suppressing the generation of gas. Thus, such a configuration is suitable for preventing the deterioration of the oscillation characteristics due to the presence of gas in the internal space 13. Also, it is possible to avoid remelting at the bonding part, and to prevent the bonded state from changing.

The sealing-member-side first bonding pattern 321 is bonded to the resonator-plate-side first bonding pattern 251 by the diffusion bonding at the temperature in the range from the room temperature to the temperature less than 230° C., and the sealing-member-side second bonding pattern 421 is bonded to the resonator-plate-side second bonding pattern 252 by the diffusion bonding at the temperature in the range from the room temperature to the temperature less than 230° C., which suppressing the generation of gas while improving the bonding.

The first excitation electrode 221 and the resonator-plate-side first bonding pattern 251 both formed on the first main surface 211 of the crystal resonator plate 2 have the same thickness, and the surfaces (main surfaces) of the first excitation electrode 221 and the resonator-plate-side first bonding pattern 251 are made of the same metal. The second excitation electrode 222 and the resonator-plate-side second bonding pattern 252 both formed on the second main surface 212 of the crystal resonator plate 2 have the same thickness, and the surfaces (main surfaces) of the second excitation electrode 222 and the resonator-plate-side second bonding pattern 252 are made of the same metal. Thus, the metal films of the first excitation electrode 221 and the resonator-plate-side first bonding pattern 251 can be formed at a time, and the metal films of the second excitation electrode 222 and the resonator-plate-side second bonding pattern 252 can be formed at a time. As a result, it is possible to use the same metal film to the first excitation electrode 221 and the resonator-plate-side first bonding pattern 251, and to use the same metal film to the second excitation electrode 222 and the resonator-plate-side second bonding pattern 252.

In the resonator-plate-side first bonding pattern 251 and the resonator-plate-side second bonding pattern 252, the base PVD film 2511 and 2521 are made of the single material, the electrode PVD films 2512 and 2522 are made of the single material, and the electrode PVD films 2512 and 2522 have the thickness greater than the thickness of the base PVD films 2511 and 2521. Thus, it is possible to prevent the single material of the base PVD films 2511 and 2521 from diffusing into the electrode PVD films 2512 and 2522.

Compared with the base PVD films 2511, 2521, 3211 and 4211 of the resonator-plate-side first bonding pattern 251, the resonator-plate-side second bonding pattern 252, the sealing-member-side first bonding pattern 321 and the sealing-member-side second bonding pattern 421, the base PVD films 4311 and 4321 of the external terminals (the first connection terminal 431 and the second connection terminal 432) have a great thickness. Thus, in order to electrically connect the external terminals (the first connection terminal 431 and the second connection terminal 432) to the outside (e.g., solder-mounting) while stabilizing the bonding of the first sealing member 3, the second sealing member 4 and the crystal resonator plate 2, it is possible to effectively use the base metals (the base PVD films 4311 and 4321 of the first connection terminal 431 and the second connection terminal 432) for electrically connecting to the outside. Note that when the base PVD films 2511, 2521, 3211, 4211, 4311 and 4321 of the resonator-plate-side first bonding pattern 251, the resonator-plate-side second bonding pattern 252, the sealing-member-side first bonding pattern 321, the sealing-member-side second bonding pattern 421 and the external terminals (the first connection terminal 431 and the second connection terminal 432) have the same thickness, it is impossible to electrically connect the external terminals (the first connection terminal 431 and the second connection terminal 432) to the outside (e.g., solder-mounting).

Since Au is contained in the electrode PVD films 2512, 2522, 3212 and 4212, the surfaces of the resonator-plate-side first bonding pattern 251, the resonator-plate-side second bonding pattern 252, the sealing-member-side first bonding pattern 321 and the sealing-member-side second bonding pattern 421 are difficult to oxidize. Thus, an advanced and special preprocessing is not needed before bonding the resonator-plate-side first bonding pattern 251, the resonator-plate-side second bonding pattern 252, the sealing-member-side first bonding pattern 321 and the sealing-member-side second bonding pattern 421. As a result, it is possible to reduce the production cost. Regarding the preprocessing here, the present configuration does not require, for example, an ultra-high vacuum state as the atmosphere environment.

Since the resonator-plate-side first bonding pattern 251, the resonator-plate-side second bonding pattern 252, the sealing-member-side first bonding pattern 321 and the sealing-member-side second bonding pattern 421 do not contain Sn, the high-temperature heating is not needed at the time of bonding, thus there is no trouble (i.e., remelting) caused by the bonding at the high temperature.

Thus, in this embodiment, there is no need for using separately the metal paste sealing material, which contributes to the cost reduction. Furthermore, in this embodiment, the base PVD films 2511, 2521, 3211 and 4211 and the electrode PVD films 2512, 2522, 3212 and 4212 are formed using the PVD method (e.g., a film forming method for patterning in processing such as photolithography) such as vacuum deposition, sputtering, ion plating, molecular beam epitaxy (MBE) and laser ablation, thus it is also possible to reduce the cost.

Because the patterns do not contain Sn (not use Sn), it is possible to reduce the width of the patterns. Thus, it is possible to prevent a trouble such as short-circuiting caused by the interference of the patterns and terminals that serve as hetero electrodes.

When Cr is contained in the base PVD films 2511, 2521, 3211 and 4211, it is suitable for resistance heating vapor deposition.

The first sealing member 3 and the second sealing member 4 are each made of an insulating (brittle) material having the flexural rigidity (moment of inertia of area×Young's modulus) of not more than 1000 [N·mm$^2$] so as to satisfy a deformation required for bonding. For this reason, it is possible to perform the diffusion bonding conditional on the flexural rigidity in the above-described range. It is not necessary, for example, to form the surfaces of the electrodes such as the first excitation electrode 221 and the second excitation electrode 222 so as to have the surface roughness (Ra) of not more than 1 nm necessary for the normal bonding.

The sealing-member-side first bonding pattern 321 is bonded to the resonator-plate-side first bonding pattern 251 by the pressurized diffusion bonding, and the sealing-member-side second bonding pattern 421 is bonded to the resonator-plate-side second bonding pattern 252 by the pressurized diffusion bonding, not using separately the special bonding material. Thus, it is possible to contribute to the reduction in size, especially in height. When using the special bonding material, the reduction in height is limited. In the present configuration, it is possible to reduce the height beyond the above limit.

The thickness of the bonding pattern made by the diffusion bonding of the sealing-member-side first bonding pattern 321 and the resonator-plate-side first bonding pattern 251 is the same as the thickness of the bonding pattern made by the diffusion bonding of the sealing-member-side second bonding pattern 421 and the resonator-plate-side second bonding pattern 252, and is different from the thickness of the external terminals (the first connection terminal 431 and the second connection terminal 432) that are electrically connected to the outside. Thus, it is possible to reliably prevent the base PVD films 2511, 2521, 3211 and 4211 from diffusing at the time of the diffusion bonding, and furthermore, it is possible to improve the bonding strength of the base PVD films 2511, 2521, 3211 and 4211 to the crystal resonator plate 2, the first sealing member 3 and the second sealing member 4. In addition, in order to electrically connect the external terminals (the first connection terminal 431 and the second connection terminal 432) to the outside (e.g., solder-mounting), it is possible to effectively use the base PVD films 4311 and 4321 for electrically connecting to the outside.

In the second sealing member 4, the through holes (the second through hole 441 and the third through hole 442) are formed so as to be disposed in the outward position of the internal space 13. Thus, the through holes (the second through hole 441 and the third through hole 442) do not affect the internal space 13, accordingly, it is possible to avoid poor hermeticity caused by the through holes (the second through hole 441 and the third through hole 442), compared with the configuration in which the through holes (the second through hole 441 and the third through hole 442) are disposed in the inward position of the internal space 13.

Unlike this embodiment, when the through holes are disposed in the internal space, it is necessary to ensure the hermeticity of the internal space, thus, it is necessary to add a process to fill the through holes in the internal space with a metal and the like. In contrast, in this embodiment, since the through holes (the second through hole 441 and the third through hole 442) are formed in the outward position of the internal space 13, routing of the wiring pattern can be made in the same process as the pattern formation of the resonator-plate-side first bonding pattern 251, the resonator-plate-side second bonding pattern 252, the sealing-member-side first bonding pattern 321 and the sealing-member-side second bonding pattern 421. Thus, it is possible to reduce the production cost.

Since the sealing-member-side first bonding pattern 321 and the sealing-member-side second bonding pattern 421 are not superimposed to each other in plan view, it is possible to prevent generation of stray capacitance by the sealing-member-side first bonding pattern 321 and the sealing-member-side second bonding pattern 421.

According to the reduction in package size, the width of the bonding pattern of the resonator-plate-side first bonding pattern 251 and the resonator-plate-side second bonding pattern 252 becomes smaller. In particular, since it is possible to prevent coupling with an unnecessary oscillation mode by ensuring an oscillation region as large as possible, reducing the width of the bonding pattern is desired. On the other hand, since size restriction to the first sealing member 3 and the second sealing member 4 is loose compared with the vibrating part 23, the width of the bonding pattern of the sealing-member-side first bonding pattern 321 and the sealing-member-side second bonding pattern 421 can be large, which results in a high degree of freedom in accurate positioning at the time of bonding.

In this embodiment, there is no variation in the height of the package of the crystal resonator 101. For example, unlike this embodiment, if using the metal paste sealing material such as an Sn-containing bonding material that makes a gap of more than 1 μm between the crystal resonator plate 2 and the sealing members (the first sealing member 3 and the second sealing member 4 in this embodiment), the variation in height occurs when the metal paste sealing material is formed on the patterns (the resonator-plate-side first bonding pattern 251, the resonator-plate-side second bonding pattern 252, the sealing-member-side first bonding pattern 321 and the sealing-member-side second bonding pattern 421). Also, after bonding, due to heat capacity distribution in the formed patterns (the resonator-plate-side first bonding pattern 251, the resonator-plate-side second bonding pattern 252, the sealing-member-side first bonding pattern 321 and the sealing-member-side second bonding pattern 421), the even gaps (the gap between the first sealing member 3 and the crystal resonator plate 2 of this embodiment and the gap between the second sealing member 4 and the crystal resonator plate 2 of this embodiment) are not formed. Therefore, in the conventional art, when three members (i.e., the first sealing member, the second sealing member and the piezoelectric resonator plate) are laminated, the respective gaps between the members are different. As a result, the laminated three members are bonded in a state in which they are not parallel to each other. This problem becomes remarkable according to the reduction in package height. In this embodiment, since the upper limit of the gap is set to 1.00 μm, the three members (i.e., the first sealing member 3, the second sealing member 4 and the crystal resonator plate 2) can be laminated and bonded in a state in which they are parallel to each other, thus, this embodiment can be adaptable to the height reduction.

In this embodiment, the first sealing member 3 and the second sealing member 4 are made of glass, however, the present invention is not limited thereto. They may be made of crystal.

In this embodiment, the piezoelectric resonator plate is made of crystal, however, the present invention is not limited thereto. It may be made of another material such as lithium niobate and lithium tantalate, i.e., a piezoelectric material.

In this embodiment, the bonding material 11 is made of Ti (or Cr) and Au, however, the present invention is not limited thereto. The bonding material 11 may be made, for example, of Ni and Au.

In this embodiment, the resonator-plate-side first bonding pattern 251, the resonator-plate-side second bonding pattern 252, the sealing-member-side first bonding pattern 321 and the sealing-member-side second bonding pattern 421 contain Ti (or Cr) and Au. However, the present invention is not limited thereto. They may contain Cu (a single Cu or a Cu alloy), which can contribute to stress relaxation at the time of producing (e.g. when bonding or when the device is shocked due to an external force by, for example, pressurizing) or at the time of using (e.g. when solder-mounting is performed or when the device is shocked by an external force such as falling shock). That is, if the resonator-plate-side first bonding pattern 251, the resonator-plate-side second bonding pattern 252, the sealing-member-side first bonding pattern 321 and the sealing-member-side second bonding pattern 421 contain Cu, the mechanical strength is improved.

Also, if Cr is contained in the base PVD films 2511, 2521, 3211 and 4211, it is possible to prevent Cr from diffusing into the electrode PVD films 2512, 2522, 3212 and 4212 because of Cu contained in the base PVD films 2511, 2521, 3211 and 4211. As a result, even when the layer using Cr is made thick, it is possible to prevent Cr from diffusing into the electrode PVD films 2512, 2522, 3212 and 4212, thus thickening the Cr layer results in suppression of the production variation. Specifically, even when the Cr layer has a thickness of 0.2 μm, it is possible to prevent Cr from diffusing into the electrode PVD films 2512, 2522, 3212 and 4212.

In this embodiment, the second sealing member 4 is a substrate having a rectangular parallelepiped shape that is made of a single glass wafer. However, the present invention is not limited thereto. It may be two rectangular parallelepiped substrates each made of a glass wafer. In this case, the sealing-member-side second bonding pattern 421, the third through hole 442 and the second connection terminal 432 are formed on the one rectangular parallelepiped substrate for hermetically sealing, and the second through hole 441 and the first connection terminal 431 are formed on the other rectangular parallelepiped substrate. In such a configuration, it is possible to separate the pair of external terminals (the first connection terminal 431 and the second connection terminal 432) completely from each other, thus preventing the short-circuiting. Also, if the second sealing member 4 is made up of the two rectangular parallelepiped substrates made of a metal material, not the glass wafer, there is no need for further forming the third through hole 442. Thus, reducing the number of the through holes results in the reduction in size.

In this embodiment, the first extraction electrode 223 and the second extraction electrode 224 are formed as shown in FIGS. 1 to 7. However, the present invention is not limited thereto. Cr may be used as the uppermost layer on respective arbitrary positions of the first extraction electrode 223 and the second extraction electrode 224, and a gap may exist between the first extraction electrode 223 and the resonator-plate-side first bonding pattern 251, and between the second extraction electrode 224 and the resonator-plate-side second bonding pattern 252. Preferably, the gap is disposed on the resonator-plate-side sealing part 25. In such a configuration, the first extraction electrode 223 is not electrically connected to the resonator-plate-side first bonding pattern 251, and the second extraction electrode 224 is not electrically connected to the resonator-plate-side second bonding pattern 252, before bonding by the heat-melting in the production process. As a result, it is possible to perform various inspections for only the excitation electrodes (the first excitation electrode 221 and the second excitation electrode 222) in the vibration inspection process, which results in a high degree of freedom in the vibration inspections.

—Second Embodiment of Crystal Resonator—

Next, the second embodiment of the crystal resonator will be described. For the sake of convenience, the common configuration with the crystal resonator of the first embodiment will be described with reference to the same drawings indicated in the first embodiment and referring to the same reference numerals.

Figure 8:
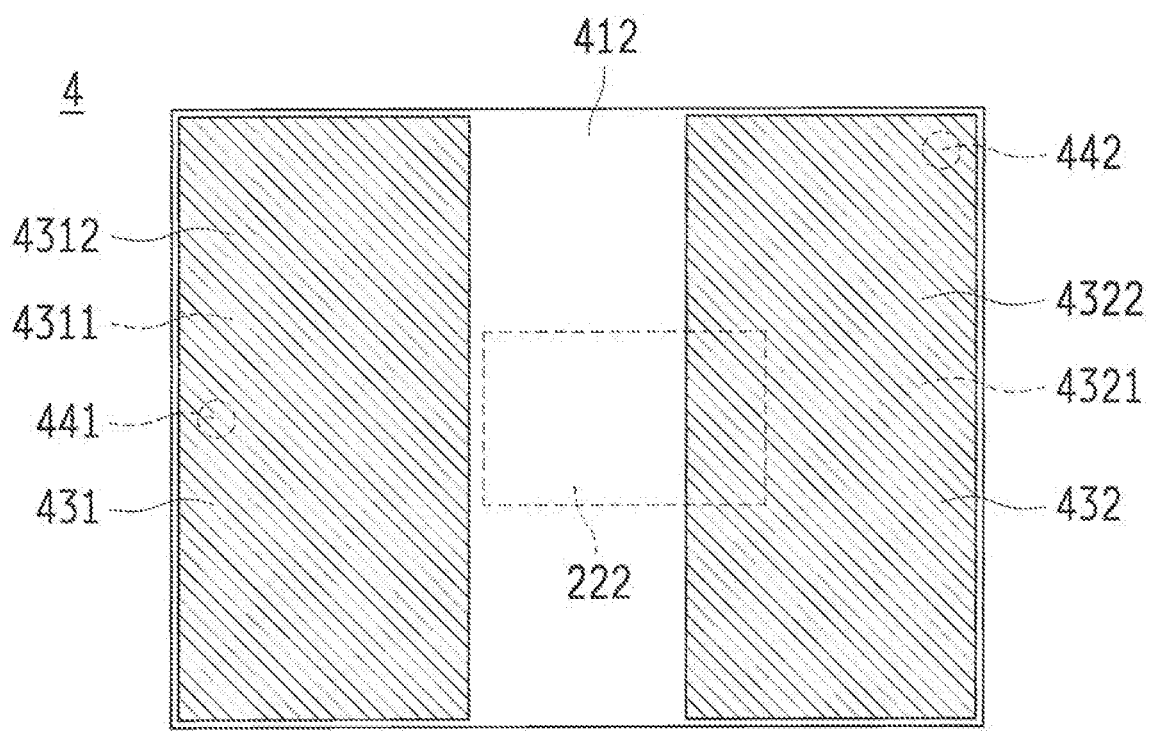
FIG. 8 is a diagram of the crystal resonator according to a second embodiment of the present invention, which illustrates a superimposed relationship of a second excitation electrode, a first connection terminal and a second connection terminal.

In the crystal resonator 101 of this embodiment, the resonator-plate-side first bonding pattern 251 is connected to the first excitation electrode 221 and the resonator-plate-side second bonding pattern 252 is connected to the second excitation electrode 222. As shown in FIG. 8, the second excitation electrode 222 is superimposed to the second connection terminal 432, and not superimposed to the first connection terminal 431. Also, as shown in FIGS. 1 and 3 to 6, the internal space 13 of the crystal resonator 101 produced here is located so as to be deflected to the left side in plan view.

In the second sealing member 4, through holes (the second through hole 441 and the third through hole 442) are formed so as to be disposed in the outward position of the internal space 13. They (i.e., the second through hole 441 and the third through hole 442) are not formed in the inward position of the internal space 13.

As described above, in this embodiment, it is possible to prevent generation of stray capacitance, although the excitation electrode is supersimposed to the external terminal (i.e., the second excitation electrode 222 is superimposed to the second connection terminal 432 in this embodiment) in the crystal resonator 101 having the sandwich structure.

Specifically, the resonator-plate-side first bonding pattern 251 is connected to the first excitation electrode 221. The resonator-plate-side second bonding pattern 252 is connected to the second excitation electrode 222. The second excitation electrode 222 is superimposed to the second connection terminal 432 but not superimposed to the first connection terminal 431. Thus, even when the second excitation electrode 222 is superimposed to the homopolar second connection terminal 432, the stray capacitance is not generated. Furthermore, it is possible to reduce the size of the crystal resonator 101 having the sandwich structure while avoiding the stray capacitance generated by the superimposition of the second excitation electrode 222 to the heteropolar first connection terminal 431.

In the second sealing member 4, the through holes (the second through hole 441 and the third through hole 442) are formed so as to be disposed in the outward position of the internal space 13. Thus, the second through hole 441 and the third through hole 442 do not affect the internal space 13, accordingly, it is possible to avoid poor hermeticity caused by the second through hole 441 and the third through hole 442, compared with the configuration in which the second through hole 441 and the third through hole 442 are disposed in the inward position of the internal space 13.

Unlike this embodiment, when the through holes are disposed in the internal space, it is necessary to ensure the hermeticity of the internal space, thus, it is necessary to add a process to fill the through holes in the internal space with a metal and the like. In contrast, in this embodiment, since the through holes (the second through hole 441 and the third through hole 442) are formed in the outward position of the internal space 13, routing of the wiring pattern can be made in the same process as the formation of the resonator-plate-side first bonding pattern 251, the resonator-plate-side second bonding pattern 252, the sealing-member-side first bonding pattern 321 and the sealing-member-side second bonding pattern 421. Thus, it is possible to reduce the production cost.

Since the internal space 13 is located so as to be deflected to one end side in plan view (to the left side in plan view in this embodiment), it is easy to form the through hole (the second through hole 441) and the electrode pattern on the other end side in plan view (on the right side in plan view in this embodiment), thus, it is easy to form the electrode patterns that may affect the first excitation electrode 221 and the second excitation electrode 222 disposed in the internal space 13. Also, it is easy to dispose the through holes (the second through hole 441 and the third through hole 442) that may affect the hermeticity of the internal space 13.

On the first sealing member 3, the sealing-member-side first bonding pattern 321 having the same width at all positions is formed. On the second sealing member 4, the sealing-member-side second bonding pattern 421 having the same width at all positions is formed. In the second sealing member 4, the thorough holes (the second through hole 441 and the third through hole 442) are formed so as to be located in the outward position of the internal space 13. Thus, it is possible to prevent the bonding material 11 from flowing toward the pattern having a larger width due to difference in the width of the pattern. As a result, it is possible to stabilize the bonded state of the first sealing member 3 and the second sealing member 4 to the crystal resonator plate 2. Furthermore, in the second sealing member 4, since the through holes (the second through hole 441 and the third through hole 442) are formed so as to be located in the outward position of the internal space 13, the through holes (the second through hole 441 and the third through hole 442) do not affect the internal space 13. Thus, compared with the configuration in which the through holes (the second through hole 441 and the third through hole 442) are disposed in the inward position of the internal space 13, it is possible to avoid the poor hermeticity caused by the through holes (the second through hole 441 and the third through hole 442).

Figure 9:
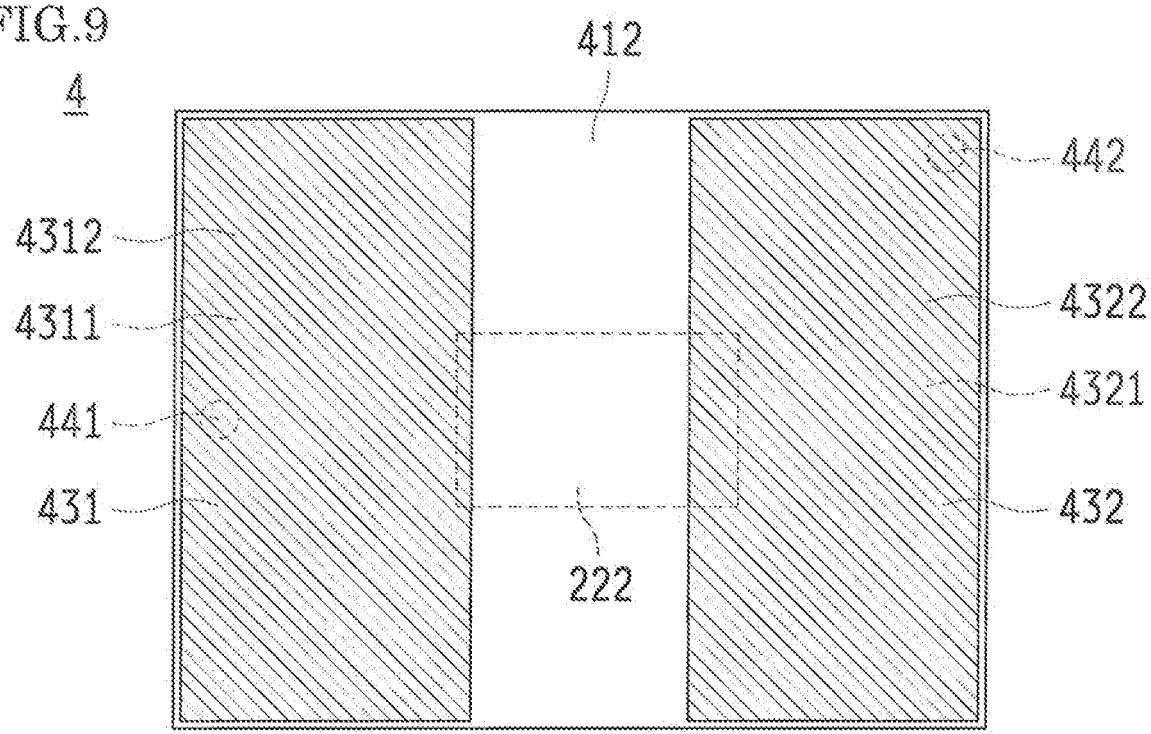
FIG. 9 is a schematic rear view of a variation of the second sealing member of the crystal resonator according to the second embodiment of the present invention, which illustrates the superimposed relationship of the second excitation electrode, the first connection terminal and the second connection terminal.

In this embodiment, as shown in FIG. 8, the second excitation electrode 222 is superimposed to the second connection terminal 432 and not superimposed to the first connection terminal 431. However, the present invention is not limited thereto. As shown in FIG. 9, the second excitation electrode 222 may be superimposed to the first connection terminal 431 and the second connection terminal 432.

Specifically, similarly to the above-described embodiment, the resonator-plate-side first bonding pattern 251 is directly connected to the first excitation electrode 221, and the resonator-plate-side second bonding pattern 252 is directly connected to the second excitation electrode 222. In such a configuration, as shown in FIG. 9, the second excitation electrode 222 is superimposed to the first connection terminal 431 and the second connection terminal 432. In the second excitation electrode 222, the region superimposed to the first connection terminal 431 is smaller than the region superimposed to the second connection terminal 432.

As described above, in the crystal resonator 101 according to another aspect of this embodiment as shown in FIG. 9, it is possible to prevent the generation of the stray capacitance, although the excitation electrode is superimposed to the external terminal in the crystal resonator 101 having the sandwich structure.

Specifically, as shown in FIG. 9, the resonator-plate-side first bonding pattern 251 is connected to the first excitation electrode 221 and the resonator-plate-side second bonding pattern 252 is connected to the second excitation electrode 222. The second excitation electrode 222 is superimposed to the first connection terminal 431 and the second connection terminal 432, and in the second excitation electrode 222, the region superimposed to the first connection terminal 431 is smaller than the region superimposed to the second connection terminal 432. Thus, even when the second excitation electrode 222 is superimposed to the homopolar second connection terminal 432, the stray capacitance is not generated. Furthermore, it is possible to reduce the size of the crystal resonator 101 having the sandwich structure while suppressing the stray capacitance generated by the superimposition of the second excitation electrode 222 to the heteropolar first connection terminal 431.

Also, as shown in FIG. 9, the resonator-plate-side first bonding pattern 251 is connected to the first excitation electrode 221 and the resonator-plate-side second bonding pattern 252 is connected to the second excitation electrode 222. The second excitation electrode 222 is superimposed to the first connection terminal 431 and the second connection terminal 432. In the first connection terminal 431, the region superimposed to the second excitation electrode 222 is small. Thus, even when the second excitation electrode 222 is superimposed to the homopolar second connection terminal 432, the stray capacitance is not generated. Furthermore, it is possible to reduce the size of the crystal resonator 101 having the sandwich structure while suppressing the stray capacitance generated by the superimposition of the second excitation electrode 222 to the first connection terminal 431.

—Third Embodiment of Crystal Resonator—

Figure 10:
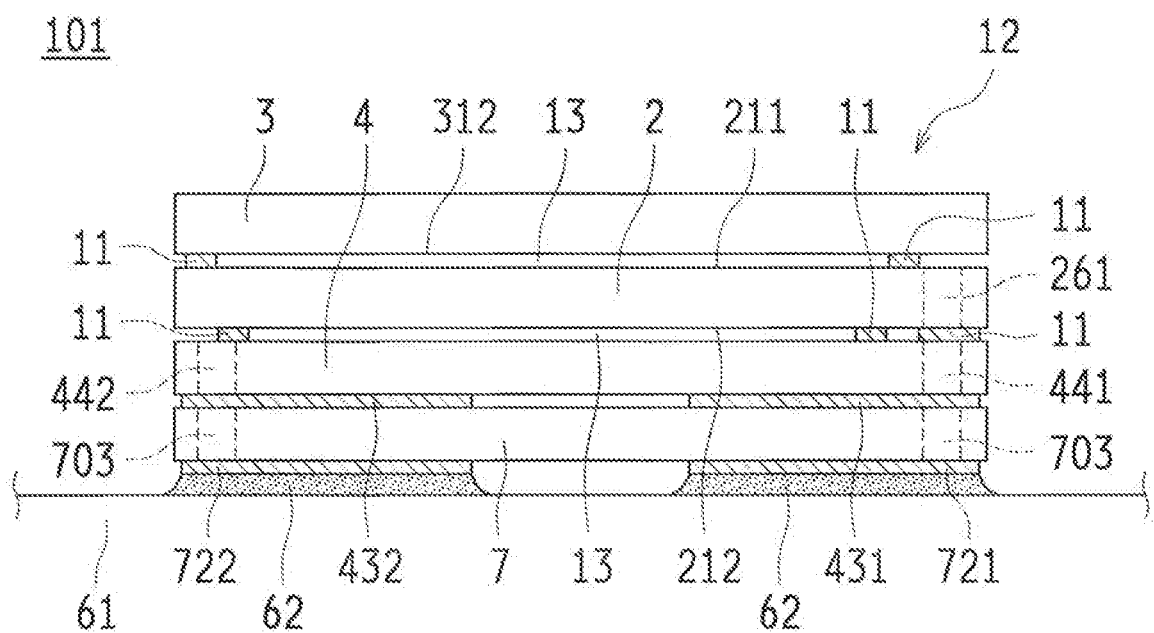
FIG. 10 is a schematic configuration diagram illustrating a configuration of the crystal resonator according to a third embodiment of the present invention.

Next, the third embodiment of the crystal resonator will be described. For the sake of convenience, the common configuration with the crystal resonator of the first embodiment will be described with reference to the same drawings indicated in the first embodiment and with the same reference numerals. The crystal resonator 101 according to this embodiment is electrically connected to a circuit board 61 and serves as a source of oscillation of the circuit board 61. As shown in FIG. 10, the crystal resonator 101 includes: the crystal resonator plate 2 (a piezoelectric resonator plate in the present invention); the first sealing member 3 that covers the first excitation electrode 221 (see FIG. 4) of the crystal resonator plate 2 so as to hermetically seal the first excitation electrode 221 that is formed on the first main surface 211 of the crystal resonator plate 2; and the second sealing member 4 disposed on the second main surface 212 of the crystal resonator plate 2 so as to cover the second excitation electrode 222 (see FIG. 5) of the crystal resonator plate 2, the second sealing member 4 for hermetically sealing the second excitation electrode 222 that makes a pair with the first excitation electrode 221.

In the crystal resonator 101, the crystal resonator plate 2 is bonded to the first sealing member 3, and also the crystal resonator plate 2 is bonded to the second sealing member 4. Thus, the package 12 having the sandwich structure is constituted. The internal space 13 of the package 12 is formed by bonding the first sealing member 3 to the second sealing member 4 via the crystal resonator plate 2. In this internal space 13 of the package 12, the vibrating part 23 is hermetically sealed. The vibrating part 23 includes the first excitation electrode 221 and the second excitation electrode 222 respectively formed on both main surfaces 211 and 212 of the crystal resonator plate 2. As shown in FIG. 10, the internal space 13 is located so as to be deflected to one end side (left side) in plan view of the package 12. A function unit 7 is provided in the package 12 having the sandwich structure, whereby, the function extension type crystal resonator 101 is constituted.

The crystal resonator 101 according to this embodiment has a package size of 1.0×0.8 mm, which is reduced in size and height. According to the size reduction, no castellation is formed in the package 12. The through holes (see the first through hole 261, the second through hole 441 and the third through hole 442) are used for conduction between electrodes.

Next, the configuration of the above-described crystal resonator 101 will be described referring to FIGS. 2, 4 to 6 and 10 to 12. Here, each member constituting the crystal resonator 101 will be described as a single body without bonded.

As shown in FIGS. 4 and 5, the crystal resonator plate 2 is made of a crystal substrate as a piezoelectric material. Both main surfaces (the first main surface 211 and the second main surface 212) are formed as smooth flat surfaces (mirror-finished).

The pair of excitation electrodes (i.e., the excitation electrodes making a pair with each other, that is, the first excitation electrode 221 and the second excitation electrode 222) is formed, respectively, on both main surfaces 211 and 212 (the first main surface 211 and the second main surface 212) of the crystal resonator plate 2. Also, in both main surfaces 211 and 212, the two cut-out parts 24 (each having a penetration shape) are formed so as to surround, in plan view, the pair of first excitation electrode 221 and second excitation electrode 222 (see FIGS. 4 and 5), thus, the vibrating part 23 is formed. The cut-out parts 24 are constituted by the squared U-shaped part 241 in plan view (i.e., a part in plan view made up of three rectangles in plan view: one rectangle; and two rectangles extending from both ends of the one rectangle in the direction perpendicular thereto), and the oblong rectangular shaped part 242 in plan view. A part between the squared U-shaped part 241 in plan view and the oblong rectangular shaped part 242 in plan view serves as the conduction path 213 on which are disposed the extraction electrodes (the first extraction electrode 223 and the second extraction electrode 224) for extracting the first excitation electrode 221 and the second excitation electrode 222 to external terminals (a first external electrode terminal 721 and a second external electrode terminal 722, as described later) of the function unit 7. Regarding electrode patterns, the first extraction electrode 223 and the second extraction electrode 224 extracted respectively from the pair of first excitation electrode 221 and second excitation electrode 222 are electrically connected to the connection terminals (the first connection terminal 431 and the second connection terminal 432) formed on the second sealing member 4, via the resonator-plate-side first bonding pattern 251 and the resonator-plate-side second bonding pattern 252. Then, the connection terminals (the first connection terminal 431 and the second connection terminal 432) are electrically connected to the external terminals (the first external electrode terminal 721 and the second external electrode terminal 722) formed on the function unit 7.

In the crystal resonator plate 2, the respective resonator-plate-side sealing parts 25 for bonding the first sealing member 3 and the second sealing member 4 are provided on outward positions along the vibrating part 23 of both main surfaces 211 and 212, so that the vibrating part 23 is surrounded. As shown in FIGS. 4 and 5, the resonator-plate-side sealing parts 25 are located so as to be deflected to the left side in plan view of both main surfaces 211 and 212.

On the resonator-plate-side sealing part 25 on the first main surface 211 of the crystal resonator plate 2, the resonator-plate-side first bonding pattern 251 is formed to be bonded to the first sealing member 3. The first excitation electrode 221 is connected to the resonator-plate-side first bonding pattern 251. Also, on the resonator-plate-side sealing part 25 on the second main surface 212 of the crystal resonator plate 2, the resonator-plate-side second bonding pattern 252 is formed to be bonded to the second sealing member 4. The second excitation electrode 222 is connected to the resonator-plate-side second bonding pattern 252. The internal space 13 is formed in the inward position (inside) of the resonator-plate-side first bonding pattern 251 and the resonator-plate-side second bonding pattern 252.

The resonator-plate-side first bonding pattern 251, which is formed on the first main surface 211 of the crystal resonator plate 2 so as to be bonded to the first sealing member 3, is constituted by the base PVD film 2511 deposited on the first main surface 211 by the physical vapor deposition, and the electrode PVD film 2512 deposited on the base PVD film 2511 by the physical vapor deposition. Also, the resonator-plate-side second bonding pattern 252, which is formed on the second main surface 212 of the crystal resonator plate 2 so as to be bonded to the second sealing member 4, is constituted by the base PVD film 2521 deposited on the second main surface 212 by the physical vapor deposition, and the electrode PVD film 2522 deposited on the base PVD film 2521 by the physical vapor deposition. Unlike the wet plating such as electroplating and electroless plating, by such films deposited by the physical vapor deposition, it is possible to ensure the hermeticity and to perform the diffusion bonding without the surface roughness.

As described above, the resonator-plate-side first bonding pattern 251 and the resonator-plate-side second bonding pattern 252 have the same configuration in which a plurality of layers is laminated on the resonator-plate-side sealing part 25 of both main surfaces 211 and 212, specifically, a Ti layer (or a Cr layer) and an Au layer are deposited by the vapor deposition in this order from the lowermost layer side. Like this, in the resonator-plate-side first bonding pattern 251 and the resonator-plate-side second bonding pattern 252, the base PVD films 2511 and 2521 are made of a single material (Ti or Cr), the electrode PVD films 2512 and 2522 are made of a single material (Au), and the electrode PVD films 2512 and 2522 have the thickness greater than the thickness of the base PVD films 2511 and 2521. The first excitation electrode 221 and the resonator-plate-side first bonding pattern 251 both formed on the first main surface 211 of the crystal resonator plate 2 have the same thickness, and the surfaces (main surfaces) of the first excitation electrode 221 and the resonator-plate-side first bonding pattern 251 are made of the same metal. The second excitation electrode 222 and the resonator-plate-side second bonding pattern 252 both formed on the second main surface 212 of the crystal resonator plate 2 have the same thickness, and the surfaces (main surfaces) of the second excitation electrode 222 and the resonator-plate-side second bonding pattern 252 are made of the same metal. The resonator-plate-side first bonding pattern 251 and the resonator-plate-side second bonding pattern 252 do not contain Sn. Note that when the resonator-plate-side first and second bonding patterns 251 and 252 are compared with the resonator plate side (first excitation electrode 221 and the second excitation electrode 222) in the configuration in which they have the same thickness and their surfaces are made of the same metal on the same main surface, it is possible to perform bonding even when the kind or thickness of the base metals (the base PVD films 2511 and 2521) differs, under the condition in which the uppermost layers (at least exposed surfaces, i.e., the electrode PVD films 2512 and 2522 and the like) are made of the same metal. The electrode PVD films 2512 and 2522 of the resonator-plate-side first bonding pattern 251 and the resonator-plate-side second bonding pattern 252 have respective scaly surfaces in plan view. Here, being scaly means a dense (or almost dense) state in plan view in which miscroscopically individual pieces of metal due to activation overlap with each other like a straw-mat.

As shown in FIGS. 4 and 5, the crystal resonator plate 2 includes the first through hole 261. The resonator-plate-side first bonding pattern 251 connected to the first excitation electrode 221 is extracted to the side of the second main surface 212 through the first through hole 261. The first through hole 261 is disposed in the outward position of the internal space 13, and located so as to be defected to the other end side (right side) in plan view of both main surfaces 211 and 212, as shown in FIG. 4. Thus, the first through hole 261 is not formed in the inward position of the internal space 13. Here, the inward position of the internal space 13 means strictly the inner side of the inner peripheral surface of the bonding material 11, not including the position on the bonding material 11.

Figure 11:
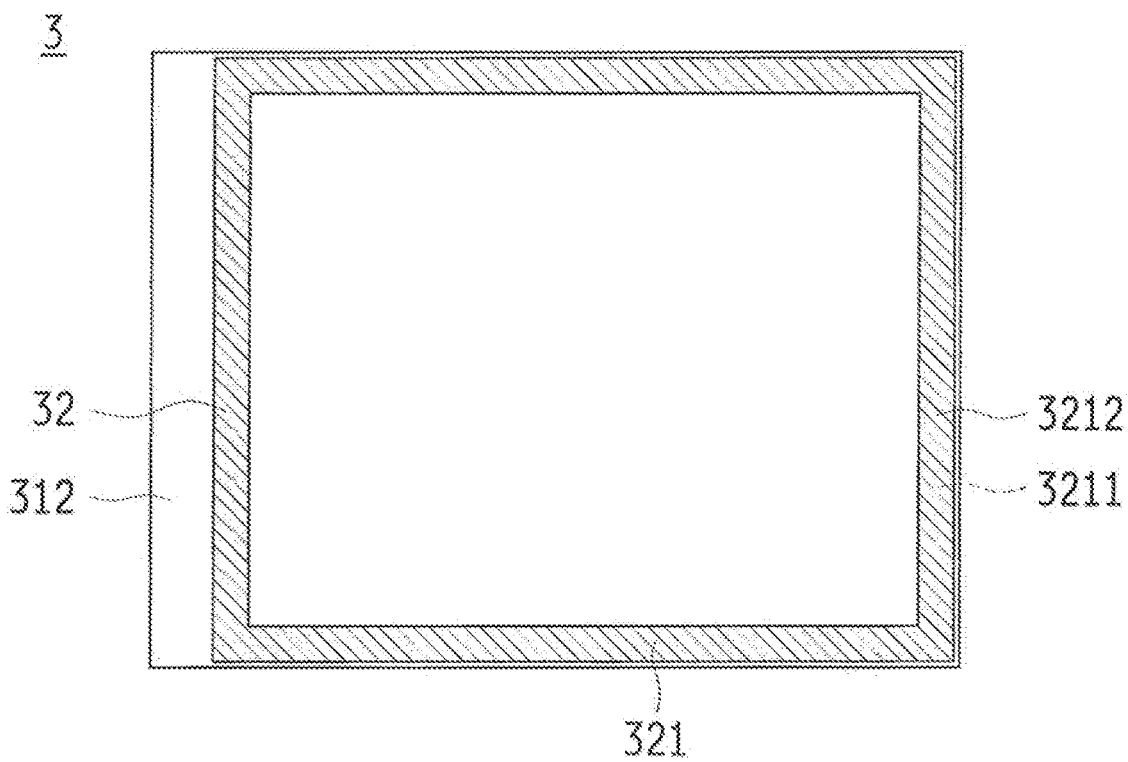
FIG. 11 is a schematic rear view illustrating the first sealing member of the crystal resonator according to the third embodiment of the present invention.

The first sealing member 3 is made of a material having the flexural rigidity (moment of inertia of area×Young's modulus) of not more than 1000 [N·mm$^2$]. Specifically, as shown in FIGS. 2 and 11, the first sealing member 3 is a substrate having a rectangular parallelepiped shape that is made of a single glass wafer. The second main surface 312 (the surface to be bonded to the crystal resonator plate 2) of the first sealing member 3 is formed as a smooth flat surface (mirror finished).

On the second main surface 312 of the first sealing member 3, the sealing-member-side first sealing part 32 is disposed so as to be bonded to the crystal resonator plate 2. As shown in FIG. 11, the sealing-member-side first sealing part 32 is located so as to be deflected to the left side in plan view of the second main surface 312 of the first sealing member 3.

On the sealing-member-side first sealing part 32 of the first sealing member 3, the sealing-member-side first bonding pattern 321 is formed so as to be bonded to the crystal resonator plate 2. The sealing-member-side first bonding pattern 321 has the same width at all positions on the sealing-member-side first sealing part 32 of the first sealing member 3.

The sealing-member-side first bonding pattern 321 is constituted by the base PVD film 3211 deposited on the first sealing member 3 by the physical vapor deposition, and the electrode PVD film 3212 deposited on the base PVD film 3211 by the physical vapor deposition. In this embodiment, the base PVD film 3211 is made of Ti (or Cr), and the electrode PVD film 3212 is made of Au. Also, the sealing-member-side first bonding pattern 321 does not contain Sn. Specifically, the sealing-member-side first bonding pattern 321 is made of a plurality of layers laminated on the sealing-member-side first sealing part 32 of the second main surface 312, that is, a Ti layer (or a Cr layer) and an Au layer are deposited by the vapor deposition in this order from the lowermost layer side. Furthermore, in the sealing-member-side first bonding pattern 321, the electrode PVD film 3212 has a scaly surface in plan view.

The second sealing member 4 is made of a material having the flexural rigidity (moment of inertia of area× Young's modulus) of not more than 1000 [N·mm$^2$]. Specifically, as shown in FIG. 6, the second sealing member 4 is a substrate having a rectangular parallelepiped shape that is made of a single glass wafer. The first main surface 411 (the surface to be bonded to the crystal resonator plate 2) of the second sealing member 4 is formed as a smooth flat surface (mirror finished).

On the first main surface 411 of the second sealing member 4, the sealing-member-side second sealing part 42 is disposed so as to be bonded to the crystal resonator plate 2. As shown in FIG. 6, the sealing-member-side second sealing part 42 is located so as to be deflected to the left side in plan view of the first main surface 411 of the second sealing member 4.

Also, a pair of connection terminals (the first connection terminal 431 and the second connection terminal 432), which is capable of being electrically connected to the function unit (see FIG. 13), is formed on the second main surface 412 (the outer main surface not facing the crystal resonator plate 2) of the second sealing member 4. As described later, on the function unit 7, external terminals (the first external electrode terminal 721 and the second external electrode terminal 722) are formed so as to be directly bonded to the circuit board 61.

Figure 12:
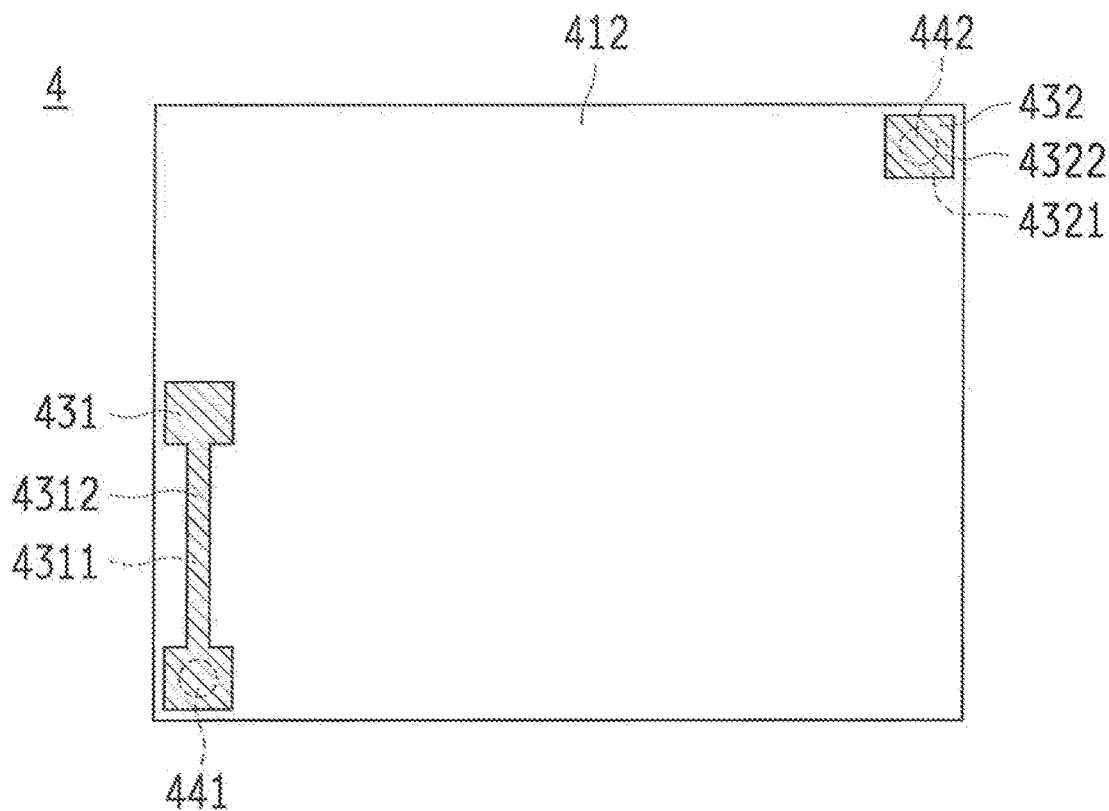
FIG. 12 is a schematic rear view illustrating the second sealing member of the crystal resonator according to the third embodiment of the present invention.
Figure 18:
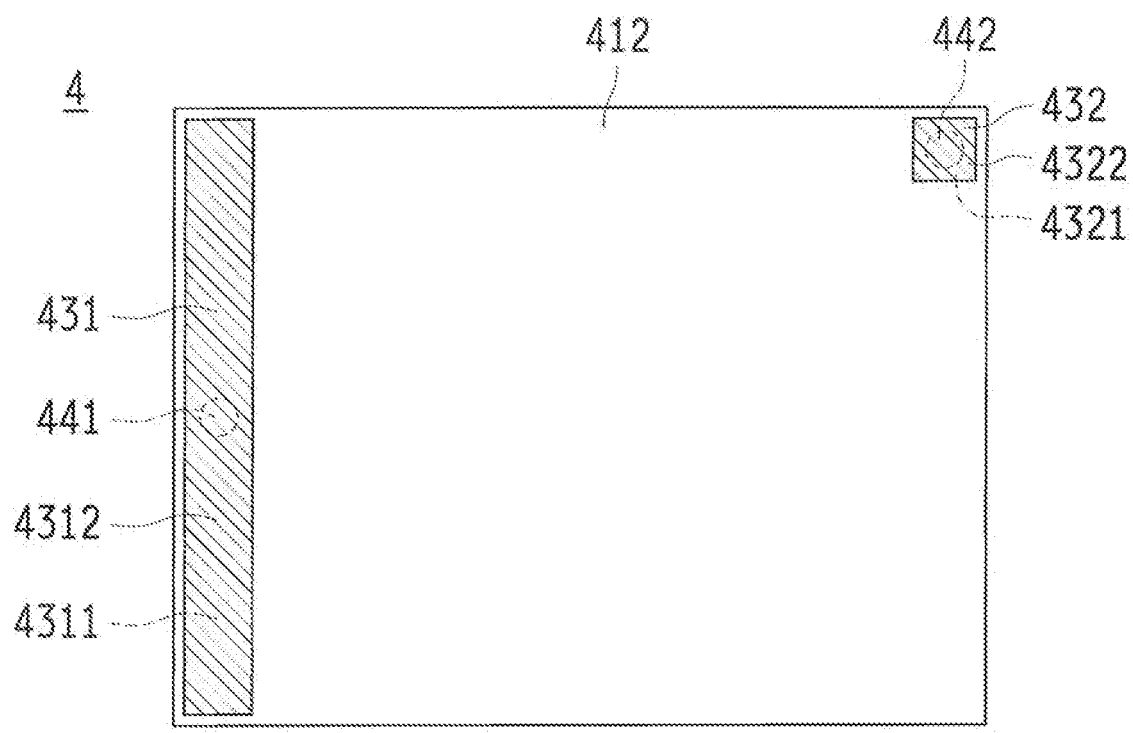
FIG. 18 is a schematic rear view illustrating a variation of the second sealing member of the crystal resonator of the present invention.

The first connection terminal 431 is electrically connected, directly, to the first excitation electrode 221 via the resonator-plate-side first bonding pattern 251. The second connection terminal 432 is electrically connected, directly, to the second excitation electrode 222 via the resonator-plate-side second bonding pattern 252. As shown in FIG. 12, the first connection terminal 431 is located on a part of one end side of the second main surface 412 of the second sealing member 4 in the longitudinal direction in plan view, and the second connection terminal 432 is located at a corner of the other end side. When an inductance part 74 is provided as the function unit 7, as described later, the first connection terminal 431 is disposed along the one end side in the longitudinal direction (i.e., along one short side) in plan view, as shown in FIG. 18. The pair of connection terminals (the first connection terminal 431 and the second connection terminal 432) is constituted by the base PVD films 4311 and 4321 deposited on the second main surface 412 by the physical vapor deposition, and the electrode PVD films 4312 and 4322 deposited on the base PVD films 4311 and 4321 by the physical vapor deposition. The base PVD films 4311 and 4321 of the connection terminals (the first connection terminal 431 and the second connection terminal 432) have the same thickness as the base PVD films 2511, 2521, 3211 and 4211 of the above-described resonator-plate-side first bonding pattern 251, the resonator-plate-side second bonding pattern 252, the sealing-member-side first bonding pattern 321 and the sealing-member-side second bonding pattern 421.

On the sealing-member-side second sealing part 42 of the second sealing member 4, the sealing-member-side second bonding pattern 421 is formed so as to be bonded to the crystal resonator plate 2. The sealing-member-side second bonding pattern 421 has the same width at all positions on the sealing-member-side second sealing part 42 of the second sealing member 4.

The sealing-member-side second bonding pattern 421 is constituted by the base PVD film 4211 deposited on the second sealing member 4 by the physical vapor deposition, and the electrode PVD film 4212 deposited on the base PVD film 4211 by the physical vapor deposition. In this embodiment, the base PVD film 4211 is made of Ti (or Cr), and the electrode PVD film 4212 is made of Au. Also, the sealing-member-side second bonding pattern 421 does not contain Sn. Specifically, the sealing-member-side second bonding pattern 421 is made of a plurality of layers laminated on the sealing-member-side second sealing part 42 of the second main surface 412, that is, a Ti layer (or a Cr layer) and an Au layer are deposited by the vapor deposition in this order from the lowermost layer side. Furthermore, in the sealing-member-side second bonding pattern 421, the electrode PVD film 4212 has a scaly surface in plan view.

In the second sealing member 4, as shown in FIGS. 6, 10 and 12, two through holes (the second through hole 441 and the third through hole 442) are formed. The second through hole 441 and the third through hole 442 are disposed in the outward position of the internal space 13. As shown in FIGS. 6 and 12, the second through hole 441 is located so as to be defected to the right side in plan view of both main surfaces (the first main surface 411 and the second main surface 412) and the third through hole 442 is located on the upper left side in plan view. The second through hole 441 and the third through hole 442 are not formed in the inward position of the internal space 13. Here, the inward position of the internal space 13 means strictly the inner side of the inner peripheral surface of the bonding material 11, not including the position on the bonding material 11. Thus, the first connection terminal 431 is conducted to the resonator-plate-side first bonding pattern 251 that is connected to the first excitation electrode 221 of the crystal resonator plate 2, via the first through hole 261 of the crystal resonator plate 2 and the second through hole 441. Also, the second connection terminal 432 is conducted to the resonator-plate-side second bonding pattern 252 that is connected to the second excitation electrode 222 of the crystal resonator plate 2, via the third through hole 442 and the sealing-member-side second bonding pattern 421.

In the crystal resonator 101 having the above configuration, the crystal resonator plate 2 and the first sealing member 3 are subjected to the diffusion bonding in a state in which the resonator-plate-side first bonding pattern 251 and the sealing-member-side first bonding pattern 321 are overlapped with each other, and the crystal resonator plate 2 and the second sealing member 4 are subjected to the diffusion bonding in a state in which the resonator-plate-side second bonding pattern 252 and the sealing-member-side second bonding pattern 421 are overlapped with each other, thus, the package 12 having the sandwich structure is produced. In contrast to the conventional art, no special bonding material, such as an adhesive, is needed separately. The package 12 having the sandwich structure is in a state capable of distribution. The resonator-plate-side first bonding pattern 251 and the sealing-member-side first bonding pattern 321 themselves become the bonding material 11 formed upon the diffusion bonding. The resonator-plate-side second bonding pattern 252 and the sealing-member-side second bonding pattern 421 themselves become the bonding material 11 formed upon the diffusion bonding. In this embodiment, the diffusion bonding is performed at the room temperature. Here, the room temperature means the temperature in the range from 5 to 35° C. Advantageous effects as described later (suppression of generation of gas and improvement of bonding) are obtained by the diffusion bonding at the room temperature, which is lower than the melting point of 183° C. of the eutectic solder. Thus, this is a preferable embodiment. However, the advantageous effects described later can be obtained by the diffusion bonding performed at temperatures other than the room temperature. That is, the diffusion bonding may be performed at the temperature in the range from the room temperature to the temperature less than 230° C. In particular, when the diffusion bonding is performed at the temperature in the range from 200° C. to less than 230° C., which is less than the melting point of 230° C. of the Pb-free solder and furthermore not less than the recrystallization temperature (200° C.) of Au, it is possible to stabilize an unstable region of the bonding part. Also, in this embodiment, since the special bonding material such as Au—Sn is not used, the gas such as plating gas, binder gas and metal gas is not generated. Thus, the temperature can be equal to or more than the recrystallization temperature of Au.

As described above, in the package 12 produced here, the sealing-member-side first bonding pattern 321 is bonded to the resonator-plate-side first bonding pattern 251, and the sealing-member-side second bonding pattern 421 is bonded to the resonator-plate-side second bonding pattern 252, both by the diffusion bonding. Other than the above bonding, the sealing-member-side first bonding pattern 321 may be bonded to the resonator-plate-side first bonding pattern 251 by the pressurized diffusion bonding, and the sealing-member-side second bonding pattern 421 may be bonded to the resonator-plate-side second bonding pattern 252 by the pressurized diffusion bonding. In this case, it is possible to easily ensure the bonding part (to increase substantially the bonding area) due to pressurizing, accordingly, the bonding by only the diffusion bonding can be performed more suitably without the high-temperature heating.

Also, in the package 12 produced here, the first sealing member 3 and the crystal resonator plate 2 have a gap of not more than 1.00 µm. The second sealing member 4 and the crystal resonator plate 2 have a gap of not more than 1.00 µm. That is, the thickness of the bonding material 11 between the first sealing member 3 and the crystal resonator plate 2 is not more than 1.00 µm, and the thickness of the bonding material 11 between the second sealing member 4 and the crystal resonator plate 2 is not more than 1.00 µm (specifically, the thickness in the Au—Au bonding of this embodiment is 0.15 to 1.00 µm). As a comparative example, the conventional metal paste sealing material containing Sn has a thickness of 5 to 20 µm.

As shown in FIGS. 2, 4 to 6 and 10 to 12, in the package 12 produced here, the internal space 13 is located so as to be deflected to the left side in plan view. Also, the sealing-member-side first bonding pattern 321 formed on the first sealing member 3 (see FIG. 11) and the sealing-member-side second bonding pattern 421 formed on the second sealing member 4 (see FIG. 6) are not superimposed to each other in plan view. Specifically, the region in the sealing-member-side first bonding pattern 321 in plan view is larger than the region in the sealing-member-side second bonding pattern 421 in plan view. In this embodiment, although the region in the sealing-member-side first bonding pattern 321 in plan view is larger than the region in the sealing-member-side second bonding pattern 421 in plan view, the present invention is not limited thereto. The region in the sealing-member-side second bonding pattern 421 in plan view may be larger than the region in the sealing-member-side first bonding pattern 321 in plan view. Since the first connection terminal 431 and the second connection terminal 432 are formed on the second sealing member 4, the region in the sealing-member-side first bonding pattern 321 in plan view is larger than the region in the sealing-member-side second bonding pattern 421 in plan view, accordingly, routing of the wiring pattern (ensuring the conduction path) becomes easy. Thus, the routing region of the wiring pattern (conduction-ensured region) can be increased.

Compared with the resonator-plate-side first bonding pattern 251 and the resonator-plate-side second bonding pattern 252 formed on the crystal resonator plate 2, the sealing-member-side first bonding pattern 321 formed on the first sealing member 3 and the sealing-member-side second bonding pattern 421 formed on the second sealing member 4 each have a large width.

In this embodiment, the function unit 7 (see FIG. 13) is provided on the package 12 produced as described above. On the function unit 7, the external terminals to be directly bonded to the circuit board 61 are formed. Thus, the crystal resonator 101 for various purposes (the function extension type crystal resonator 101) is produced. Specifically, the second sealing member 4 and the function unit 7 are subjected to the diffusion bonding in a state in which the connection terminals (the first connection terminal 431 and the second connection terminal 432) are overlapped with respective internal electrode terminals (a first internal electrode terminal 711 and a second internal electrode terminal 712), so that the function extension type crystal resonator 101 is produced. Then, as shown in FIG. 10, the function extension type crystal resonator 101 is directly bonded and electrically connected to the circuit board 61 using a flowable conductive bonding material 62. In the function extension type crystal resonator 101 produced here, the second sealing member 4 and the function unit 7 have a gap of not more than 1.00 µm (specifically, the gap in the Au—Au bonding of this embodiment is 0.15 to 1.00 µm). As a comparative example, the conventional metal paste sealing material containing Sn has a thickness of 5 to 20 µm.

Figure 13:
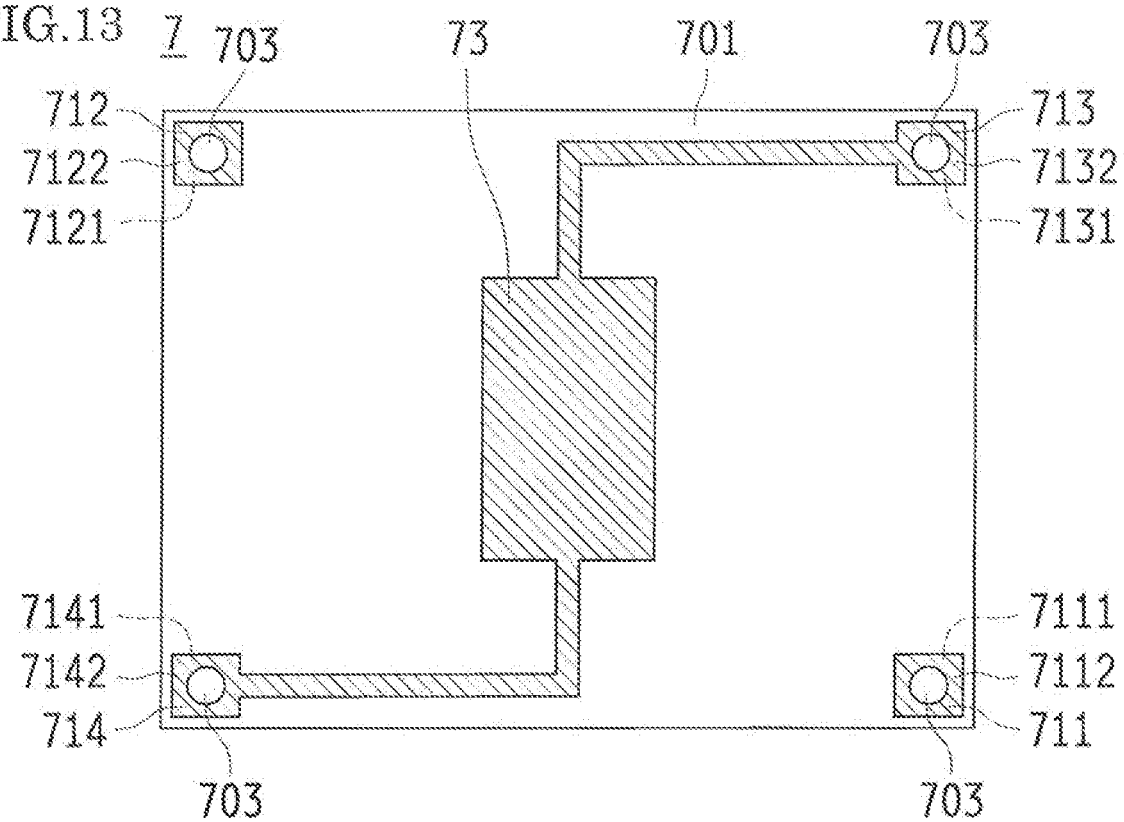
FIG. 13 is a schematic plan view illustrating a function unit of the crystal resonator of the present invention.

As shown in FIG. 13, a first main surface 701 (an inner main surface facing the vibrating part 23) of the function unit 7 includes: the internal electrode terminals (the first internal electrode terminal 711 and the second internal electrode terminal 712) that are directly bonded to the connection terminals (the first connection terminal 431 and the second connection terminal 432) formed on the second sealing member 4 and that are electrically connected to the second sealing member 4; and internal electrode terminals (a third internal electrode terminal 713 and a fourth internal electrode terminal 714) electrically connected to an element as described later. The first internal electrode terminal 711 is electrically connected, directly, to the first connection terminal 431, and the second internal electrode terminal 712 is electrically connected, directly, to the second connection terminal 432. The internal electrode terminals (the first internal electrode terminal 711, the second internal electrode terminal 712, the third internal electrode terminal 713 and the fourth internal electrode terminal 714) are constituted by base PVD films 7111, 7121, 7131 and 7141 deposited on the first main surface 701 by the physical vapor deposition, and electrode PVD films 7112, 7122, 7132 and 7142 deposited on the base PVD films 7111, 7121, 7131 and 7141 by the physical vapor deposition. The base PVD films 7111, 7121, 7131 and 7141 of the internal electrode terminals (the first internal electrode terminal 711, the second internal electrode terminal 712, the third internal electrode terminal 713 and the fourth internal electrode terminal 714) have the same thickness as the base PVD films 2511, 2521, 3211, 4211, 4311 and 4321 of the above-described resonator-plate-side first bonding pattern 251, the resonator-plate-side second bonding pattern 252, the sealing-member-side first bonding pattern 321, the sealing-member-side second bonding pattern 421 and the connection terminals (the first connection terminal 431 and the second connection terminal 432).

Figure 14:
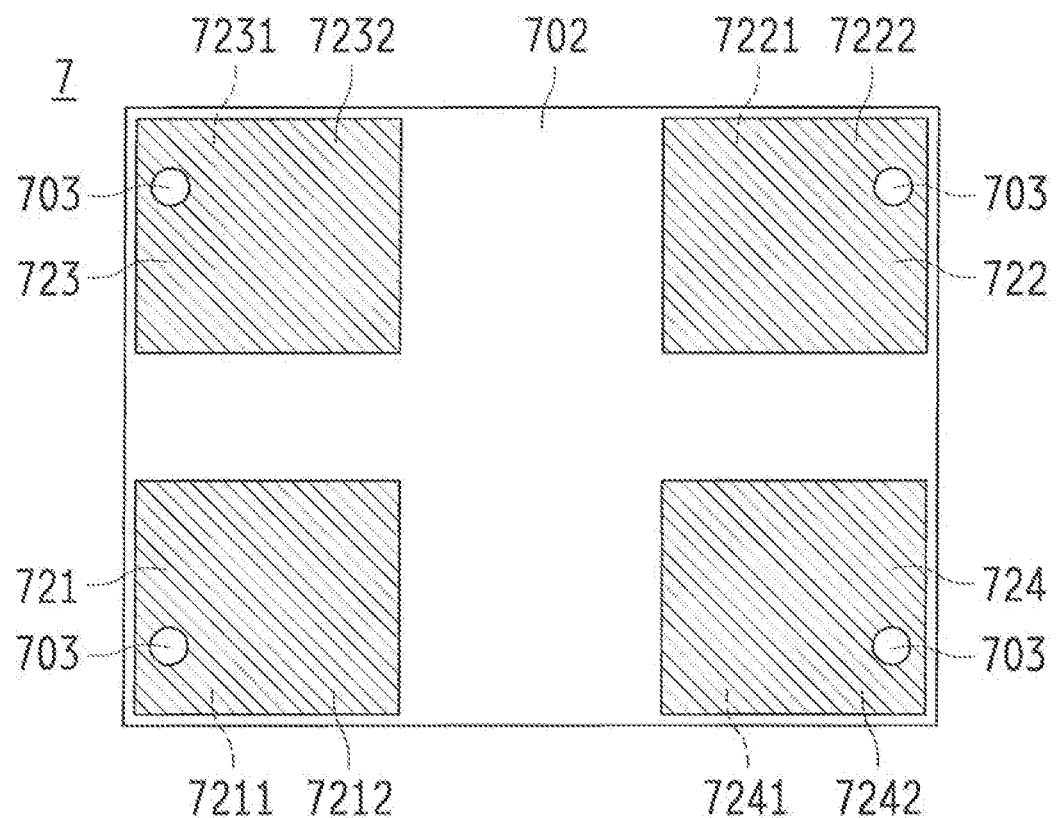
FIG. 14 is a schematic rear view illustrating the function unit of the crystal resonator of the present invention.

As shown in FIG. 14, a second main surface 702 (an outer main surface not facing the vibrating part 23) of the function unit 7 includes external terminals (the first external electrode terminal 721, the second external electrode terminal 722, a third external electrode terminal 723 and a fourth external electrode terminal 724) that are directly bonded and electrically connected to the circuit board 61. The external terminals (the first external electrode terminal 721, the second external electrode terminal 722, the third external electrode terminal 723 and the fourth external electrode terminal 724) are electrically connected, directly, to the internal electrode terminals (the first internal electrode terminal 711, the second internal electrode terminal 712, the third internal electrode terminal 713 and the fourth internal electrode terminal 714), through function part through holes 703. The external terminals (the first external electrode terminal 721, the second external electrode terminal 722, the third external electrode terminal 723 and the fourth external electrode terminal 724) are constituted by base PVD films 7211, 7221, 7231 and 7241 deposited on the second main surface 702 by the physical vapor deposition, and electrode PVD films 7212, 7222, 7232 and 7242 deposited on the base PVD films 7211, 7221, 7231 and 7241 by the physical vapor deposition. Compared with the base PVD films 2511, 2521, 3211, 4211, 4311 and 4321 of the above-described resonator-plate-side first bonding pattern 251, the resonator-plate-side second bonding pattern 252, the sealing-member-side first bonding pattern 321, the sealing-member-side second bonding pattern 421 and the connection terminals (the first connection terminal 431 and the second connection terminal 432), the base PVD films 7211, 7221, 7231 and 7241 of the external terminals (the first external electrode terminal 721, the second external electrode terminal 722, the third external electrode terminal 723 and the fourth external electrode terminal 724) have a great thickness.

In the package 12, the thickness of the bonding pattern made by the diffusion bonding of the sealing-member-side first bonding pattern 321 and the resonator-plate-side first bonding pattern 251 is the same as the thickness of the bonding pattern made by the diffusion bonding of the sealing-member-side second bonding pattern 421 and the resonator-plate-side second bonding pattern 252, and is different from the thickness of the external terminals (the first external electrode terminal 721, the second external electrode terminal 722, the third external electrode terminal 723 and the fourth external electrode terminal 724) that are electrically connected to the outside. The external terminals (the first external electrode terminal 721, the second external electrode terminal 722, the third external electrode terminal 723 and the fourth external electrode terminal 724) have a thickness greater than the other patterns.

In the function unit 7 as shown in FIGS. 13 and 14, a temperature measuring element part 73 is provided. As the temperature measuring element part 73 here, a thermistor, a diode or the like is used. The third internal electrode terminal 713 is electrically connected to the fourth internal electrode terminal 714 via the temperature measuring element part 73. In contrast to the conventional miniaturized crystal resonator 101 on which no temperature measuring element can be mounted, with this configuration including the function unit 7, it is possible to mount the temperature measuring element on the miniaturized crystal resonator 101.

Figure 15:
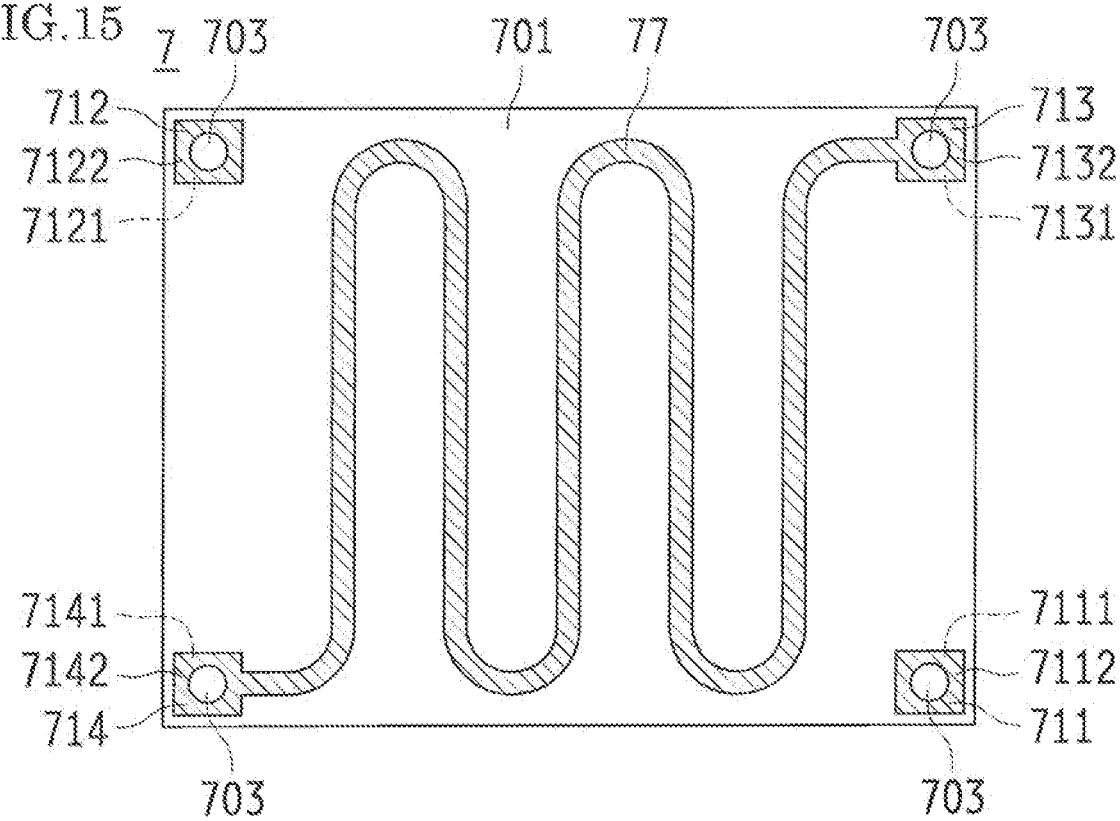
FIG. 15 is a schematic plan view illustrating a variation of the function unit of the crystal resonator of the present invention.
Figure 16:
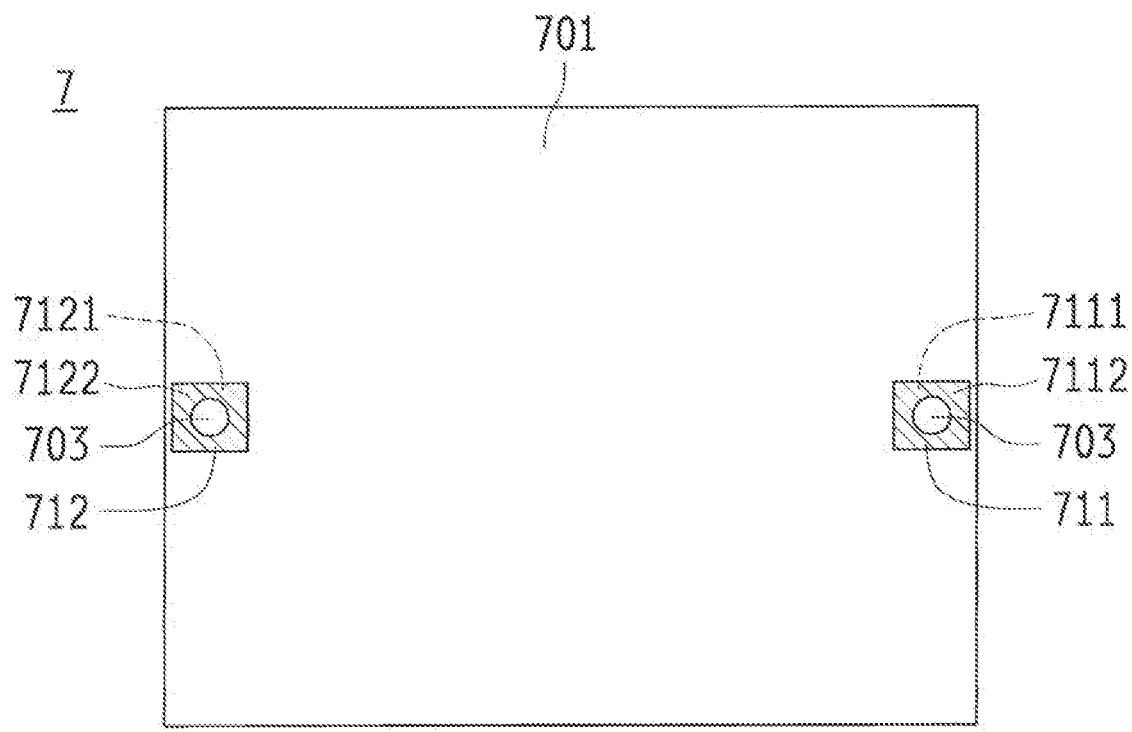
FIG. 16 is a schematic plan view illustrating a variation of the function unit of the crystal resonator of the present invention.
Figure 17:
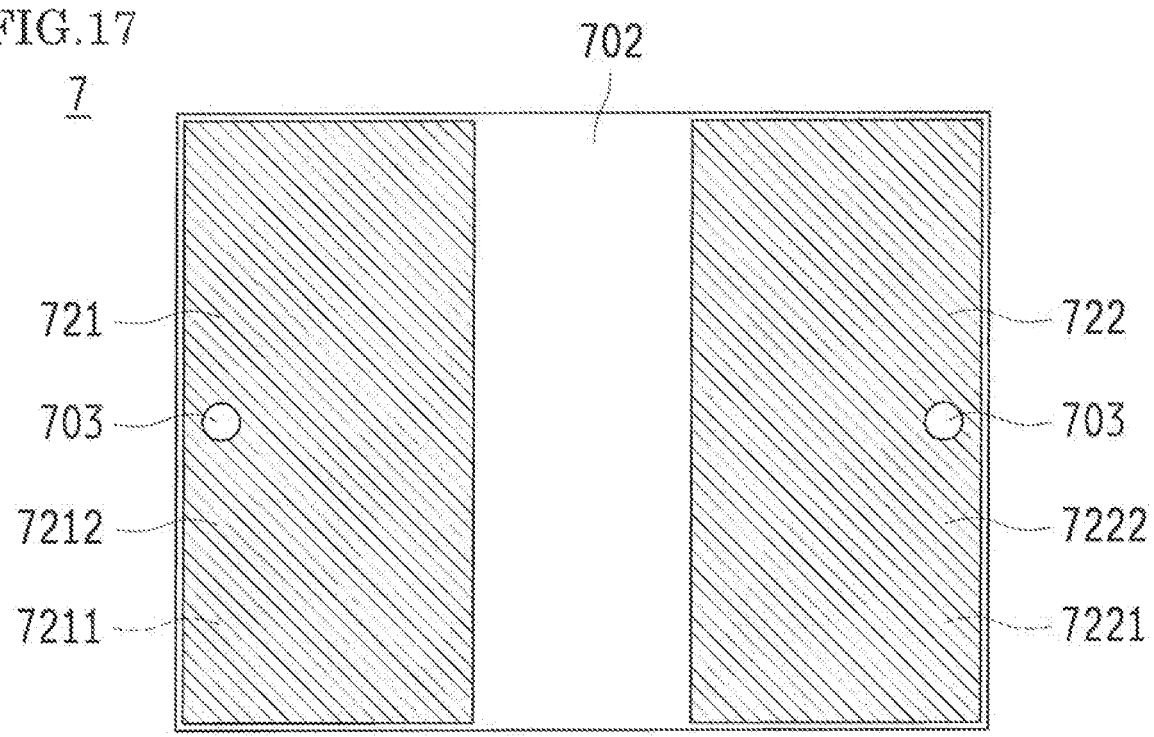
FIG. 17 is a schematic rear view illustrating a variation of the function unit of the crystal resonator of the present invention.

As described above, the function unit 7 in FIGS. 13 and 14 includes the temperature measuring element part 73. However, the function unit 7 is not limited to the configuration including the temperature measuring element part 73, provided that it provides a certain function and includes an external terminal. For example, the function unit 7 may have the configurations as shown in FIGS. 15 to 17. In any configurations of the function unit as shown in FIGS. 15 to 17, the external terminals (the first external electrode terminal 721, the second external electrode terminal 722, the third external electrode terminal 723 and the fourth external electrode terminal 724) are electrically connected, directly, to the internal electrode terminals (the first internal electrode terminal 711, the second internal electrode terminal 712, the third internal electrode terminal 713 and the fourth internal electrode terminal 714).

In the function unit 7 in FIG. 15, a heater part 77 including a heater element is provided, instead of the temperature measuring element part 73 in FIG. 13. In the aspect illustrated in FIG. 15, the heater part 77 has a shape snaking between the internal electrode terminals. However, the shape of the heater part 77 is not limited thereto. It may have a rectangular shape over the substantially entire surface of the first main surface 701.

The function unit 7 in FIGS. 16 and 17 is made of an epoxy substrate for absorbing shocks. The configuration including such a function unit 7 can be used as a piezoelectric resonator device to be mounted on a vehicle, because if it is under the strict condition in the shock, the epoxy substrate absorbs such a shock to prevent the vibrating part 23 from being affected by the shock. Note that the epoxy substrate in FIGS. 16 and 17 may include the temperature measuring element part 73 in FIG. 13, the heater part 77 in FIG. 15 or the inductance part 74 (described later) in FIGS. 19 and 20.

Figure 19:
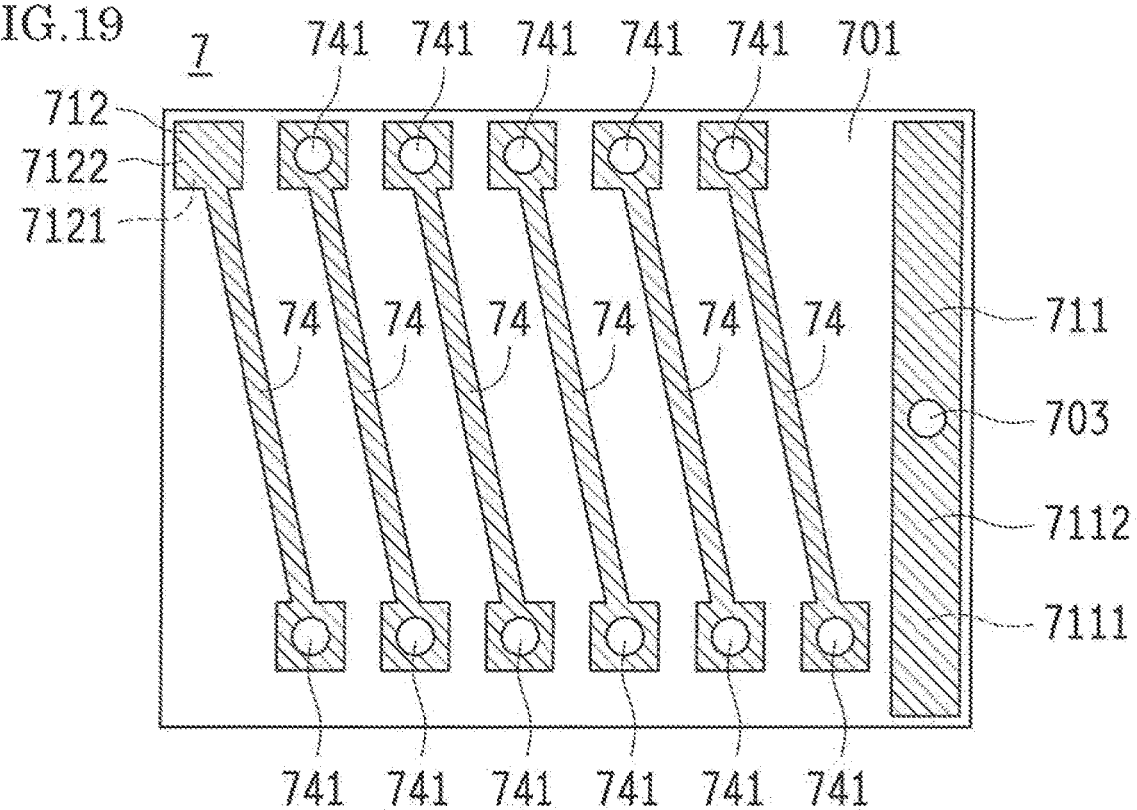
FIG. 19 is a schematic plan view illustrating a variation of the function unit of the crystal resonator of the present invention.
Figure 20:
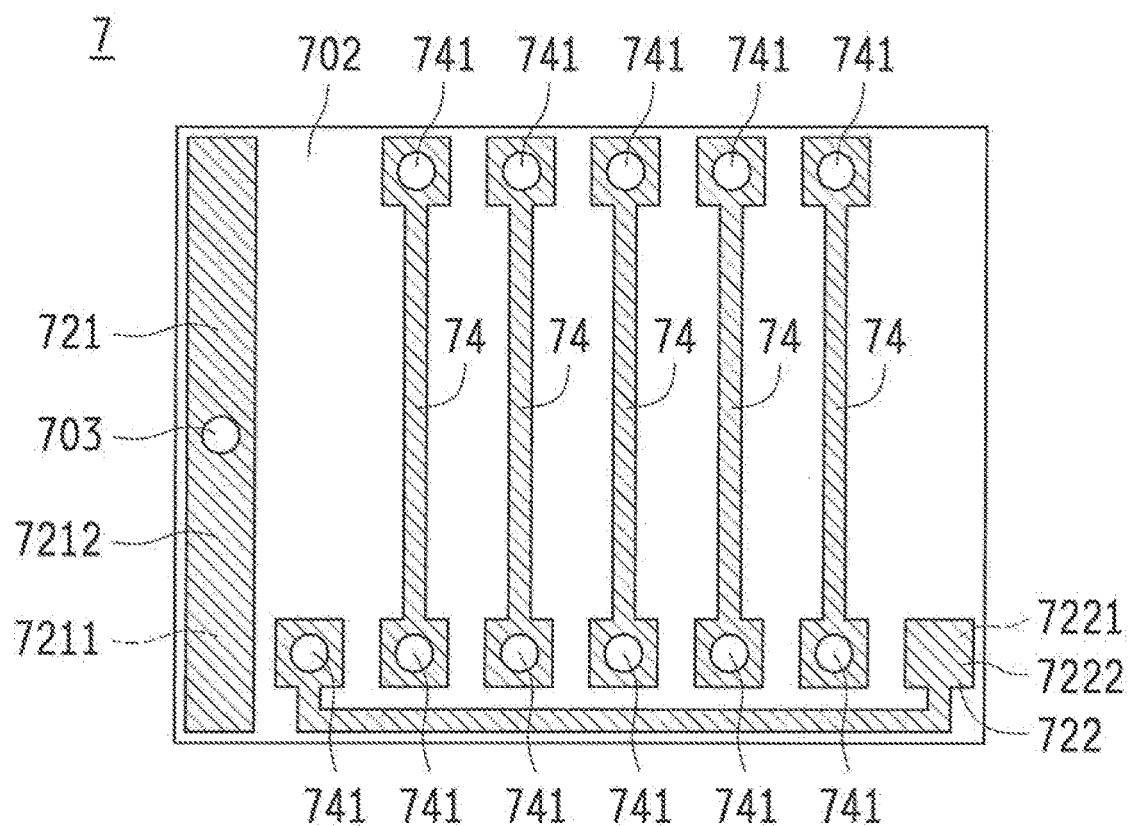
FIG. 20 is a schematic rear view illustrating the variation of the function unit of the crystal resonator of the present invention.

On the function unit 7 in FIGS. 19 and 20, the L-element inductance part 74 is provided. The inductance part 74 is configured by wounding a thin-film conductive pattern around the substrate through L-element through holes 741. With the function unit 7 of this type, it is possible to increase the capacitance that decreases according to the miniaturization of the crystal resonator 101.

Figure 23:
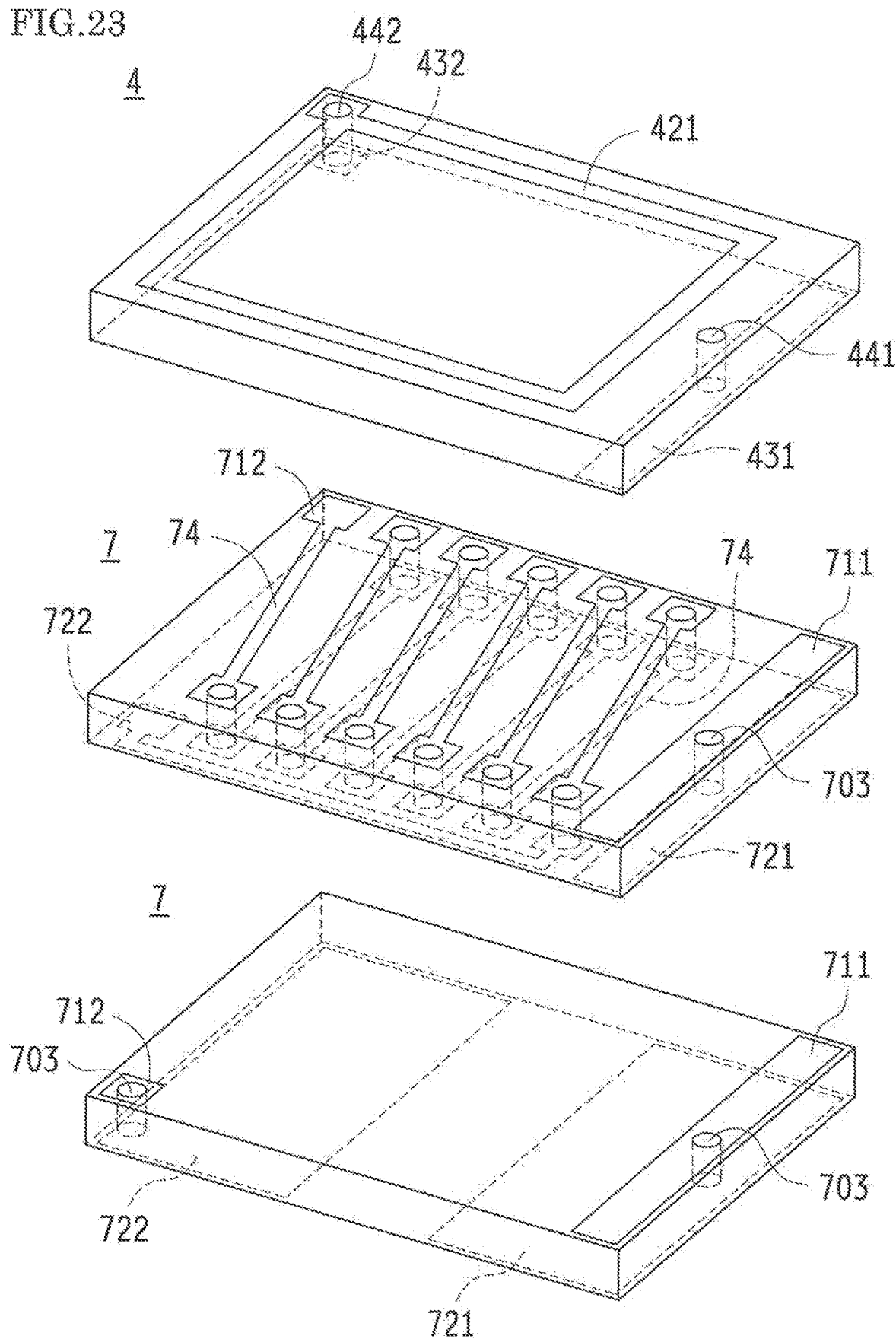
FIG. 23 is a perspective view illustrating a wiring state of the crystal resonator according to the third embodiment of the present invention.

If the inductance part 74 serves as the function unit 7, it is necessary to avoid contact between the inductance part 74 provided on the second main surface 702 and the circuit board 61. Thus, it is preferable to provide another function unit 7 shown in FIGS. 21 and 22 under the function unit 7, so as to avoid the contact between the inductance part 74 and the circuit board 61. That is, it is preferable to laminate the function units 7 (see FIG. 23).

As described above, on the function unit 7 in FIGS. 19 and 20, the inductance part 74 is provided. However, the function unit 7 is not limited to the configuration including the inductance part 74, provided that it provides a certain function and includes an external terminal. For example, the function unit 7 may have the configurations as shown in FIGS. 13 to 17. In any configurations of the function unit 7 as shown in FIGS. 13 to 17, the external terminals (the first external electrode terminal 721, the second external electrode terminal 722, the third external electrode terminal 723 and the fourth external electrode terminal 724) are electrically connected, directly, to the internal electrode terminals (the first internal electrode terminal 711, the second internal electrode terminal 712, the third internal electrode terminal 713 and the fourth internal electrode terminal 714).

As described above, in the crystal resonator 101 according to this embodiment, the connection terminals (the first connection terminal 431 and the second connection terminal 432) are formed on the second sealing member 4. Thus, it is adaptable to various purposes, that is, it can be the crystal resonator 101 including the inductance part 74 (L-element), the crystal resonator 101 including the temperature measuring element part 73 (temperature measuring element), the crystal resonator 101 including the heater part 77 (heater element), the crystal resonator 101 (X-tal) to be mounted on a vehicle, and the like.

Also, in this embodiment, the connection terminals (the first connection terminal 431 and the second connection terminal 432) cannot be directly bonded to the flowable conductive bonding material 62 (e.g. a Pb-free solder and a conductive adhesive). Since the base PVD films 4311 and 4321 of the connection terminals (the first connection terminal 431 and the second connection terminal 432) are thinly deposited by the physical vapor deposition, they are suitable for the diffusion bonding, but not suitable for any bonding (e.g. solder bonding) for which the high-temperature heating is indispensable. For this reason, in this embodiment, the connection terminals (the first connection terminal 431 and the second connection terminal 432) cannot be directly bonded to the circuit board 61 as the external member via the flowable conductive bonding material 62.

As discussed above, the connection terminals (the first connection terminal 431 and the second connection terminal 432) are not directly bonded to the flowable conductive bonding material 62. Thus, in this embodiment, the connection terminals (the first connection terminal 431 and the second connection terminal 432) are not eroded by the flowable conductive bonding material 62. Therefore, the connection terminals (the first connection terminal 431 and the second connection terminal 432) can be thinly formed without consideration of the amount of erosion of the connection terminals (the first connection terminal 431 and the second connection terminal 432) by the flowable conductive bonding material 62. As a result, it is possible to reduce the height of the crystal resonator 101.

In this embodiment, the sealing-member-side first bonding pattern 321 is bonded to the resonator-plate-side first bonding pattern 251 by the diffusion bonding, and the sealing-member-side second bonding pattern 421 is bonded to the resonator-plate-side second bonding pattern 252 by the diffusion bonding. Also, in the second sealing member 4, the connection terminals (the first connection terminal 431 and the second connection terminal 432) for the diffusion bonding to the function unit 7 are formed on the second main surface 412 not facing the crystal resonator plate 2. Thus, the crystal resonator plate 2, the first sealing member 3 and the second sealing member 4 are not bonded to each other by the high-temperature heating, accordingly, it is possible to prevent the degradation of the connection terminals (the first connection terminal 431 and the second connection terminal 432) due to the high-temperature heating for bonding.

The function unit 7 is bonded to the second sealing member 4 by the diffusion bonding. And on the function unit 7, the external terminals (the first external electrode terminal 721, the second external electrode terminal 722, the third external electrode terminal 723 and the fourth external electrode terminal 724) are formed. Thus, it is possible to interpose the function unit 7 when the crystal resonator plate 2 is mounted on the circuit board 61. As a result, it is possible to prevent the difference in the thermal expansion coefficient between the material of the circuit board 61 and the material of the crystal resonator 101 from causing troubles (such as craking and breaking at the bonding solder), which results in highly improved reliability of the crystal resonator 101. That is, when the crystal resonator 101 is bonded to a glass epoxy board as the current circuit board 61, no trouble (such as cracking and breaking at the bonding solder) is caused by the difference in the thermal expansion coefficient between the material of the circuit board 61 and the material of the crystal resonator 101.

In this embodiment, there is no variation in the height of the package of the crystal resonator 101. For example, unlike this embodiment, if using the metal paste sealing material such as an Sn-containing bonding material that makes a gap of more than 1 μm between the respective elements, i.e., the crystal resonator plate 2, the sealing members (the first sealing member 3 and the second sealing member 4 in this embodiment) and the function unit 7, the variation in height occurs when the metal paste sealing material is formed on the patterns (the resonator-plate-side first bonding pattern 251, the resonator-plate-side second bonding pattern 252, the sealing-member-side first bonding pattern 321 and the sealing-member-side second bonding pattern 421). Also, after bonding, due to the heat capacity distribution in the formed patterns (the resonator-plate-side first bonding pattern 251, the resonator-plate-side second bonding pattern 252, the sealing-member-side first bonding pattern 321 and the sealing-member-side second bonding pattern 421), the even gaps (the gap between the first sealing member 3 and the crystal resonator plate 2 of this embodiment, the gap between the second sealing member 4 and the crystal resonator plate 2 of this embodiment, and the gap between the second sealing member 4 and the function unit 7 of this embodiment) are not formed. Therefore, in the conventional art for example, when three members (i.e., the first sealing member, the second sealing member and the piezoelectric resonator plate) are laminated, the respective gaps between the members are different. As a result, the laminated three members are bonded in a state in which they are not parallel to each other. This problem becomes remarkable according to the reduction in package height. On the other hand, in this embodiment, since the upper limit of the gap is set to 1.00 μm, the three members of the package 12 (i.e., the first sealing member 3, the second sealing member 4 and the crystal resonator plate 2; or, in case of the function extension type crystal resonator 101, four or more members such as the first sealing member 3, the second sealing member 4, the crystal resonator plate 2 and the function unit 7) can be laminated and bonded in a state in which they are parallel to each other, thus, this embodiment can be adaptable to the height reduction.

In this embodiment, the first sealing member 3 and the second sealing member 4 are made of glass, however, the present invention is not limited thereto. They may be made of crystal.

In this embodiment, the second sealing member 4 is bonded to the function unit 7, however, the present invention is not limited thereto. The first sealing member 3 may be bonded to the function unit 7.

In this embodiment, the piezoelectric resonator plate is made of crystal, however, the present invention is not limited thereto. It may be made of another material such as lithium niobate and lithium tantalate, i.e., a piezoelectric material.

In this embodiment, the bonding material 11 is made of Ti (or Cr) and Au, however, the present invention is not limited thereto. The bonding material 11 may be made, for example, of Ni and Au.

In this embodiment, a conductive film is formed in each inner wall surface of all of the through holes, however, the present invention is not limited thereto. The through holes may be filled with a conductive material.

In this embodiment, the resonator-plate-side first bonding pattern 251, the resonator-plate-side second bonding pattern 252, the sealing-member-side first bonding pattern 321 and the sealing-member-side second bonding pattern 421 contain Ti (or Cr) and Au. However, the present invention is not limited thereto. They may contain Cu (a single Cu or a Cu alloy), which can contribute to stress relaxation at the time of producing (e.g. when bonding or when the device is shocked due to an external force by, for example, pressurizing) or at the time of using (e.g. when solder-mounting is performed or when the device is shocked by an external force such as falling shock). That is, if the resonator-plate-side first bonding pattern 251, the resonator-plate-side second bonding pattern 252, the sealing-member-side first bonding pattern 321 and the sealing-member-side second bonding pattern 421 contain Cu, the mechanical strength is improved.

Also, if Cr is contained in the base PVD films 2511, 2521, 3211 and 4211, it is possible to prevent Cr from diffusing into the electrode PVD films 2512, 2522, 3212 and 4212 because of Cu contained in the base PVD films 2511, 2521, 3211 and 4211. As a result, even when the layer using Cr is made thick, it is possible to prevent Cr from diffusing into the electrode PVD films 2512, 2522, 3212 and 4212, thus thickening the Cr layer results in suppression of the production variation. Specifically, even when the Cr layer has a thickness of 0.2 μm, it is possible to prevent Cr from diffusing into the electrode PVD films 2512, 2522, 3212 and 4212.

In this embodiment, the second sealing member 4 is a substrate having a rectangular parallelepiped shape that is made of a single glass wafer. However, the present invention is not limited thereto. It may be two rectangular parallelepiped substrates each made of a glass wafer. In this case, the sealing-member-side second bonding pattern 421, the third through hole 442 and the second connection terminal 432 are formed on the one rectangular parallelepiped substrate for hermetically sealing, and the second through hole 441 and the first connection terminal 431 are formed on the other rectangular parallelepiped substrate. In such a configuration, it is possible to separate the pair of connection terminals (the first connection terminal 431 and the second connection terminal 432) completely from each other, thus preventing the short-circuiting. Also, if the second sealing member 4 is made up of the two rectangular parallelepiped substrates made of a metal material, not the glass wafer, there is no need for further forming the third through hole 442. Thus, reducing the number of the through holes results in the reduction in size.

In this embodiment, the first extraction electrode 223 and the second extraction electrode 224 are formed as shown in FIGS. 2, 4 to 6 and 10 to 12. However, the present invention is not limited thereto. Cr may be used as the uppermost layer on respective arbitrary positions of the first extraction electrode 223 and the second extraction electrode 224, and a gap may exist between the first extraction electrode 223 and the resonator-plate-side first bonding pattern 251, and between the second extraction electrode 224 and the resonator-plate-side second bonding pattern 252. Preferably, the gap is disposed on the resonator-plate-side sealing part 25. In such a configuration, the first extraction electrode 223 is not electrically connected to the resonator-plate-side first bonding pattern 251, and the second extraction electrode 224 is not electrically connected to the resonator-plate-side second bonding pattern 252, before bonding by the heat-melting in the production process. As a result, it is possible to perform various inspections for only the excitation electrodes (the first excitation electrode 221 and the second excitation electrode 222) in the vibration inspection process, which results in a high degree of freedom in the vibration inspections.

The function unit 7 in FIGS. 16 and 17 may be made of a glass epoxy substrate. When using the glass epoxy substrate, it is difficult to perform the diffusion bonding as described in the previous embodiments to the electrodes formed on the glass epoxy substrate. For this reason, the electrodes are formed by Au bump. When the electrode is formed by the Au bump, the function unit 7 (the glass epoxy substrate) can be bonded by solder to the circuit board 61. Since the difference in the thermal expansion coefficient between the mounting solder for the bonding and the glass epoxy substrate is small, it is possible to suppress generation of solder cracks when mounting. Thus, it is possible to produce a reliable piezoelectric resonator device, which can be mounted on a vehicle. On the glass epoxy substrate, the temperature measuring element part 73 in FIG. 13, the heater part 77 in FIG. 15 and the inductance part 74 in FIGS. 19 and 20 may be provided.

Also, to the present invention, a crystal oscillator (see FIG. 24) described later may be applied. Hereinafter, two embodiments will be described, in which the present invention is applied to a crystal oscillator as a piezoelectric resonator device that causes piezoelectric resonance. For the sake of convenience, the common configuration with the above-described crystal resonator 101 will be described referring to the same reference numerals. Also, since functions and effects obtained by the common configuration are similar to those of the crystal resonator 101 in FIG. 1, such functions and effects are omitted from the following description.

—First Embodiment of Crystal Oscillator—

Figure 24:
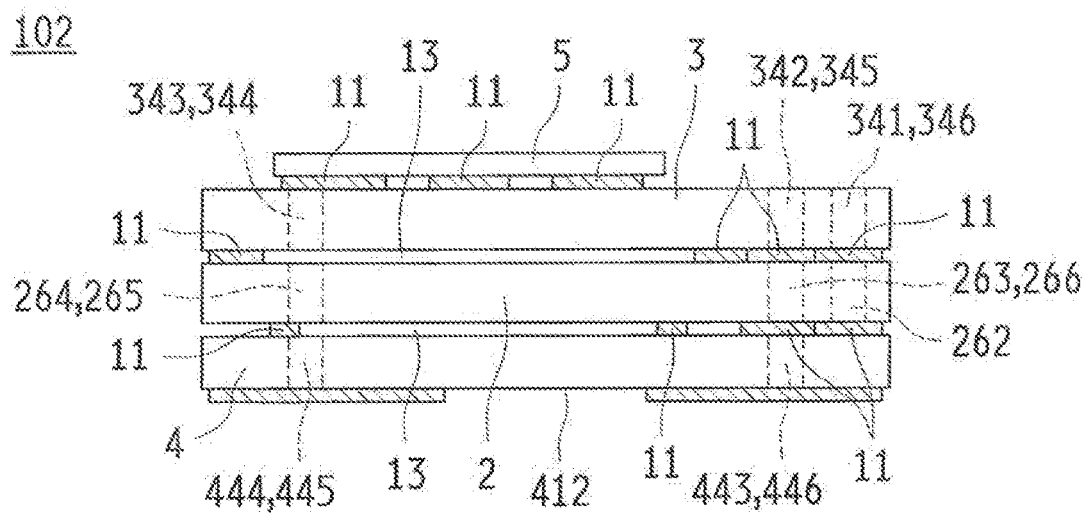
FIG. 24 is a schematic configuration diagram illustrating a configuration of a crystal oscillator according to a first embodiment of the present invention.

As shown in FIG. 24, a crystal oscillator 102 according to this embodiment includes: the crystal resonator plate 2 (a piezoelectric resonator plate in the present invention); the first sealing member 3 that covers the first excitation electrode 221 (see FIG. 27) of the crystal resonator plate 2 so as to hermetically seal the first excitation electrode 221 that is formed on the first main surface 211 of the crystal resonator plate 2; the second sealing member 4 disposed on the second main surface 212 of the crystal resonator plate 2 so as to cover the second excitation electrode 222 (see FIG. 28) of the crystal resonator plate 2, the second sealing member 4 for hermetically sealing the second excitation electrode 222 that makes a pair with the first excitation electrode 221; and an electronic component element (an IC 5 in this embodiment), which is other than the piezoelectric resonator element, mounted on the first sealing member.

In the crystal oscillator 102, the crystal resonator plate 2 is bonded to the first sealing member 3, and also the crystal resonator plate 2 is bonded to the second sealing member 4. Thus, the package 12 having a sandwich structure is constituted.

The internal space 13 of the package 12 is formed by bonding the first sealing member 3 to the second sealing member 4 via the crystal resonator plate 2. In this internal space 13 of the package 12, the vibrating part 23 is hermetically sealed. The vibrating part 23 includes the first excitation electrode 221 and the second excitation electrode 222 respectively formed on both main surfaces 211 and 212 of the crystal resonator plate 2. As shown in FIG. 24, the internal space 13 is located so as to be deflected to one end side (left side) in plan view of the package 12.

The crystal oscillator 102 according to this embodiment has a package size of 1.2×1.0 mm, which is reduced in size and height. According to the size reduction, no castellation is formed in the package 12. Through holes (a fourth through hole 262 to an eighteenth through hole 446) are used for conduction between electrodes.

Next, the configuration of the above-described crystal oscillator 102 will be described referring to FIGS. 24 to 30. Here, each of the crystal resonator plate 2, the first sealing member 3 and the second sealing member 4 will be described as a single body without bonded.

Figure 27:
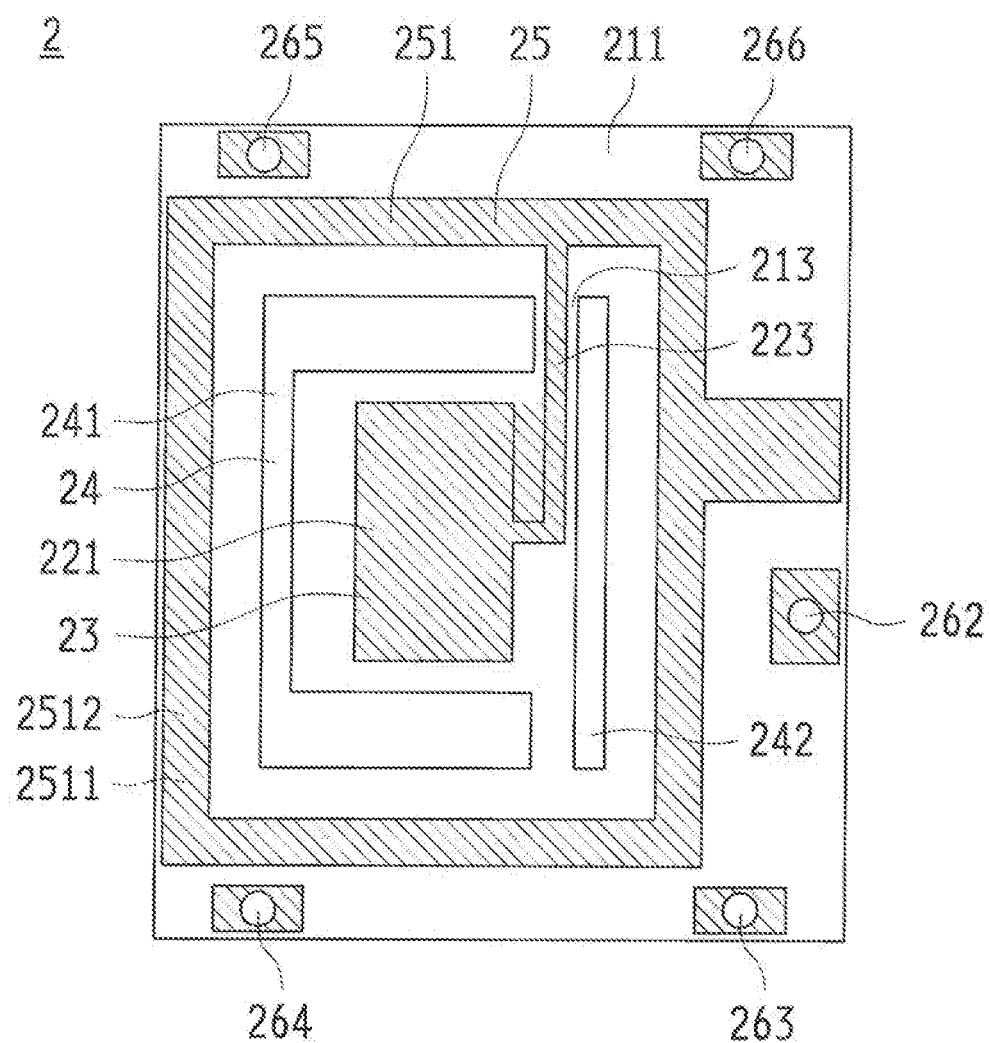
FIG. 27 is a schematic plan view illustrating a crystal resonator plate of the crystal oscillator of the present invention.
Figure 28:
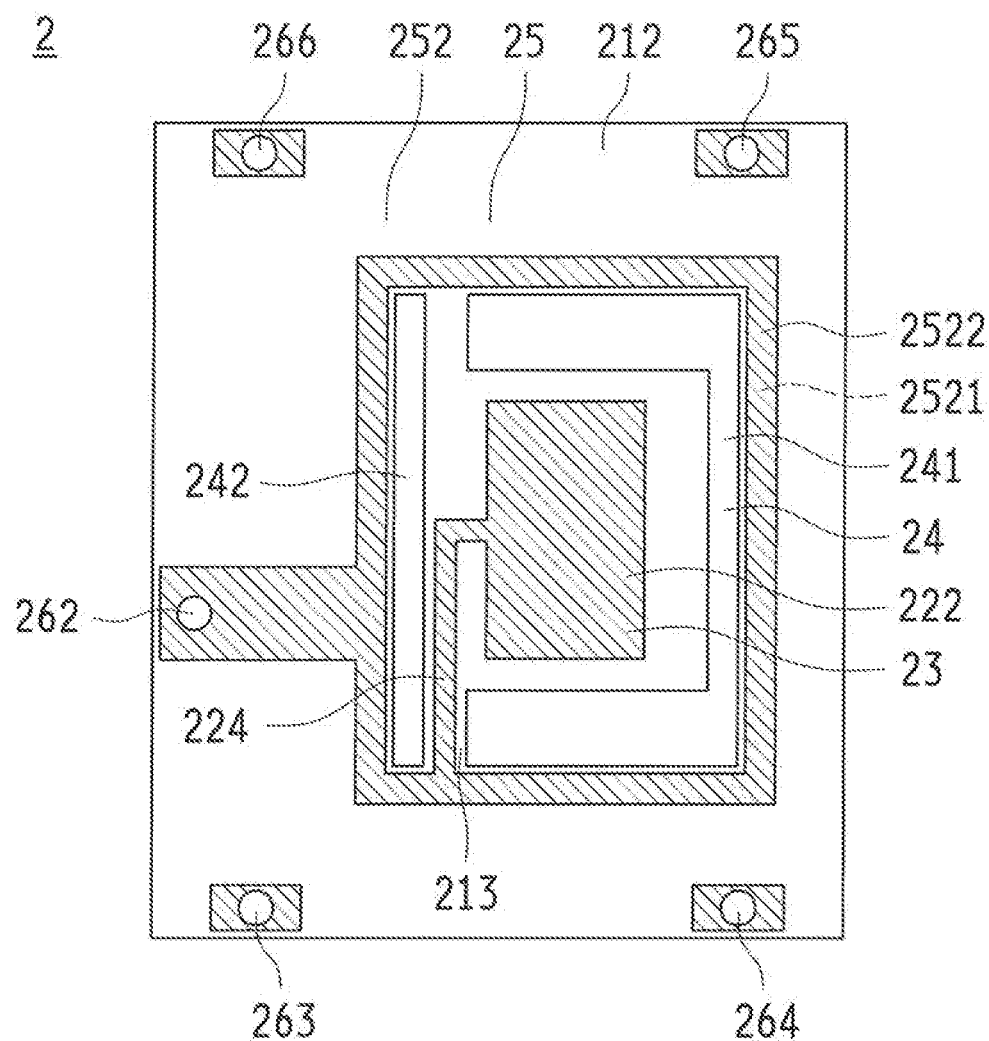
FIG. 28 is a schematic rear view illustrating the crystal resonator plate of the crystal oscillator of the present invention.

As shown in FIGS. 27 and 28, the crystal resonator plate 2 is made of a crystal as a piezoelectric material. Both main surfaces (the first main surface 211 and the second main surface 212) are formed as smooth flat surfaces (mirror-finished).

A pair of excitation electrodes (i.e., excitation electrodes making a pair with each other, that is, the first excitation electrode 221 and the second excitation electrode 222) is formed, respectively, on both main surfaces 211 and 212 (the first main surface 211 and the second main surface 212) of the crystal resonator plate 2. Also, in both main surfaces 211 and 212, two cut-out parts 24 (each having a penetration shape) are formed so as to surround the pair of first excitation electrode 221 and second excitation electrode 222, thus, the vibrating part 23 is formed. The cut-out parts 24 are constituted by the squared U-shaped part 241 in plan view (i.e., a part in plan view made up of three rectangles in plan view: one rectangle; and two rectangles extending from both ends of the one rectangle in the direction perpendicular to the longitudinal direction of the one rectangle), and the oblong rectangular shaped part 242 in plan view. A part between the squared U-shaped part 241 in plan view and the oblong rectangular shaped part 242 in plan view serves as the conduction path 213 on which are disposed the extraction electrodes (the first extraction electrode 223 and the second extraction electrode 224) for extracting the first excitation electrode 221 and the second excitation electrode 222 to the external terminals (see herein below). Regarding the electrode patterns, the first extraction electrode 223 and the second extraction electrode 224 extracted respectively from the pair of first excitation electrode 221 and second excitation electrode 222 are electrically connected to electrodes patterns 33 formed on the first sealing member 3, via the resonator-plate-side first bonding pattern 251 and the resonator-plate-side second bonding pattern 252.

In the crystal resonator plate 2, the respective resonator-plate-side sealing parts 25 to be bonded to the first sealing member 3 and to the second sealing member 4 are provided on outward positions along the vibrating part 23 of both main surfaces 211 and 212, so that the vibrating part 23 is surrounded. As shown in FIGS. 27 and 28, the resonator-plate-side sealing parts 25 are located so as to be deflected to the left side in plan view of both main surfaces 211 and 212.

On the resonator-plate-side sealing part 25 on the first main surface 211 of the crystal resonator plate 2, the resonator-plate-side first bonding pattern 251 is formed so as to be bonded to the first sealing member 3. The first excitation electrode 221 is connected to the resonator-plate-side first bonding pattern 251. The resonator-plate-side first bonding pattern 251 is constituted by the base PVD film 2511 deposited on the first main surface 211 by the physical vapor deposition, and the electrode PVD film 2512 deposited on the base PVD film 2511 by the physical vapor deposition. Also, on the resonator-plate-side sealing part 25 on the second main surface 212 of the crystal resonator plate 2, the resonator-plate-side second bonding pattern 252 is formed so as to be bonded to the second sealing member 4. The second excitation electrode 222 is connected to the resonator-plate-side second bonding pattern 252. The resonator-plate-side second bonding pattern 252 is constituted by the base PVD film 2521 deposited on the second main surface 212 by the physical vapor deposition, and the electrode PVD film 2522 deposited on the base PVD film 2521 by the physical vapor deposition. The internal space 13 is formed in the inward position (inside) of the resonator-plate-side first bonding pattern 251 and the resonator-plate-side second bonding pattern 252.

The resonator-plate-side first bonding pattern 251 and the resonator-plate-side second bonding pattern 252 have the same configuration in which a plurality of layers is laminated on the resonator-plate-side sealing part 25 of both main surfaces 211 and 212, specifically, a Ti layer (or a Cr layer) and an Au layer are deposited by the vapor deposition in this order from the lowermost layer side. Like this, in the resonator-plate-side first bonding pattern 251 and the resonator-plate-side second bonding pattern 252, the base PVD films 2511 and 2521 are made of a single material (Ti or Cr), the electrode PVD films 2512 and 2522 are made of a single material (Au), and the electrode PVD films 2512 and 2522 have a thickness greater than the thickness of the base PVD films 2511 and 2521. The first excitation electrode 221 and the resonator-plate-side first bonding pattern 251 both formed on the first main surface 211 of the crystal resonator plate 2 have the same thickness, and the surfaces (main surfaces) of the first excitation electrode 221 and the resonator-plate-side first bonding pattern 251 are made of the same metal. The second excitation electrode 222 and the resonator-plate-side second bonding pattern 252 both formed on the second main surface 212 of the crystal resonator plate 2 have the same thickness, and the surfaces (main surfaces) of the second excitation electrode 222 and the resonator-plate-side second bonding pattern 252 are made of the same metal. The resonator-plate-side first bonding pattern 251 and the resonator-plate-side second bonding pattern 252 do not contain Sn. Note that when the resonator-plate-side first and second bonding patterns 251 and 252 are compared with the resonator plate side (first excitation electrode 221 and the second excitation electrode 222) in the configuration in which they have the same thickness and their surfaces are made of the same metal on the same main surface, it is possible to perform bonding even when the kind or thickness of the base metals (the base PVD films 2511 and 2521) differs, under the condition in which the uppermost layers (at least exposed surfaces, i.e., the electrode PVD films 2512 and 2522 and the like) are made of the same metal. The electrode PVD films 2512 and 2522 of the resonator-plate-side first bonding pattern 251 and the resonator-plate-side second bonding pattern 252 have respective scaly surfaces in plan view. Here, being scaly means a dense (or almost dense) state in plan view in which miscroscopically individual pieces of metal due to activation overlap with each other like a straw-mat.

As shown in FIGS. 27 and 28, the crystal resonator plate 2 includes the through holes (the fourth through hole 262, the fifth through hole 263, the sixth through hole 264, the seventh through hole 265 and the eighth through hole 266). The resonator-plate-side second bonding pattern 252 connected to the second excitation electrode 222 is extracted to the side of the first main surface 211 through the fourth through hole 262. The fifth through hole 263, which is connected to the tenth through hole 342 of the first sealing member 3 and to the fifteenth through hole 443 of the second sealing member 4, is a conduction path so that the IC 5 is conducted to a first connection terminal 433. The sixth through hole 264, which is connected to the eleventh through hole 343 of the first sealing member 3 and to the sixteenth through hole 444 of the second sealing member 4, is a conduction path so that the IC 5 is conducted to a second connection terminal 434. The seventh through hole 265, which is connected to the twelfth through hole 344 of the first sealing member 3 and to the seventeenth through hole 445 of the second sealing member 4, is a conduction path so that the IC 5 is conducted to a third connection terminal 435. The eighth through hole 266, which is connected to the thirteenth through hole 345 of the first sealing member 3 and to the eighteenth through hole 446 of the second sealing member 4, is a conduction path so that the IC 5 is conducted to a fourth connection terminal 436. The fourth through hole 262, the fifth through hole 263, the sixth through hole 264, the seventh through hole 265 and the eighth through hole 266 are formed in the outward position of the internal space 13. The fourth through hole 262, the fifth through hole 263, the sixth through hole 264, the seventh through hole 265 and the eighth through hole 266 are not formed in the inward position of the internal space 13. Here, the inward position of the internal space 13 means strictly the inner side of the inner peripheral surface of the bonding material 11, not including the position on the bonding material 11.

Figure 25:
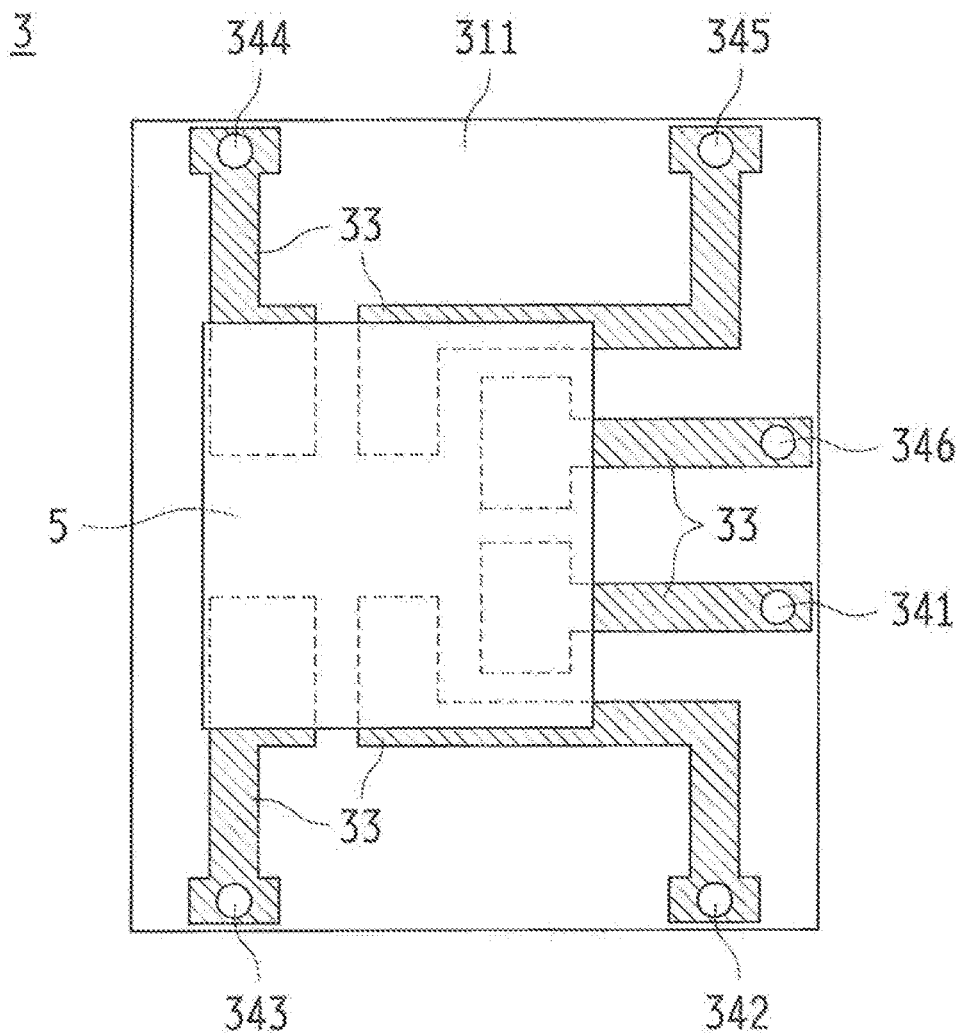
FIG. 25 is a schematic plan view of a first sealing member of the crystal oscillator of the present invention.
Figure 26:
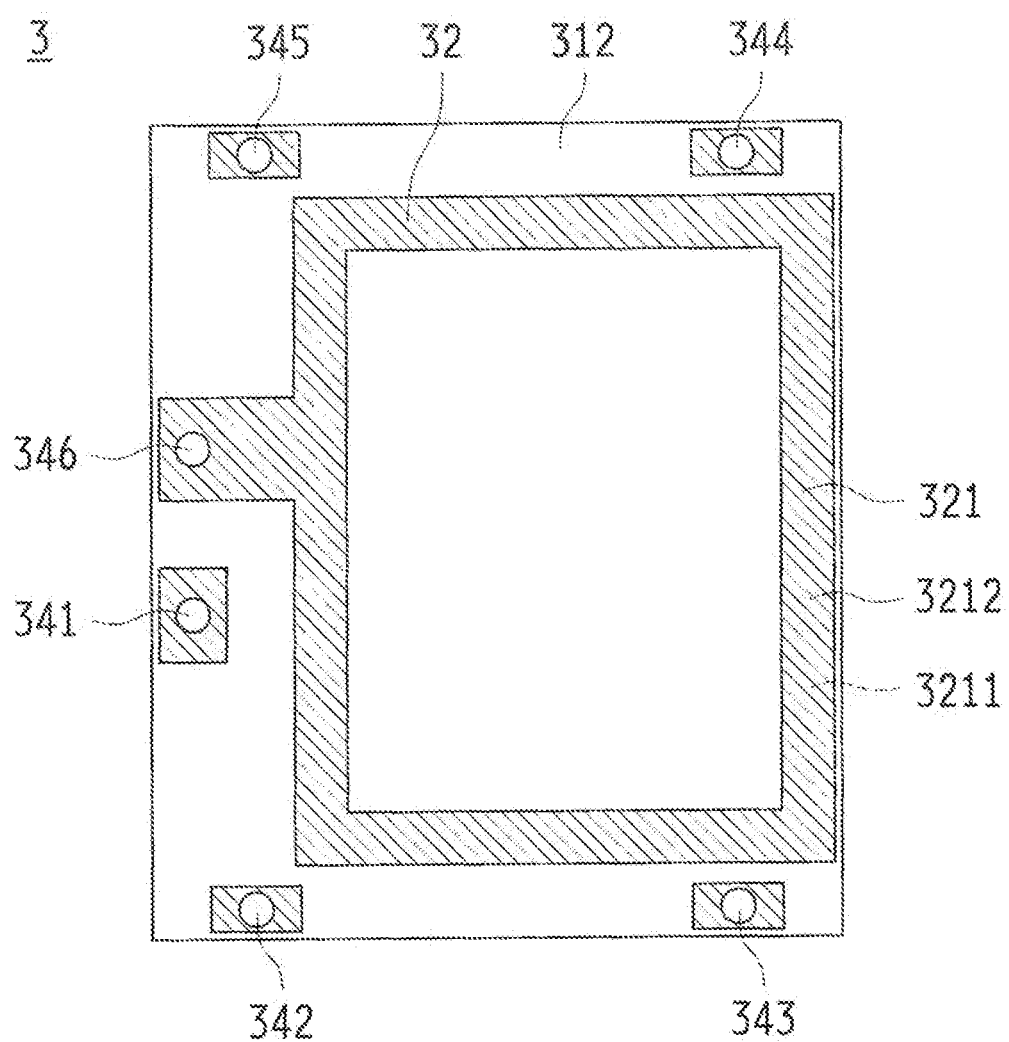
FIG. 26 is a schematic rear view of the first sealing member of the crystal oscillator of the present invention.

The first sealing member 3 is made of a material having the flexural rigidity (moment of inertia of area×Young's modulus) of not more than 1000 [N·mm$^2$]. Specifically, as shown in FIGS. 25 and 26, the first sealing member 3 is a substrate having a rectangular parallelepiped shape that is made of a single glass wafer. The second main surface 312 (the surface to be bonded to the crystal resonator plate 2) and a first main surface 311 (the surface on which the IC 5 is mounted) of the first sealing member 3 are formed as a smooth flat surface (mirror finished).

On the second main surface 312 of the first sealing member 3, the sealing-member-side first sealing part 32 is disposed so as to be bonded to the crystal resonator plate 2. As shown in FIG. 26, the sealing-member-side first sealing part 32 is located so as to be deflected to the left side in plan view of the second main surface 312 of the first sealing member 3.

On the sealing-member-side first sealing part 32 of the first sealing member 3, the sealing-member-side first bonding pattern 321 is formed so as to be bonded to the crystal resonator plate 2. The sealing-member-side first bonding pattern 321 has the same width at all positions on the sealing-member-side first sealing part 32 of the first sealing member 3.

The sealing-member-side first bonding pattern 321 is constituted by the base PVD film 3211 deposited on the first sealing member 3 by the physical vapor deposition, and the electrode PVD film 3212 deposited on the base PVD film 3211 by the physical vapor deposition. In this embodiment, the base PVD film 3211 is made of Ti (or Cr), and the electrode PVD film 3212 is made of Au. Also, the sealing-member-side first bonding pattern 321 does not contain Sn. Specifically, the sealing-member-side first bonding pattern 321 is made of a plurality of layers laminated on the sealing-member-side first sealing part 32 of the second main surface 312, that is, a Ti layer (or a Cr layer) and an Au layer are deposited by vapor deposition in this order from the lowermost layer side. Furthermore, in the sealing-member-side first bonding pattern 321, the electrode PVD film 3212 has a scaly surface in plan view.

On the first main surface 311 of the first sealing member 3, six electrode patterns 33 are formed, which include mounting pads for mounting the IC 5 as an oscillation circuit element. These six electrode patterns 33 are led, respectively, to the ninth through hole 341, the tenth through hole 342, the eleventh through hole 343, the twelfth through hole 344, the thirteenth through hole 345 and the fourteenth through hole 346. The tenth through hole 342, the eleventh through hole 343, the twelfth through hole 344 and the thirteenth through hole 345 are the through holes for conduction of the oscillator. The ninth through hole 341 (the through hole for conduction of the second excitation electrode 222) and the fourteenth through hole 346 (the through hole for conduction of the first excitation electrode 221) are the through holes for conduction of the crystal resonator plate 2.

Figure 29:
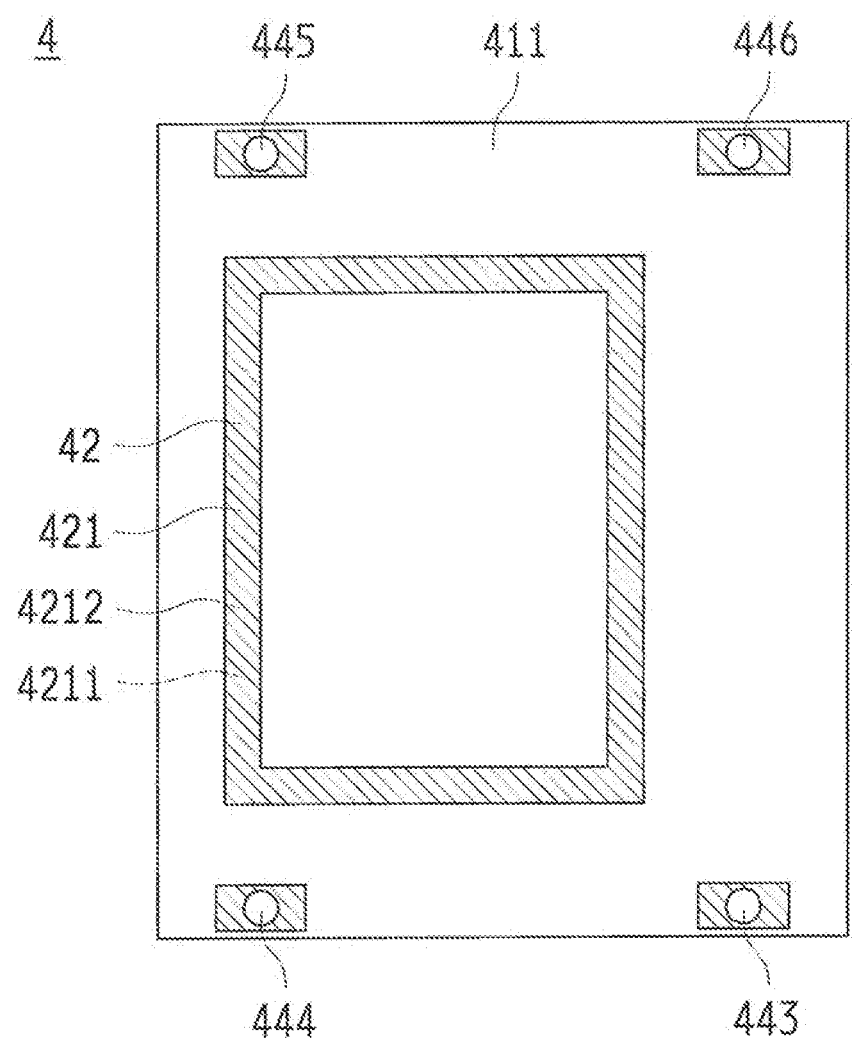
FIG. 29 is a schematic plan view illustrating a second sealing member of the crystal oscillator of the present invention.
Figure 30:
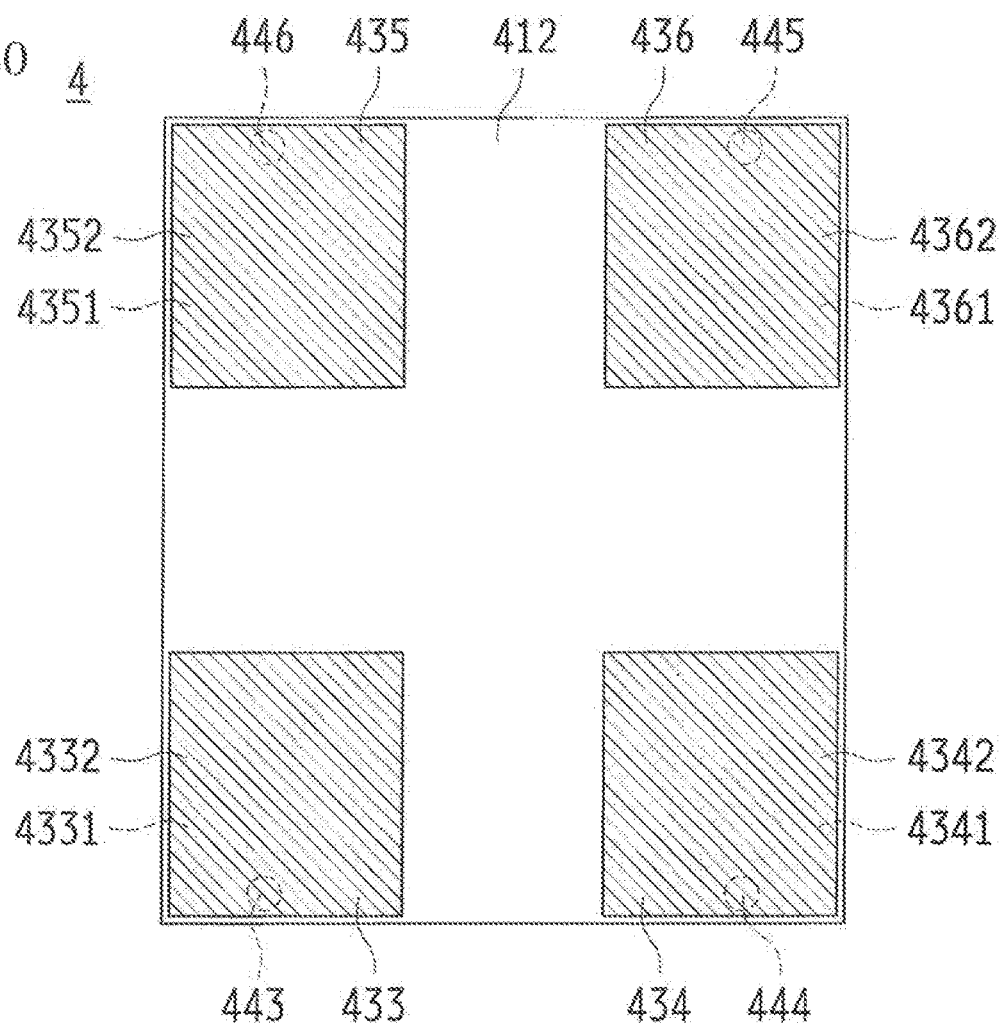
FIG. 30 is a schematic rear view illustrating the second sealing member of the crystal oscillator of the present invention.

The second sealing member 4 is made of a material having the flexural rigidity (moment of inertia of area× Young's modulus) of not more than 1000 [N·mm$^2$]. Specifically, as shown in FIGS. 29 and 30, the second sealing member 4 is a substrate having a rectangular parallelepiped shape that is made of a single glass wafer. The first main surface 411 (the surface to be bonded to the crystal resonator plate 2) of the second sealing member 4 is formed as a smooth flat surface (mirror finished).

On the first main surface 411 of the second sealing member 4, the sealing-member-side second sealing part 42 is disposed so as to be bonded to the crystal resonator plate 2. As shown in FIG. 29, the sealing-member-side second sealing part 42 is located so as to be deflected to the left side in plan view of the first main surface 411 of the second sealing member 4.

Also, four external terminals (the first connection terminal 433, the second connection terminal 434, the third connection terminal 435 and the fourth connection terminal 436), which are electrically connected to the outside, are formed on the second main surface 412 (the outer main surface not facing the crystal resonator plate 2) of the second sealing member 4. The first connection terminal 433, the second connection terminal 434, the third connection terminal 435 and the fourth connection terminal 436 are located respectively on the four corners. The external terminals (the first connection terminal 433, the second connection terminal 434, the third connection terminal 435 and the fourth connection terminal 436) are constituted by base PVD films 4331, 4341, 4351 and 4361 deposited on the second main surface 412 by the physical vapor deposition, and electrode PVD films 4332, 4342, 4352 and 4362 deposited on the base PVD films 4331, 4341, 4351 and 4361 by the physical vapor deposition. Compared with the base PVD films 2511, 2521, 3211 and 4211 of the above-described resonator-plate-side first bonding pattern 251, the resonator-plate-side second bonding pattern 252, the sealing-member-side first bonding pattern 321 and the sealing-member-side second bonding pattern 421, the base PVD films 4331, 4341, 4351 and 4361 of the external terminals (the first connection terminal 433, the second connection terminal 434, the third connection terminal 435 and the fourth connection terminal 436) have a great thickness.

On the sealing-member-side second sealing part 42 of the second sealing member 4, the sealing-member-side second bonding pattern 421 is formed so as to be bonded to the crystal resonator plate 2. The sealing-member-side second bonding pattern 421 has the same width at all positions on the sealing-member-side second sealing part 42 of the second sealing member 4.

The sealing-member-side second bonding pattern 421 is constituted by the base PVD film 4211 deposited on the second sealing member 4 by the physical vapor deposition, and the electrode PVD film 4212 deposited on the base PVD film 4211 by the physical vapor deposition. In this embodiment, the base PVD film 4211 is made of Ti (or Cr), and the electrode PVD film 4212 is made of Au. Also, the sealing-member-side second bonding pattern 421 does not contain Sn. Specifically, the sealing-member-side second bonding pattern 421 is made of a plurality of layers laminated on the sealing-member-side second sealing part 42 of the second main surface 412, that is, a Ti layer (or a Cr layer) and an Au layer are deposited by the vapor deposition in this order from the lowermost layer side. Furthermore, in the sealing-member-side second bonding pattern 421, the electrode PVD film 4212 has a scaly surface in plan view.

In the second sealing member 4, as shown in FIGS. 24, 29 and 30, four through holes (the fifteenth through hole 443, the sixteenth through hole 444, the seventeenth through hole 445 and the eighteenth through hole 446) are formed. The fifteenth through hole 443, the sixteenth through hole 444, the seventeenth through hole 445 and the eighteenth through hole 446 are disposed in the outward position of the internal space 13, not disposed in the inward position of the internal space 13.

In the crystal oscillator 102 having the above configuration, the crystal resonator plate 2 and the first sealing member 3 are subjected to the diffusion bonding in a state in which the resonator-plate-side first bonding pattern 251 and the sealing-member-side first bonding pattern 321 are overlapped with each other, and the crystal resonator plate 2 and the second sealing member 4 are subjected to the diffusion bonding in a state in which the resonator-plate-side second bonding pattern 252 and the sealing-member-side second bonding pattern 421 are overlapped with each other, thus, the package 12 having the sandwich structure as shown in FIG. 24 is produced. In contrast to the conventional art, no special bonding material is needed separately. The resonator-plate-side first bonding pattern 251 and the sealing-member-side first bonding pattern 321 themselves become the bonding material 11 formed upon the diffusion bonding. The resonator-plate-side second bonding pattern 252 and the sealing-member-side second bonding pattern 421 themselves become the bonding material 11 formed upon the diffusion bonding. In this embodiment, the diffusion bonding is performed at the room temperature (5 to 35° C.). However, the present invention is not limited thereto. The diffusion bonding may be performed at the temperature in the range from the room temperature to the temperature less than 230° C. In particular, when the diffusion bonding is performed at the temperature in the range from 200° C. to less than 230° C., which is less than the melting point of 230° C. of the Pb-free solder and furthermore not less than the recrystallization temperature (200° C.) of Au, it is possible to stabilize an unstable region of the bonding part. Also, in this embodiment, since the special bonding material such as Au—Sn is not used, the gas such as plating gas, binder gas and metal gas is not generated. Thus, the temperature can be equal to or more than the recrystallization temperature of Au.

As described above, in the package 12 produced here, the sealing-member-side first bonding pattern 321 is bonded to the resonator-plate-side first bonding pattern 251, and the sealing-member-side second bonding pattern 421 is bonded to the resonator-plate-side second bonding pattern 252, both by the diffusion bonding. Other than the above bonding, the sealing-member-side first bonding pattern 321 may be bonded to the resonator-plate-side first bonding pattern 251 by the pressurized diffusion bonding, and the sealing-member-side second bonding pattern 421 may be bonded to the resonator-plate-side second bonding pattern 252 by the pressurized diffusion bonding. In this case, it is possible to easily ensure the bonding part (to increase substantially the bonding area) due to pressurizing, accordingly, the bonding by only the diffusion bonding can be performed more suitably without the high-temperature heating.

Also, in the package 12 produced here, the first sealing member 3 and the crystal resonator plate 2 have a gap of not more than 1.00 μm. The second sealing member 4 and the crystal resonator plate 2 have a gap of not more than 1.00 μm. That is, the thickness of the bonding material 11 between the first sealing member 3 and the crystal resonator plate 2 is not more than 1.00 μm, and the thickness of the bonding material 11 between the second sealing member 4 and the crystal resonator plate 2 is not more than 1.00 μm (specifically, the thickness in the Au—Au bonding of this embodiment is 0.15 to 1.00 μm). As a comparative example, the conventional metal paste sealing material containing Sn has a thickness of 5 to 20 μm.

The thickness of the bonding pattern made by the diffusion bonding of the sealing-member-side first bonding pattern 321 and the resonator-plate-side first bonding pattern 251 is the same as the thickness of the bonding pattern made by the diffusion bonding of the sealing-member-side second bonding pattern 421 and the resonator-plate-side second bonding pattern 252, and is different from the thickness of the external terminals (the first connection terminal 433, the second connection terminal 434, the third connection terminal 435 and the fourth connection terminal 436) that are electrically connected to the outside.

As shown in FIG. 24, in the package 12 produced here, the internal space 13 is located so as to be deflected to the left side in plan view. Also, the sealing-member-side first bonding pattern 321 formed on the first sealing member 3 and the sealing-member-side second bonding pattern 421 formed on the second sealing member 4 are not superimposed to each other in plan view. Specifically, the region in the sealing-member-side first bonding pattern 321 in plan view is larger than the region in the sealing-member-side second bonding pattern 421 in plan view. In this embodiment, although the region in the sealing-member-side first bonding pattern 321 in plan view is larger than the region in the sealing-member-side second bonding pattern 421 in plan view, the present invention is not limited thereto. The region in the sealing-member-side second bonding pattern 421 in plan view may be larger than the region in the sealing-member-side first bonding pattern 321 in plan view. Since the external terminals (the first connection terminal 433, the second connection terminal 434, the third connection terminal 435 and the fourth connection terminal 436) are formed on the second sealing member 4, the region in the sealing-member-side first bonding pattern 321 in plan view is larger than the region in the sealing-member-side second bonding pattern 421 in plan view, accordingly, routing of the wiring pattern (ensuring the conduction path) becomes easy. Thus, the routing region of the wiring pattern (conduction-ensured region) can be increased.

Compared with the resonator-plate-side first bonding pattern 251 and the resonator-plate-side second bonding pattern 252 formed on the crystal resonator plate 2, the sealing-member-side first bonding pattern 321 formed on the first sealing member 3 and the sealing-member-side second bonding pattern 421 formed on the second sealing member 4 each have a large width.

In this embodiment, it is not necessary to ensure the space for mounting the IC 5 on the crystal resonator plate 2, thus, the height of the package can be reduced. Also, changing the pattern for the IC 5, the pattern provided on the first main surface of the first sealing member 3, is sufficient to be adapted to a desirable oscillation condition. Furthermore, a marking can be performed on the rear surface of the IC 5, thus the special marking is not needed even when the first sealing member 3 is made of a transparent material. In the conventional art, a recess is provided in the first sealing member 3, the crystal resonator plate 2 and the like, so that the oscillation circuit element is mounted on the recess without exception. Thus, the outline of the piezoelectric resonator device is necessarily larger than that of the oscillation circuit element. However, in the first sealing member 3 according to this embodiment, the IC 5 is provided on the first main surface 311, and the second main surface 312 is bonded to the first main surface 211 of the crystal resonator plate 2. Thus, the size of the IC 5 and the size of the crystal oscillator 102 can be the same, which is advantageous for the reduction in size and in height.

As described above, with the crystal oscillator 102 according to this embodiment, it is possible to avoid the generation of gas, and further to reduce the height or the size, as in the case of the crystal resonator 101 having the sandwich structure. Also, the same functions and effects are obtained by the common configuration with the crystal resonator 101 having the sandwich structure.

Compared with the resonator-plate-side first bonding pattern 251 and the resonator-plate-side second bonding pattern 252 formed on the crystal resonator plate 2, the sealing-member-side first bonding pattern 321 formed on the first sealing member 3 and the sealing-member-side second bonding pattern 421 formed on the second sealing member 4 each have a large width.

The present invention can be embodied in other forms without departing from the spirit, scope or essential characteristics thereof. The foregoing embodiments are therefore to be considered in all respects as illustrative and not restrictive. The scope of the present invention is indicated by the appended claims rather than by the foregoing description. Furthermore, all modifications and changes that come within the meaning and range of equivalency of the claims are intended to be embraced therein.

For example, in the crystal oscillator 102 according to this embodiment as described above, the four external terminals (the first connection terminal 433, the second connection terminal 434, the third connection terminal 435 and the fourth connection terminal 436) are provided. However, the present invention is not limited thereto. The present invention can also be applied to the configuration including the desirable number of external terminals such as six terminals or eight terminals.

—Second Embodiment of Crystal Oscillator—

Figure 31:
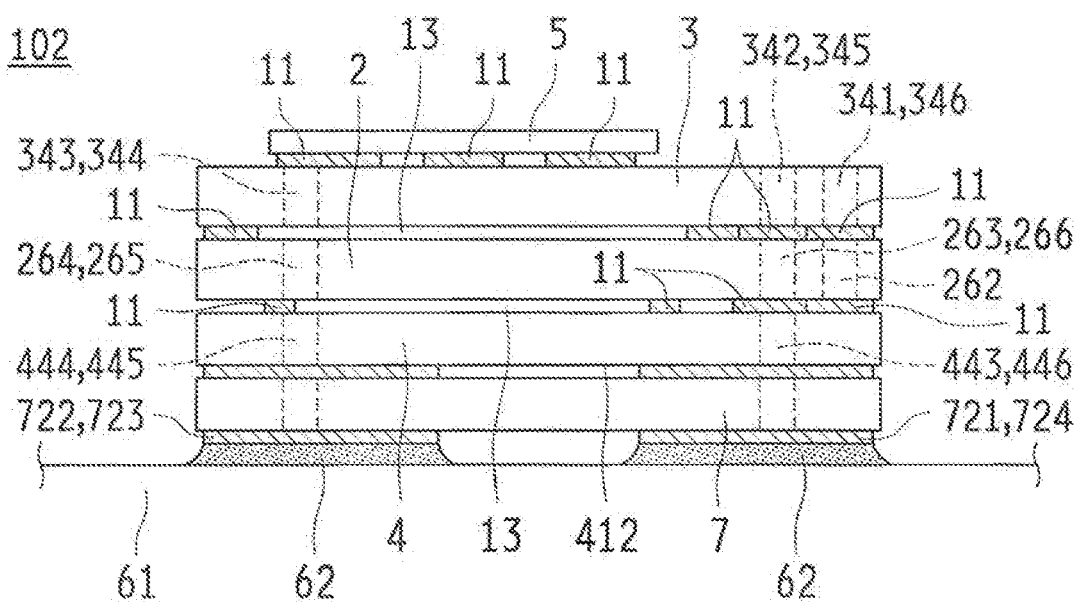
FIG. 31 is a schematic configuration diagram illustrating a configuration of the crystal oscillator according to a second embodiment of the present invention.

Next, the second embodiment of the crystal oscillator will be described. For the sake of convenience, the common configuration with the crystal oscillator of the first embodiment will be described with reference to the same drawings indicated in the first embodiment and with the same reference numerals. The crystal oscillator 102 according to this embodiment is electrically connected to the circuit board 61 and serves as a source of oscillation of the circuit board 61. As shown in FIG. 31, the crystal oscillator 102 includes: the crystal resonator plate 2 (a piezoelectric resonator plate in the present invention); the first sealing member 3 that covers the first excitation electrode 221 (see FIG. 27) of the crystal resonator plate 2 so as to hermetically seal the first excitation electrode 221 that is formed on the first main surface 211 of the crystal resonator plate 2; the second sealing member 4 disposed on the second main surface 212 of the crystal resonator plate 2 so as to cover the second excitation electrode 222 (see FIG. 28) of the crystal resonator plate 2, the second sealing member for hermetically sealing the second excitation electrode 222 that makes a pair with the first excitation electrode 221; and an electronic component element (the IC 5 in this embodiment), which is other than the piezoelectric resonator element mounted on the first sealing member.

In the crystal oscillator 102, the crystal resonator plate 2 is bonded to the first sealing member 3, and also the crystal resonator plate 2 is bonded to the second sealing member 4. Thus, the package 12 having the sandwich structure is constituted. The internal space 13 of the package 12 is formed by bonding the first sealing member 3 to the second sealing member 4 via the crystal resonator plate 2. In this internal space 13 of the package 12, the vibrating part 23 is hermetically sealed. The vibrating part 23 includes the first excitation electrode 221 and the second excitation electrode 222 respectively formed on both main surfaces 211 and 212 of the crystal resonator plate 2. As shown in FIG. 31, the internal space 13 is located so as to be deflected to one end side (left side) in plan view of the package 12. The function unit 7 is provided in the package 12 having the sandwich structure, whereby, the function extension type crystal oscillator 102 is constituted.

The crystal oscillator 102 according to this embodiment has a package size of 1.2×1.0 mm, which is reduced in size and height. According to the size reduction, no castellation is formed in the package 12. The through holes (the fourth through hole 262 to the eighteenth through hole 446) are used for conduction between electrodes.

Next, the configuration of the above-described crystal oscillator 102 will be described referring to FIGS. 25 to 29, 31 and 32. Here, each member constituting the crystal oscillator 102 will be described as a single body without bonded.

As shown in FIGS. 27 and 28, the crystal resonator plate 2 is made of a crystal substrate as a piezoelectric material. Both main surfaces (the first main surface 211 and the second main surface 212) are formed as smooth flat surfaces (mirror-finished).

A pair of excitation electrodes (i.e., excitation electrodes making a pair with each other, that is, the first excitation electrode 221 and the second excitation electrode 222) is formed, respectively, on both main surfaces 211 and 212 (the first main surface 211 and the second main surface 212) of the crystal resonator plate 2. Also, in both main surfaces 211 and 212, two cut-out parts 24 (each having a penetration shape) are formed so as to surround the pair of first excitation electrode 221 and second excitation electrode 222, thus, the vibrating part 23 is formed. The cut-out parts 24 are constituted by the squared U-shaped part 241 in plan view (i.e., a part in plan view made up of three rectangles in plan view: one rectangle; and two rectangles extending from both ends of the one rectangle in the direction perpendicular to the longitudinal direction of the one rectangle), and the oblong rectangular shaped part 242 in plan view. A part between the squared U-shaped part 241 in plan view and the oblong rectangular shaped part 242 in plan view serves as the conduction path 213 on which are disposed the extraction electrodes (the first extraction electrode 223 and the second extraction electrode 224) for extracting the first excitation electrode 221 and the second excitation electrode 222 to the external terminals of the function unit 7. Regarding the electrode patterns, the first extraction electrode 223 and the second extraction electrode 224 extracted respectively from the pair of first excitation electrode 221 and second excitation electrode 222 are electrically connected to the electrodes patterns 33 formed on the first sealing member 3, via the resonator-plate-side first bonding pattern 251 and the resonator-plate-side second bonding pattern 252.

In the crystal resonator plate 2, the respective resonator-plate-side sealing parts 25 to be bonded to the first sealing member 3 and to the second sealing member 4 are provided on outward positions along the vibrating part 23 of both main surfaces 211 and 212, so that the vibrating part 23 is surrounded. As shown in FIGS. 27 and 28, the resonator-plate-side sealing parts 25 are located so as to be deflected to the left side in plan view of both main surfaces 211 and 212.

On the resonator-plate-side sealing part 25 on the first main surface 211 of the crystal resonator plate 2, the resonator-plate-side first bonding pattern 251 is formed so as to be bonded to the first sealing member 3. The first excitation electrode 221 is connected to the resonator-plate-side first bonding pattern 251. The resonator-plate-side first bonding pattern 251 is constituted by the base PVD film 2511 deposited on the first main surface 211 by the physical vapor deposition, and the electrode PVD film 2512 deposited on the base PVD film 2511 by the physical vapor deposition. Also, on the resonator-plate-side sealing part 25 on the second main surface 212 of the crystal resonator plate 2, the resonator-plate-side second bonding pattern 252 is formed so as to be bonded to the second sealing member 4. The second excitation electrode 222 is connected to the resonator-plate-side second bonding pattern 252. The resonator-plate-side second bonding pattern 252 is constituted by the base PVD film 2521 deposited on the second main surface 212 by the physical vapor deposition, and the electrode PVD film 2522 deposited on the base PVD film 2521 by the physical vapor deposition. The physical vapor deposition is a kind of the dry plating. Unlike the wet plating such as electroplating and electroless plating, by such films deposited by the physical vapor deposition, it is possible to ensure the hermeticity and perform the diffusion bonding without the surface roughness. The internal space 13 is formed in the inward position (inside) of the resonator-plate-side first bonding pattern 251 and the resonator-plate-side second bonding pattern 252.

As described above, the resonator-plate-side first bonding pattern 251 and the resonator-plate-side second bonding pattern 252 have the same configuration in which a plurality of layers is laminated on the resonator-plate-side sealing part 25 of both main surfaces 211 and 212, specifically, a Ti layer (or a Cr layer) and an Au layer are deposited by the vapor deposition in this order from the lowermost layer side. Like this, in the resonator-plate-side first bonding pattern 251 and the resonator-plate-side second bonding pattern 252, the base PVD films 2511 and 2521 are made of a single material (Ti or Cr), the electrode PVD films 2512 and 2522 are made of a single material (Au), and the electrode PVD films 2512 and 2522 have a thickness greater than the thickness of the base PVD films 2511 and 2521. The first excitation electrode 221 and the resonator-plate-side first bonding pattern 251 both formed on the first main surface 211 of the crystal resonator plate 2 have the same thickness, and the surfaces (main surfaces) of the first excitation electrode 221 and the resonator-plate-side first bonding pattern 251 are made of the same metal. The second excitation electrode 222 and the resonator-plate-side second bonding pattern 252 both formed on the second main surface 212 of the crystal resonator plate 2 have the same thickness, and the surfaces (main surfaces) of the second excitation electrode 222 and the resonator-plate-side second bonding pattern 252 are made of the same metal. The resonator-plate-side first bonding pattern 251 and the resonator-plate-side second bonding pattern 252 do not contain Sn. Note that when the resonator-plate-side first and second bonding patterns 251 and 252 are compared with the resonator plate side (first excitation electrode 221 and the second excitation electrode 222) in the configuration in which they have the same thickness and their surfaces are made of the same metal on the same main surface, it is possible to perform bonding even when the kind or thickness of the base metals (the base PVD films 2511 and 2521) differs, under the condition in which the uppermost layers (at least exposed surfaces, i.e., the electrode PVD films 2512 and 2522 and the like) are made of the same metal. The electrode PVD films 2512 and 2522 of the resonator-plate-side first bonding pattern 251 and the sealing-member-side second bonding pattern 421 have respective scaly surfaces in plan view. Here, being scaly means a dense (or almost dense) state in plan view in which microscopically individual pieces of metal due to activation overlap with each other like a straw-mat.

As shown in FIGS. 27 and 28, the crystal resonator plate 2 includes the through holes (the fourth through hole 262, the fifth through hole 263, the sixth through hole 264, the seventh through hole 265 and the eighth through hole 266). The resonator-plate-side second bonding pattern 252 connected to the second excitation electrode 222 is extracted to the side of the first main surface 211 through the fourth through hole 262. The fifth through hole 263, which is connected to the tenth through hole 342 of the first sealing member 3 and to the fifteenth through hole 443 of the second sealing member 4, is a conduction path so that the IC 5 is conducted to the first external electrode terminal 721 via the first connection terminal 433 and the first internal electrode terminal 711. The sixth through hole 264, which is connected to the eleventh through hole 343 of the first sealing member 3 and to the sixteenth through hole 444 of the second sealing member 4, is a conduction path so that the IC 5 is conducted to the second external electrode terminal 722 via the second connection terminal 434 and the second internal electrode terminal 712. The seventh through hole 265, which is connected to the twelfth through hole 344 of the first sealing member 3 and to the seventeenth through hole 445 of the second sealing member 4, is a conduction path so that the IC 5 is conducted to the third external electrode terminal 723 via the third connection terminal 435 and the third internal electrode terminal 713. The eighth through hole 266, which is connected to the thirteenth through hole 345 of the first sealing member 3 and to the eighteenth through hole 446 of the second sealing member 4, is a conduction path so that the IC 5 is conducted to the fourth external electrode terminal 724 via the fourth connection terminal 436 and the fourth internal electrode terminal 714. The fourth through hole 262, the fifth through hole 263, the sixth through hole 264, the seventh through hole 265 and the eighth through hole 266 are formed in the outward position of the internal space 13. The fourth through hole 262, the fifth through hole 263, the sixth through hole 264, the seventh through hole 265 and the eighth through hole 266 are not formed in the inward position of the internal space 13. Here, the inward position of the internal space 13 means strictly the inner side of the inner peripheral surface of the bonding material 11, not including the position on the bonding material 11.

The first sealing member 3 is made of a material having the flexural rigidity (moment of inertia of area×Young's modulus) of not more than 1000 [N·mm$^2$]. Specifically, as shown in FIGS. 25 and 26, the first sealing member 3 is a substrate having a rectangular parallelepiped shape that is made of a single glass wafer. The second main surface 312 (the surface to be bonded to the crystal resonator plate 2) and the first main surface 311 (the surface on which the IC 5 is mounted) of the first sealing member 3 are formed as a smooth flat surface (mirror finished).

On the second main surface 312 of the first sealing member 3, the sealing-member-side first sealing part 32 is disposed so as to be bonded to the crystal resonator plate 2. As shown in FIG. 26, the sealing-member-side first sealing part 32 is located so as to be deflected to the left side in plan view of the second main surface 312 of the first sealing member 3.

On the sealing-member-side first sealing part 32 of the first sealing member 3, the sealing-member-side first bonding pattern 321 is formed so as to be bonded to the crystal resonator plate 2. The sealing-member-side first bonding pattern 321 has the same width at all positions on the sealing-member-side first sealing part 32 of the first sealing member 3.

The sealing-member-side first bonding pattern 321 is constituted by the base PVD film 3211 deposited on the first sealing member 3 by the physical vapor deposition, and the electrode PVD film 3212 deposited on the base PVD film 3211 by the physical vapor deposition. In this embodiment, the base PVD film 3211 is made of Ti (or Cr), and the electrode PVD film 3212 is made of Au. Also, the sealing-member-side first bonding pattern 321 does not contain Sn. Specifically, the sealing-member-side first bonding pattern 321 is made of a plurality of layers laminated on the sealing-member-side first sealing part 32 of the second main surface 312, that is, a Ti layer (or a Cr layer) and an Au layer are deposited by the vapor deposition in this order from the lowermost layer side. Furthermore, in the sealing-member-side first bonding pattern 321, the electrode PVD film 3212 has a scaly surface in plan view.

On the first main surface 311 of the first sealing member 3, six electrode patterns 33 are formed, which include mounting pads for mounting the IC 5 as an oscillation circuit element. These six electrode patterns 33 are led, respectively, to the ninth through hole 341, the tenth through hole 342, the eleventh through hole 343, the twelfth through hole 344, the thirteenth through hole 345 and the fourteenth through hole 346. The tenth through hole 342, the eleventh through hole 343, the twelfth through hole 344 and the thirteenth through hole 345 are the through holes for conduction of the oscillator. The ninth through hole 341 (the through hole for conduction of the second excitation electrode 222) and the fourteenth through hole 346 (the through hole for conduction of the first excitation electrode 221) are the through holes for conduction of the crystal resonator plate 2.

Figure 32:
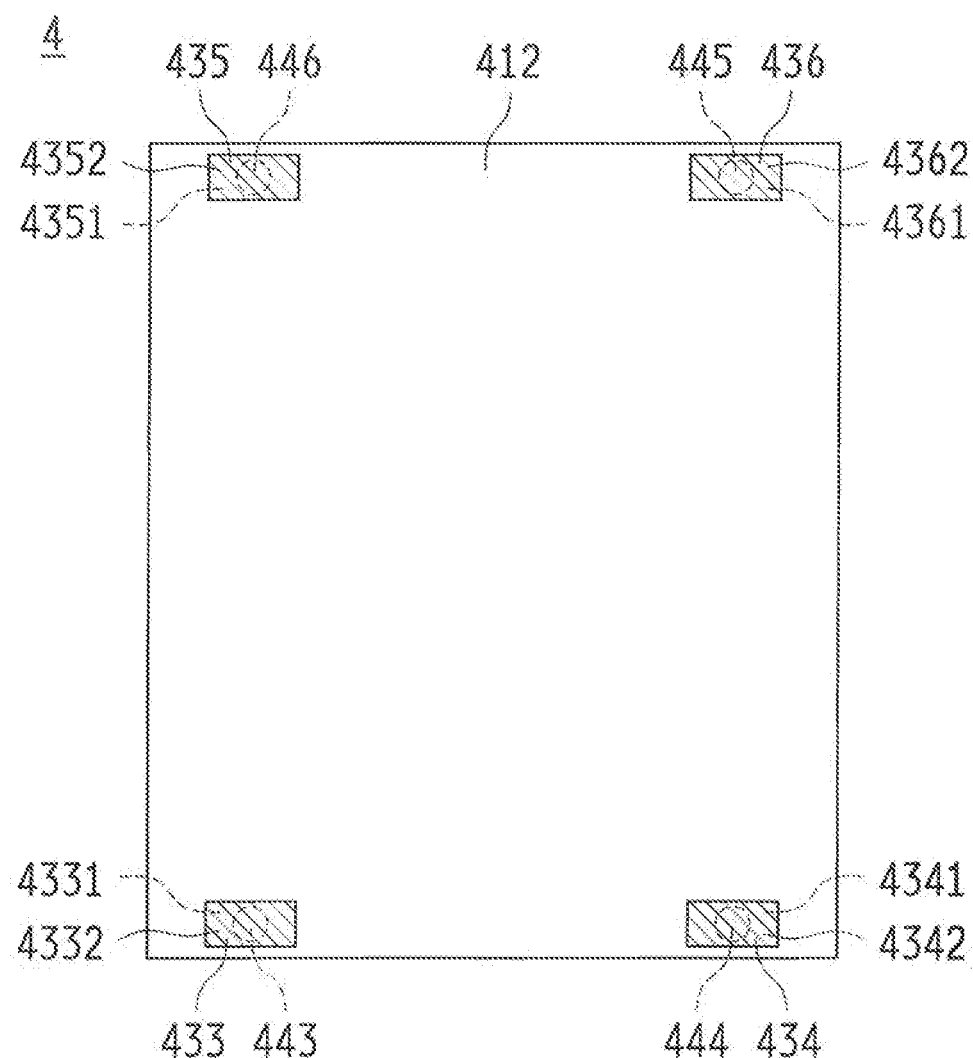
FIG. 32 is a schematic rear view illustrating the second sealing member according to the second embodiment of the crystal oscillator of the present invention.

The second sealing member 4 is made of a material having the flexural rigidity (moment of inertia of area× Young's modulus) of not more than 1000 [N·mm²]. Specifically, as shown in FIGS. 29 and 32, the second sealing member 4 is a substrate having a rectangular parallelepiped shape that is made of a single glass wafer. The first main surface 411 (the surface to be bonded to the crystal resonator plate 2) of the second sealing member 4 is formed as a smooth flat surface (mirror finished).

On the first main surface 411 of the second sealing member 4, the sealing-member-side second sealing part 42 is disposed so as to be bonded to the crystal resonator plate 2. As shown in FIG. 29, the sealing-member-side second sealing part 42 is located so as to be deflected to the left side in plan view of the first main surface 411 of the second sealing member 4.

Also, four connection terminals (the first connection terminal 433, the second connection terminal 434, the third connection terminal 435 and the fourth connection terminal 436) are formed on the second main surface 412 (the outer main surface not facing the crystal resonator plate 2) of the second sealing member 4. The four connection terminals (the first connection terminal 433, the second connection terminal 434, the third connection terminal 435 and the fourth connection terminal 436) are electrically connectable to the function unit (see FIGS. 33 and 34) on which are formed the external terminals that are directly bonded to the circuit board 61. The first connection terminal 433, the second connection terminal 434, the third connection terminal 435 and the fourth connection terminal 436 are formed respectively on the four corners. The connection terminals (the first connection terminal 433, the second connection terminal 434, the third connection terminal 435 and the fourth connection terminal 436) are constituted by the base PVD films 4331, 4341, 4351 and 4361 deposited on the second main surface 412 by the physical vapor deposition, and the electrode PVD films 4332, 4342, 4352 and 4362 deposited on the base PVD films 4331, 4341, 4351 and 4361 by the physical vapor deposition. The base PVD films 4331, 4341, 4351 and 4361 of the connection terminals (the first connection terminal 433, the second connection terminal 434, the third connection terminal 435 and the fourth connection terminal 436) have the same thickness as the base PVD films 2511, 2521, 3211 and 4211 of the above-described resonator-plate-side first bonding pattern 251, the resonator-plate-side second bonding pattern 252, the sealing-member-side first bonding pattern 321 and the sealing-member-side second bonding pattern 421.

On the sealing-member-side second sealing part 42 of the second sealing member 4, the sealing-member-side second bonding pattern 421 is formed so as to be bonded to the crystal resonator plate 2. The sealing-member-side second bonding pattern 421 has the same width at all positions on the sealing-member-side second sealing part 42 of the second sealing member 4.

The sealing-member-side second bonding pattern 421 is constituted by the base PVD film 4211 deposited on the second sealing member 4 by the physical vapor deposition, and the electrode PVD film 4212 deposited on the base PVD film 4211 by the physical vapor deposition. In this embodiment, the base PVD film 4211 is made of Ti (or Cr), and the electrode PVD film 4212 is made of Au. Also, the sealing-member-side second bonding pattern 421 does not contain Sn. Specifically, the sealing-member-side second bonding pattern 421 is made of a plurality of layers laminated on the sealing-member-side second sealing part 42 of the second main surface 412, that is, a Ti layer (or a Cr layer) and an Au layer are deposited by the vapor deposition in this order from the lowermost layer side. Furthermore, in the sealing-member-side second bonding pattern 421, the electrode PVD film 4212 has a scaly surface in plan view.

Figure 33:
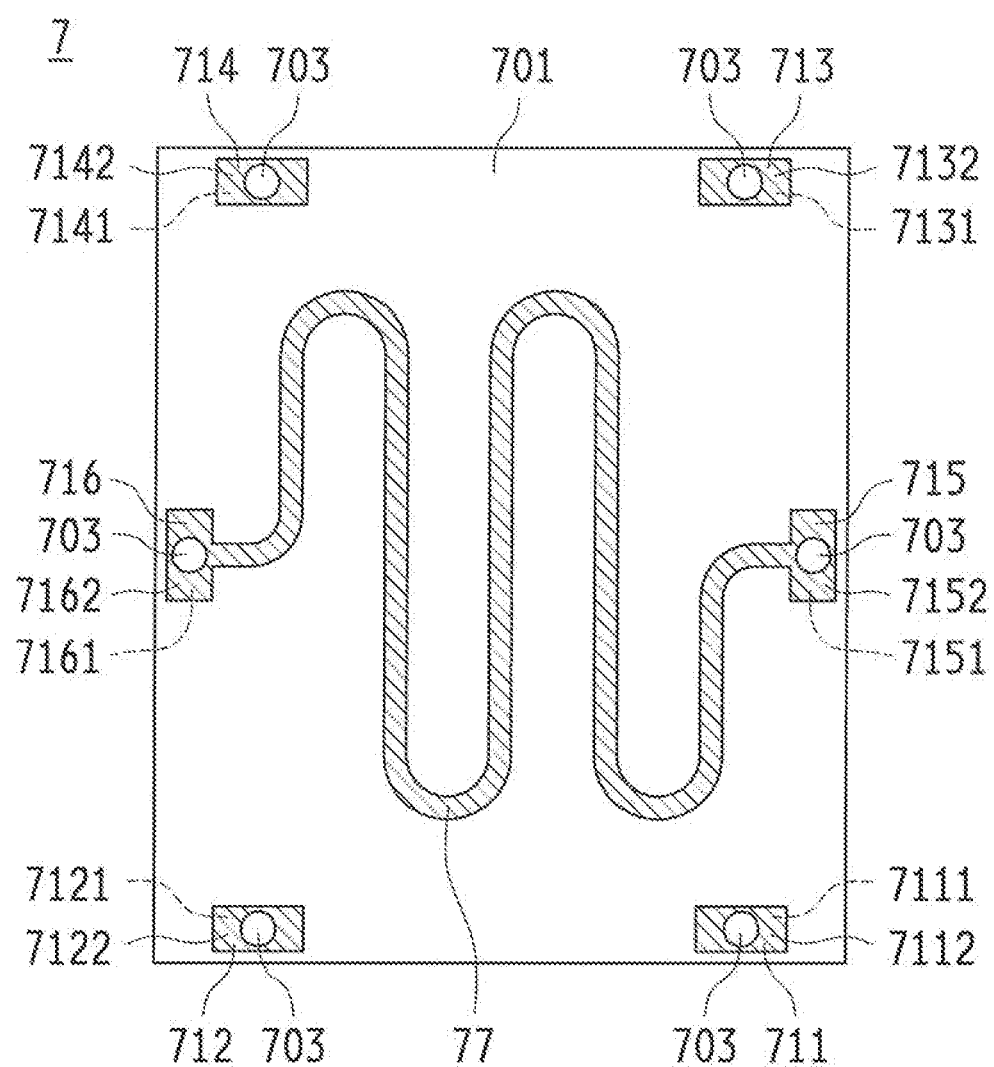
FIG. 33 is a schematic plan view illustrating a function unit of the crystal oscillator of the present invention.

In the second sealing member 4, as shown in FIGS. 31 to 33, the four through holes (the fifteenth through hole 443, the sixteenth through hole 444, the seventeenth through hole 445 and the eighteenth through hole 446) are formed. The fifteenth through hole 443, the sixteenth through hole 444, the seventeenth through hole 445 and the eighteenth through hole 446 are disposed in the outward position of the internal space 13, not disposed in the inward position of the internal space 13.

In the crystal oscillator 102 having the above configuration, the crystal resonator plate 2 and the first sealing member 3 are subjected to the diffusion bonding in a state in which the resonator-plate-side first bonding pattern 251 and the sealing-member-side first bonding pattern 321 are overlapped with each other, and the crystal resonator plate 2 and the second sealing member 4 are subjected to the diffusion bonding in a state in which the resonator-plate-side second bonding pattern 252 and the sealing-member-side second bonding pattern 421 are overlapped with each other, thus, the package 12 having the sandwich structure as shown in FIG. 31 is produced. In contrast to the conventional art, no special bonding material is needed separately. The resonator-plate-side first bonding pattern 251 and the sealing-member-side first bonding pattern 321 themselves become the bonding material 11 formed upon the diffusion bonding. The resonator-plate-side second bonding pattern 252 and the sealing-member-side second bonding pattern 421 themselves become the bonding material 11 formed upon the diffusion bonding. In this embodiment, the diffusion bonding is performed at the room temperature (5 to 35° C.). However, the present invention is not limited thereto. The diffusion bonding may be performed at the temperature in the range from the room temperature to the temperature less than 230° C. In particular, when the diffusion bonding is performed at the temperature in the range from 200° C. to less than 230° C., which is less than the melting point of 230° C. of the Pb-free solder and furthermore not less than the recrystallization temperature (200° C.) of Au, it is possible to stabilize an unstable region of the bonding part. Also, in this embodiment, since the special bonding material such as Au—Sn is not used, the gas such as plating gas, binder gas and metal gas is not generated. Thus, the temperature can be equal to or more than the recrystallization temperature of Au.

As described above, in the package 12 produced here, the sealing-member-side first bonding pattern 321 is bonded to the resonator-plate-side first bonding pattern 251, and the sealing-member-side second bonding pattern 421 is bonded to the resonator-plate-side second bonding pattern 252, both by the diffusion bonding. Other than the above bonding, the sealing-member-side first bonding pattern 321 may be bonded to the resonator-plate-side first bonding pattern 251 by the pressurized diffusion bonding, and the sealing-member-side second bonding pattern 421 may be bonded to the resonator-plate-side second bonding pattern 252 by the pressurized diffusion bonding. In this case, it is possible to easily ensure the bonding part (to increase substantially the bonding area) due to pressurizing, accordingly, the bonding by only the diffusion bonding may be performed more suitably without the high-temperature heating.

Also, in the package 12 produced here, the first sealing member 3 and the crystal resonator plate 2 have a gap of not more than 1.00 μm. The second sealing member 4 and the crystal resonator plate 2 have a gap of not more than 1.00 μm. That is, the thickness of the bonding material 11 between the first sealing member 3 and the crystal resonator plate 2 is not more than 1.00 μm, and the thickness of the bonding material 11 between the second sealing member 4 and the crystal resonator plate 2 is not more than 1.00 μm (specifically, the thickness in the Au—Au bonding of this embodiment is 0.15 to 1.00 μm). As a comparative example, the conventional metal paste sealing material containing Sn has a thickness of 5 to 20 μm.

As shown in FIG. 31, in the package 12 produced here, the internal space 13 is located so as to be deflected to the left side in plan view. Also, the sealing-member-side first bonding pattern 321 formed on the first sealing member 3 and the sealing-member-side second bonding pattern 421 formed on the second sealing member 4 are not superimposed to each other in plan view. Specifically, the region in the sealing-member-side first bonding pattern 321 in plan view is larger than the region in the sealing-member-side second bonding pattern 421 in plan view. In this embodiment, although the region in the sealing-member-side first bonding pattern 321 in plan view is larger than the region in the sealing-member-side second bonding pattern 421 in plan view, the present invention is not limited thereto. The region in the sealing-member-side second bonding pattern 421 in plan view may be larger than the region in the sealing-member-side first bonding pattern 321 in plan view. Since the connection terminals (the first connection terminal 433, the second connection terminal 434, the third connection terminal 435 and the fourth connection terminal 436) are formed on the second sealing member 4, the region in the sealing-member-side first bonding pattern 321 in plan view is larger than the region in the sealing-member-side second bonding pattern 421 in plan view, accordingly, routing of the wiring pattern (ensuring the conduction path) becomes easy. Thus, the routing region of the wiring pattern (conduction-ensured region) can be increased.

Compared with the resonator-plate-side first bonding pattern 251 and the resonator-plate-side second bonding pattern 252 formed on the crystal resonator plate 2, the sealing-member-side first bonding pattern 321 formed on the first sealing member 3 and the sealing-member-side second bonding pattern 421 formed on the second sealing member 4 each have a large width.

In this embodiment, it is not necessary to ensure the space for mounting the IC 5 on the crystal resonator plate 2, thus, the height of the package can be reduced. Also, changing the pattern for the IC 5, the pattern provided on the first main surface 311 of the sealing member 3, is sufficient to be adapted to a desirable oscillation condition. Furthermore, a marking can be performed on the rear surface of the IC 5, thus the special marking is not needed even when the first sealing member 3 is made of a transparent material. In the conventional art, a recess is provided in the first sealing member 3, the crystal resonator plate 2 and the like, so that the IC 5 is mounted on the recess without exception. Thus, the outline of the piezoelectric resonator device is necessarily larger than that of the IC 5. However, in the first sealing member 3 according to this embodiment, the IC 5 is provided on the first main surface 311, and the second main surface 312 is bonded to the first main surface 211 of the crystal resonator plate 2. Thus, the size of the IC 5 and the size of the crystal oscillator 102 can be the same, which is advantageous for the reduction in size and in height.

Compared with the resonator-plate-side first bonding pattern 251 and the resonator-plate-side second bonding pattern 252 formed on the crystal resonator plate 2, the sealing-member-side first bonding pattern 321 formed on the first sealing member 3 and the sealing-member-side second bonding pattern 421 formed on the second sealing member 4 each have a large width.

In this embodiment, the function unit 7 (see FIGS. 33 and 34) is provided on the package 12 produced as described above. On the function unit 7, the external terminals (the first external electrode terminal 721, the second external electrode terminal 722, the third external electrode terminal 723, the fourth external electrode terminal 724, a fifth external electrode terminal 725 and a sixth external electrode terminal 726) to be directly bonded to the circuit board 61 are formed. Thus, depending on the element mounted on the function unit 7, the crystal oscillator 102 for various purposes (the function extension type crystal oscillator 102) is produced. Specifically, the second sealing member 4 and the function unit 7 are subjected to the diffusion bonding in a state in which the connection terminals (the first connection terminal 433, the second connection terminal 434, the third connection terminal 435 and the fourth connection terminal 436) are overlapped with the respective internal electrode terminals (the first internal electrode terminal 711, the second internal electrode terminal 712, the third internal electrode terminal 713 and the fourth internal electrode terminal 714), so that the function extension type crystal oscillator 102 is produced. Then, as shown in FIG. 31, the function extension type crystal oscillator 102 is directly bonded to the circuit board 61 using the flowable conductive bonding material 62, thus the elements respectively mounted on the crystal resonator 101, the IC 5 and the function unit 7 are electrically connected to the circuit board 61. In the function extension type crystal oscillator 102 produced here, the second sealing member 4 and the function unit 7 have a gap of not more than 1.00 μm (specifically, the gap in the Au—Au bonding of this embodiment is 0.15 to 1.00 μm). As a comparative example, the conventional metal paste sealing material containing Sn has a thickness of 5 to 20 μm.

As shown in FIG. 33, the first main surface 701 (the inner main surface facing the vibrating part 23) of the function unit 7 includes: the internal electrode terminals (the first internal electrode terminal 711, the second internal electrode terminal 712, the third internal electrode terminal 713 and the fourth internal electrode terminal 714) that are directly bonded to the connection terminals (the first connection terminal 433, the second connection terminal 434, the third connection terminal 435 and the fourth connection terminal 436) formed on the second sealing member 4, and that are electrically connected to the second sealing member 4; and a fifth internal electrode terminal 715 and a sixth internal electrode terminal 716 that are connected to elements (e.g. a heater element, a temperature control element and L-element). The first internal electrode terminal 711 is electrically connected, directly, to the first connection terminal 433, the second internal electrode terminal 712 is electrically connected, directly, to the second connection terminal 434, the third internal electrode terminal 713 is electrically connected, directly, to the third connection terminal 435, and the fourth internal electrode terminal 714 is electrically connected, directly, to the fourth connection terminal 436. The internal electrode terminals (the first internal electrode terminal 711, the second internal electrode terminal 712, the third internal electrode terminal 713, the fourth internal electrode terminal 714, the fifth internal electrode terminal 715 and the sixth internal electrode terminal 716) are constituted by the base PVD films 7111, 7121, 7131, 7141, 7151 and 7161 deposited on the first main surface 701 by the physical vapor deposition, and the electrode PVD films 7112, 7122, 7132, 7142, 7152 and 7162 deposited on the base PVD films 7111, 7121, 7131, 7141, 7151 and 7161 by the physical vapor deposition. The base PVD films 7111, 7121, 7131, 7141, 7151 and 7161 of the internal electrode terminals (the first internal electrode terminal 711, the second internal electrode terminal 712, the third internal electrode terminal 713, the fourth internal electrode terminal 714, the fifth internal electrode terminal 715 and the sixth internal electrode terminal 716) have the same thickness as the base PVD films 2511, 2521, 3211, 4211, 4331, 4341, 4351 and 4361 of the above-described resonator-plate-side first bonding pattern 251, the resonator-plate-side second bonding pattern 252, the sealing-member-side first bonding pattern 321, the sealing-member-side second bonding pattern 421 and the connection terminals (the first connection terminal 433, the second connection terminal 434, the third connection terminal 435 and the fourth connection terminal 436).

Figure 34:
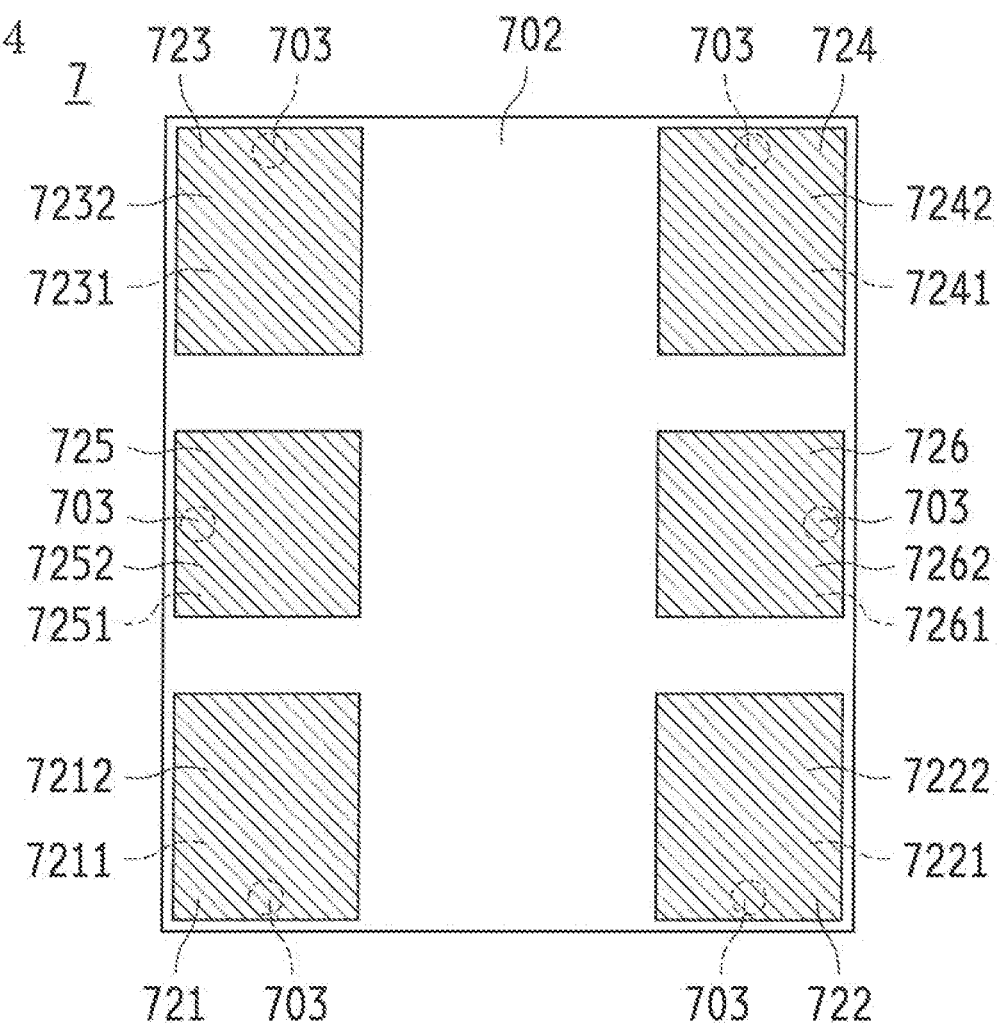
FIG. 34 is a schematic rear view illustrating the function unit of the crystal oscillator of the present invention.

As shown in FIG. 34, the second main surface 702 (the outer main surface not facing the vibrating part 23) of the function unit 7 includes six external terminals (the first external electrode terminal 721, the second external electrode terminal 722, the third external electrode terminal 723, the fourth external electrode terminal 724, the fifth external electrode terminal 725 and the sixth external electrode terminal 726) that are directly bonded and electrically connected to the circuit board 61. The first external electrode terminal 721 is electrically connected, directly, to the first internal electrode terminal 711 through the function part through hole 703. The second external electrode terminal 722 is electrically connected, directly, to the second internal electrode terminal 712 through the function part through hole 703. The third external electrode terminal 723 is electrically connected, directly, to the third internal electrode terminal 713 through the function part through hole 703. The fourth external electrode terminal 724 is electrically connected, directly, to the fourth internal electrode terminal 714 through the function part through hole 703. The fifth external electrode terminal 725 is electrically connected, directly, to the fifth internal electrode terminal 715 through the function part through hole 703. The sixth external electrode terminal 726 is electrically connected, directly, to the sixth internal electrode terminal 716 through the function part through hole 703. The six external electrode terminals (the first external electrode terminal 721, the second external electrode terminal 722, the third external electrode terminal 723, the fourth external electrode terminal 724, the fifth external electrode terminal 725 and the sixth external electrode terminal 726) are constituted by the base PVD films 7211, 7221, 7231, 7241, 7251 and 7261 deposited on the second main surface 702 by the physical vapor deposition, and electrode PVD films 7212, 7222, 7232 7242, 7252 and 7262 deposited on the base PVD films 7211, 7221, 7231, 7241, 7251 and 7261 by the physical vapor deposition. Compared with the base PVD films 2511, 2521, 3211, 4211, 4331, 4341, 4351, 4361, 7111, 7121, 7131, 7141, 7151 and 7161 of the above-described resonator-plate-side first bonding pattern 251, the resonator-plate-side second bonding pattern 252, the sealing-member-side first bonding pattern 321, the sealing-member-side second bonding pattern 421, the connection terminals (the first connection terminal 433, the second connection terminal 434, the third connection terminal 435 and the fourth connection terminal 436) and the internal electrode terminals (the first internal electrode terminal 711, the second internal electrode terminal 712, the third internal electrode terminal 713, the fourth internal electrode terminal 714, the fifth internal electrode terminal 715 and the sixth internal electrode terminal 716), the base PVD films 7211, 7221, 7231, 7241, 7251 and 7261 of the external terminals (the first external electrode terminal 721, the second external electrode terminal 722, the third external electrode terminal 723, the fourth external electrode terminal 724, the fifth external electrode terminal 725 and the sixth external electrode terminal 726) have a great thickness.

In the package 12, the thickness of the bonding pattern made by the diffusion bonding of the sealing-member-side first bonding pattern 321 and the resonator-plate-side first bonding pattern 251 is the same as the thickness of the bonding pattern made by the diffusion bonding of the sealing-member-side second bonding pattern 421 and the resonator-plate-side second bonding pattern 252, and is different from the thickness of the external terminals (the first external electrode terminal 721, the second external electrode terminal 722, the third external electrode terminal 723, the fourth external electrode terminal 724, the fifth external electrode terminal 725 and the sixth external electrode terminal 726) that are electrically connected to the outside. The external terminals (the first external electrode terminal 721, the second external electrode terminal 722, the third external electrode terminal 723, the fourth external electrode terminal 724, the fifth external electrode terminal 725 and the sixth external electrode terminal 726) have a thickness greater than the other patterns.

In the function unit 7 in FIGS. 33 and 34, the heater part 77 including the heater element is provided. The heater part 77 is made of an electrode film snaking on the first main surface 701 of the function unit 7. A one end of the electrode film of the heater part 77 is electrically connected to the fifth internal electrode terminal 715. The other end of the heater part 77 is electrically connected to the sixth internal electrode terminal 716. With the function unit 7, the crystal oscillator can have properties intermediate between a temperature compensated crystal oscillator (TCXO) and an oven controlled crystal oscillator (OCXO). The heater part 77 of this embodiment has the shape snaking between the internal electrode terminals. However, the shape of the heater part 77 is not limited thereto. It may have a rectangular shape over the substantially entire surface of the first main surface 701.

As described above, on the function unit 7 in FIGS. 33 and 34, the heater part 77 including the heater element is provided. However, the function unit 7 is not limited to the configuration including the heater part 77, provided that it provides a certain function and includes an external terminal. For example, the function unit 7 can provide the same functions and effects when it includes the temperature measuring element part 73 (see FIG. 13) or the L-element inductance part 74 (see FIGS. 19 and 20) as described above, or when the function unit 7 is an epoxy substrate or a glass substrate. Furthermore, in the crystal oscillator 102, the function unit 7 may be a ceramic substrate. In this case, when the function extension type crystal oscillator 102 is bonded to the circuit board 61 via the flowable conductive bonding material 62, creeping-up of the flowable conductive bonding material 62 is confirmed.

In the crystal oscillator 102 according to this embodiment, the six external terminals (the first external electrode terminal 721, the second external electrode terminal 722, the third external electrode terminal 723, the fourth external electrode terminal 724, the fifth external electrode terminal 725 and the sixth external electrode terminal 726) are provided. However, the present invention is not limited thereto. The present invention may be applied to the configuration including the desirable number of external terminals such as four terminals or eight terminals.

Figure 35:
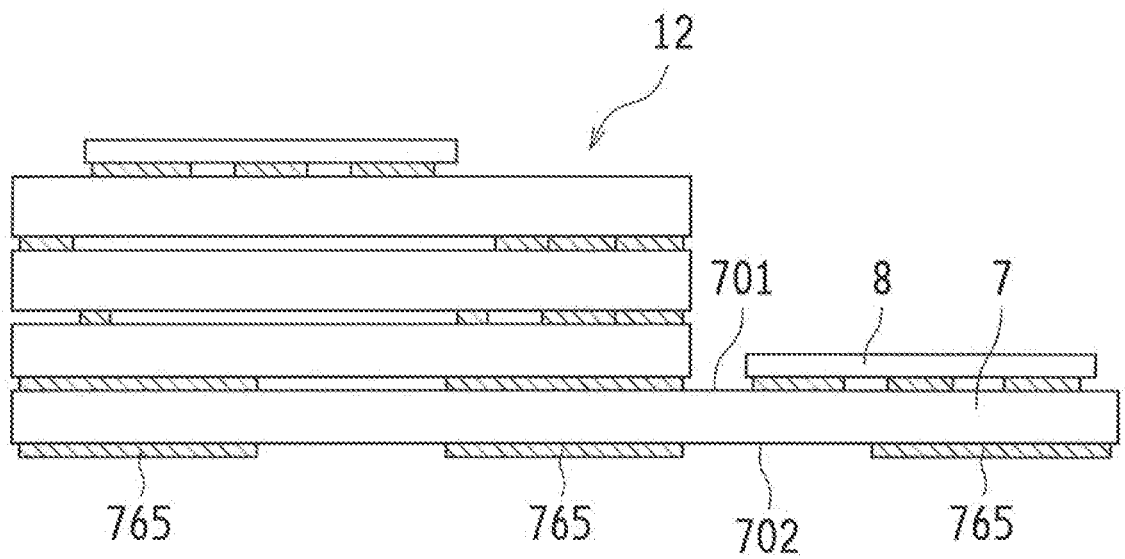
FIG. 35 is a schematic configuration diagram illustrating a variation of the function unit of the crystal oscillator of the present invention.
Figure 36:
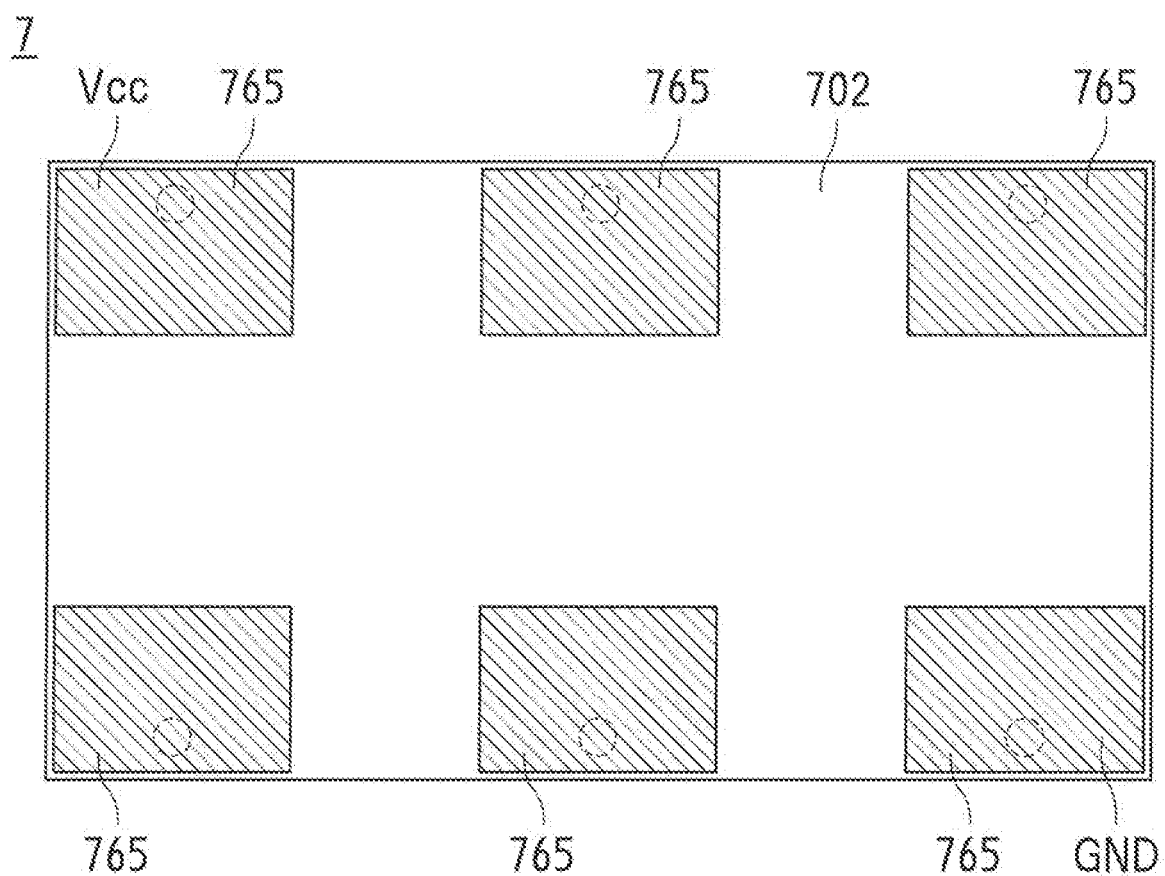
FIG. 36 is a schematic rear view illustrating the variation of the function unit of the crystal oscillator of the present invention.

Furthermore, in another particular example as shown in FIGS. 35 and 36, six external electrode terminals 765 may be formed on the second main surface 702 of the function unit 7. To the first main surface 701 of the function unit 7, the package 12 may be bonded, and furthermore, a desirable electronic component element 8 may be bonded so as to be adjacent to the package 12. A thermistor may be used as the electronic component element 8, to which a temperature compensation circuit may be added. Also, the package 12 constituted by the first sealing member 3, the second sealing member 4 and the crystal resonator plate 2 is used as the electronic component element 8 so as to use a plurality of timing devices. In this case, a plurality of packages 12 can be mounted on the single substrate (the function unit 7), thus, as shown in FIG. 29, it is possible to share the external electrode terminal 765 for Vcc and for GND. Thus, high-density packaging can be realized.

As described above, the crystal oscillator 102 according to this embodiment can provide the same functions and effects as those of the crystal resonator 101 having the sandwich structure. That is, the crystal oscillator 102 according to this embodiment can be adapted to various purposes such as a voltage controlled crystal oscillator (VCXO), a simple package crystal oscillator (SPXO), a temperature compensated crystal oscillator (TCXO) and an oven controlled crystal oscillator (OCXO). In this way the crystal oscillator 102 can have a desirable function such as the VCXO, the SPXO, the TCXO and the OCXO, which results in a high degree of freedom in function of the crystal oscillator 102.

Also, the IC 5 is provided on the first main surface 311 of the first sealing member 3 while the sealing-member-side first bonding pattern 321 is formed on the second main surface 312 of the first sealing member 3. Thus, it is possible to simplify the patterning of the oscillation circuit pattern routed from the IC 5 without forming the sealing-member-side first bonding pattern 321 on the first main surface 311. Thus, it is possible to mount the IC 5 having various properties. Also, such a simplification of the routing of the IC 5 and the oscillation circuit pattern can contribute to the height reduction. In particular, the conventional package structure requires a package whose size in plan view is larger than the size in plan view of the oscillation circuit element. In contrast, in this embodiment, the package may have the equivalent size in plan view of the size of the IC 5, which results in the size reduction. Furthermore, only the change in the patterning of the oscillation circuit pattern is sufficient to mount the IC 5 having various properties. Thus, when various kinds of piezoelectric resonator device to be adapted to various purposes are produced, it is possible to contribute to the reduction of the production cost.

Since the first sealing member 3, the second sealing member 4 and the crystal resonator plate 2 are made of the transparent member, generally the marking cannot be performed. However, here, since the IC 5 is provided on the first main surface 311 of the first sealing member 3, the marking can be performed using the IC 5.

The present invention can be embodied in other forms without departing from the spirit, scope or essential characteristics thereof. The foregoing embodiments are therefore to be considered in all respects as illustrative and not restrictive. The scope of the present invention is indicated by the appended claims rather than by the foregoing description. Furthermore, all modifications and changes that come within the meaning and range of equivalency of the claims are intended to be embraced therein.

For example, in the above-described two embodiments, the piezoelectric resonator device having the sandwich structure is used. However, the present invention is not limited to the piezoelectric resonator device having the sandwich structure. The present invention can also be applied to a piezoelectric resonator device having a package structure constituted by a lid and a base for hermetically sealing the piezoelectric resonator plate.

This application claims priority based on Patent Application No. 2013-264219 filed in Japan on Dec. 20, 2013, Patent Application No. 2013-265924 filed in Japan on Dec. 24, 2013, and Patent Application No. 2014-008801 filed in Japan on Jan. 21, 2014. The entire contents thereof are hereby incorporated in this application by reference.

INDUSTRIAL APPLICABILITY

The present invention is suitable for a crystal resonator device (such as a crystal resonator and a crystal oscillator) using a crystal for the material of a substrate of a piezoelectric resonator plate.

DESCRIPTION OF REFERENCE NUMERALS

101 Crystal resonator
102 Crystal oscillator
11 Bonding material
12 Package
13 Internal space
2 Crystal resonator plate
211 First main surface 212 Second main surface
213 Conduction path
221 First excitation electrode
222 Second excitation electrode
223 First extraction electrode
224 Second extraction electrode
23 Vibrating part
24 Cut-out part
241 Squared U-shaped part in plan view
242 Oblong rectangular shaped part in plan view
25 Resonator-plate-side sealing part
251 Resonator-plate-side first bonding pattern
2511 Base PVD film
2512 Electrode PVD film
252 Resonator-plate-side second bonding pattern
2521 Base PVD film
2522 Electrode PVD film
261 First through hole
262 Fourth through hole
263 Fifth through hole
264 Sixth through hole
265 Seventh through hole
266 Eighth through hole
3 First sealing member
311 First main surface
312 Second main surface
32 Sealing-member-side first sealing part
321 Sealing-member-side first bonding pattern
3211 Base PVD film
3212 Electrode PVD film
33 Electrode pattern
341 Ninth through hole
342 Tenth through hole
343 Eleventh through hole
344 Twelfth through hole
345 Thirteenth through hole
346 Fourteenth through hole
4 Second sealing member
411 First main surface
412 Second main surface
42 Sealing-member-side second sealing part
421 Sealing-member-side second bonding pattern
4211 Base PVD film
4212 Electrode PVD film
431 First connection terminal
4311 Base PVD film
4312 Electrode PVD film
432 Second connection terminal
4321 Base PVD film
4322 Electrode PVD film
433 First connection terminal
4331 Base PVD film
4332 Electrode PVD film
434 Second connection terminal
4341 Base PVD film
4342 Electrode PVD film
435 Third connection terminal
4351 Base PVD film
4352 Electrode PVD film
436 Fourth connection terminal
4361 Base PVD film
4362 Electrode PVD film
441 Second through hole
442 Third through hole
443 Fifteenth through hole
444 Sixteenth through hole
445 Seventeenth through hole
446 Eighteenth through hole
5 IC
61 Circuit board
62 Flowable conductive bonding material
7 Function unit
701 First main surface
702 Second main surface
703 Function part through hole
711 First internal electrode terminal
7111 Base PVD film
7112 Electrode PVD film
712 Second internal electrode terminal
7121 Base PVD film
7122 Electrode PVD film
713 Third internal electrode terminal
7131 Base PVD film
7132 Electrode PVD film
714 Fourth internal electrode terminal
7141 Base PVD film
7142 Electrode PVD film
715 Fifth internal electrode terminal
7151 Base PVD film
7152 Electrode PVD film
716 Sixth internal electrode terminal
7161 Base PVD film
7162 Electrode PVD film
721 First external electrode terminal
7211 Base PVD film
7212 Electrode PVD film
722 Second external electrode terminal
7221 Base PVD film
7222 Electrode PVD film
723 Third external electrode terminal
7231 Base PVD film
7232 Electrode PVD film
724 Fourth external electrode terminal
7241 Base PVD film
7242 Electrode PVD film
725 Fifth external electrode terminal
7251 Base PVD film
7252 Electrode PVD film
726 Sixth external electrode terminal
7261 Base PVD film
7262 Electrode PVD film
73 Temperature measuring element part
74 Inductance part
741 L-element through hole
765 External electrode terminal
77 Heater part
8 Electronic component element

The invention claimed is:
1. A piezoelectric resonator device, comprising:
a piezoelectric resonator plate including a first excitation electrode formed on a first main surface of a substrate, and a second excitation electrode formed on a second main surface of the substrate, the second excitation electrode making a pair with the first excitation electrode;
a first sealing member covering the first excitation electrode of the piezoelectric resonator plate;
a second sealing member covering the second excitation electrode of the piezoelectric resonator plate, the second sealing member including external terminals configured to electrically connect to an outside;
an internal space formed by bonding the first sealing member to the piezoelectric resonator plate and by bonding the second sealing member to the piezoelectric resonator plate, the internal space hermetically sealing an vibrating part including the first excitation electrode and the second excitation electrode of the piezoelectric resonator plate;

a resonator-plate-side first bonding pattern on the first main surface of the piezoelectric resonator plate so as to be bonded to the first sealing member, the resonator-plate-side first bonding pattern being constituted by a first PVD film bonding layer on the first main surface and a second PVD film bonding layer on the first PVD film bonding layer;

a resonator-plate-side second bonding pattern distinct from the first resonator-plate-side first bonding pattern and located on the second main surface of the piezoelectric resonator plate, the resonator-plate-side second bonding pattern being constituted by a base PVD film bonding layer on the second main surface and an electrode PVD film bonding layer on the base PVD film;

a sealing-member-side first bonding pattern on the first sealing member, the sealing-member-side first bonding pattern being constituted by a base PVD film on the first sealing member and an electrode PVD film on the base PVD film;

a sealing-member-side second bonding pattern on the second sealing member, the sealing-member-side second bonding pattern being constituted by a base PVD film on the second sealing member and an electrode PVD film on the base PVD film;

wherein the sealing-member side first bonding pattern is bonded to the resonator-plate-side first bonding pattern by a diffusion bond, and the sealing-member-side second bonding pattern is bonded to the resonator-plate-side second bonding pattern by a diffusion bond; and wherein the piezoelectric resonator device lacks a metal paste based sealing material and wherein the first sealing member, the second sealing member and the piezoelectric resonator plate are laminated to each other and are parallel to each other.

2. The piezoelectric resonator device according to claim 1, wherein the first excitation electrode and the resonator-plate-side first bonding pattern, both formed on the first main surface of the piezoelectric resonator plate, have a same thickness, and both surfaces of the first excitation electrode and the resonator-plate-side first bonding pattern are made of a same metal, and wherein the second excitation electrode and the resonator-plate-side second bonding pattern, both formed on the second main surface of the piezoelectric resonator plate, have a same thickness, and both surfaces of the second excitation electrode and the resonator-plate-side second bonding pattern are made of a same metal.

3. The piezoelectric resonator device according to claim 1, wherein, in the resonator-plate-side first bonding pattern and the resonator-plate-side second bonding pattern, the respective base PVD films are made of a single material, and the respective electrode PVD films are made of a single material, and wherein a thickness of the electrode PVD films are greater than a thickness of the base PVD films.

4. The piezoelectric resonator device according to claim 1, wherein, on the second sealing member, the external terminals to be electrically connected to the outside are formed on an outer main surface not facing the piezoelectric resonator plate, the external terminals each being constituted by a base PVD film on the outer main surface and an electrode PVD film on the base PVD film, and wherein the base PVD film of each of the external terminals has a thickness suitable for solder-mounting.

5. The piezoelectric resonator device according to claim 1, wherein Au is contained in the electrode PVD film.

6. The piezoelectric resonator device according to claim 1, wherein the resonator-plate-side first bonding pattern, the resonator-plate-side second bonding pattern, the sealing-member-side first bonding pattern and the sealing-member-side second bonding pattern comprise materials that lack an alloy of Ag and Sn.

7. The piezoelectric resonator device according to claim 1, wherein Cu is contained in the resonator-plate-side first bonding pattern, the resonator-plate-side second bonding pattern, the sealing-member-side first bonding pattern and the sealing-member-side second bonding pattern.

8. The piezoelectric resonator device according to claim 1, wherein the first sealing member and the second sealing member have a flexural rigidity (moment of inertia of area×Young's modulus) of not more than $1000[Nmm^2]$.

9. The piezoelectric resonator device according to claim 1, wherein the sealing-member-side first bonding pattern is bonded to the resonator-plate-side first bonding pattern by a diffusion bond without any added bonding material, and the sealing-member-side second bonding pattern is bonded to the resonator-plate-side second bonding pattern by a diffusion bond without added bonding material.

10. The piezoelectric resonator device according to claim 1, wherein, on the second sealing member, the external terminals to be electrically connected to the outside are on an outer main surface not facing the piezoelectric resonator plate, the external terminals each being constituted by a base PVD film on the outer main surface and an electrode PVD film on the base PVD film, and wherein a thickness of a bonding pattern made by the diffusion bond of the sealing-member-side first bonding pattern and the resonator-plate-side first bonding pattern is the same as a thickness of a bonding pattern made by the diffusion bond of the sealing-member-side second bonding pattern and the resonator-plate-side second bonding pattern, and is different from a thickness of the external terminals electrically connected to the outside.

11. The piezoelectric resonator device according to claim 1, wherein, in the second sealing member, through holes are disposed in an outward position of the internal space, and no through hole is disposed an inward position of the internal space.

12. The piezoelectric resonator device according to claim 1, wherein the sealing-member-side first bonding pattern formed on the first sealing member and the sealing-member-side second bonding pattern formed on the second sealing member are not superimposed to each other in plan view.

13. The piezoelectric resonator device according to claim 1, wherein the resonator-plate-side first bonding pattern and the resonator-plate-side second bonding pattern are respectively on the first main surface and the second main surface of the piezoelectric resonator plate and bonded to the first sealing member and the second sealing member, and compared with the resonator-plate-side first bonding pattern and the resonator-plate-side second bonding pattern formed on the piezoelectric resonator plate, the sealing-member-side first bonding pattern on the first sealing member and the sealing-member-side second bonding pattern on the second sealing member each have a larger width.

14. The piezoelectric resonator device according to claim 1,
wherein an oscillation circuit element is on a first main surface of the first sealing member, and a second main surface of the first sealing member is bonded to the first main surface of the piezoelectric resonator plate.

15. The piezoelectric resonator device according to claim 1,
wherein the first sealing member and the piezoelectric resonator plate have a gap of not more than 1.00 μ, and the second sealing member and the piezoelectric resonator plate have a gap of not more than 1.00 μ.

16. The piezoelectric resonator device according to claim 1,
wherein the resonator-plate-side first bonding pattern is connected to the first excitation electrode, and the resonator-plate-side second bonding pattern is connected to the second excitation electrode,
wherein, out of the external terminals, the second excitation electrode is not superimposed to a first external terminal connected to the first excitation electrode, but superimposed to a second external terminal connected to the second excitation electrode, and
wherein the first sealing member and the piezoelectric resonator plate have a gap of not more than 1.00 μand the second sealing member and the piezoelectric resonator plate have a gap of not more than 1.00 μ.

17. The piezoelectric resonator device according to claim 1,
wherein, on the second sealing member, connection terminals are formed on a main surface not facing the piezoelectric resonator plate so that the connection terminals are bonded to a function unit by the diffusion bonding, the function unit on which are formed the external terminals to be directly bonded to a circuit board, and
wherein the connection terminals are each constituted by a base PVD film on the main surface not facing the piezoelectric resonator plate and an electrode PVD film on the base PVD film.

18. The piezoelectric resonator device according to claim 1,
wherein the piezoelectric resonator device lacks a binding layer comprising Ag and Sn alloy.

* * * * *